(12) United States Patent
Egawa

(10) Patent No.: US 8,138,023 B2
(45) Date of Patent: Mar. 20, 2012

(54) METHOD FOR FORMING LAMINATED STRUCTURE AND METHOD FOR MANUFACTURING SEMICONDUCTOR DEVICE USING THE METHOD THEREOF

(75) Inventor: Yoshimi Egawa, Tokyo (JP)

(73) Assignee: Lapis Semiconductor Co., Ltd. (JP)

( * ) Notice: Subject to any disclaimer, the term of this patent is extended or adjusted under 35 U.S.C. 154(b) by 406 days.

(21) Appl. No.: 11/276,828

(22) Filed: Mar. 15, 2006

(65) Prior Publication Data
US 2006/0223232 A1 Oct. 5, 2006

(30) Foreign Application Priority Data
Mar. 30, 2005 (JP) ................. 2005/096988

(51) Int. Cl.
*H01L 21/00* (2006.01)
*H01L 21/44* (2006.01)
(52) U.S. Cl. .. 438/110; 438/127; 438/667; 257/E25.006
(58) Field of Classification Search .............. 438/110, 438/113, 108, 112, 124, 126, 127, 667; 257/E25.006
See application file for complete search history.

(56) References Cited

U.S. PATENT DOCUMENTS

| 5,445,873 | A | * | 8/1995 | Yaginuma et al. | 427/96.4 |
| 5,960,258 | A | * | 9/1999 | Moden | 438/106 |
| 6,229,215 | B1 | * | 5/2001 | Egawa | 257/777 |
| 6,803,253 | B2 | | 10/2004 | Tago et al. | |
| 6,841,420 | B2 | * | 1/2005 | Ohuchi | 438/118 |
| 2002/0119599 | A1 | * | 8/2002 | Egawa et al. | 438/108 |
| 2004/0000723 | A1 | * | 1/2004 | Egawa | 257/777 |

FOREIGN PATENT DOCUMENTS
JP 2003/347502 A 12/2003
* cited by examiner

*Primary Examiner* — Jenny L Wagner
(74) *Attorney, Agent, or Firm* — Rabin & Berdo, PC

(57) ABSTRACT

A method for manufacturing a semiconductor device includes the steps of (a) preparing a wafer including a first circuit formation region and a first surrounding region, (b) laminating a first chip on the first circuit formation region, (c) pouring a first underfill into a first space between the first circuit formation region and the first chip from the first surrounding region, (d) hardening the first underfill, (e) forming a laminated structure comprised of a first chip block that includes a second chip including the first circuit formation region, the first chip, and the first underfill by conducting dicing with respect to the wafer; and (f) laminating the laminated structure on a substrate.

18 Claims, 24 Drawing Sheets

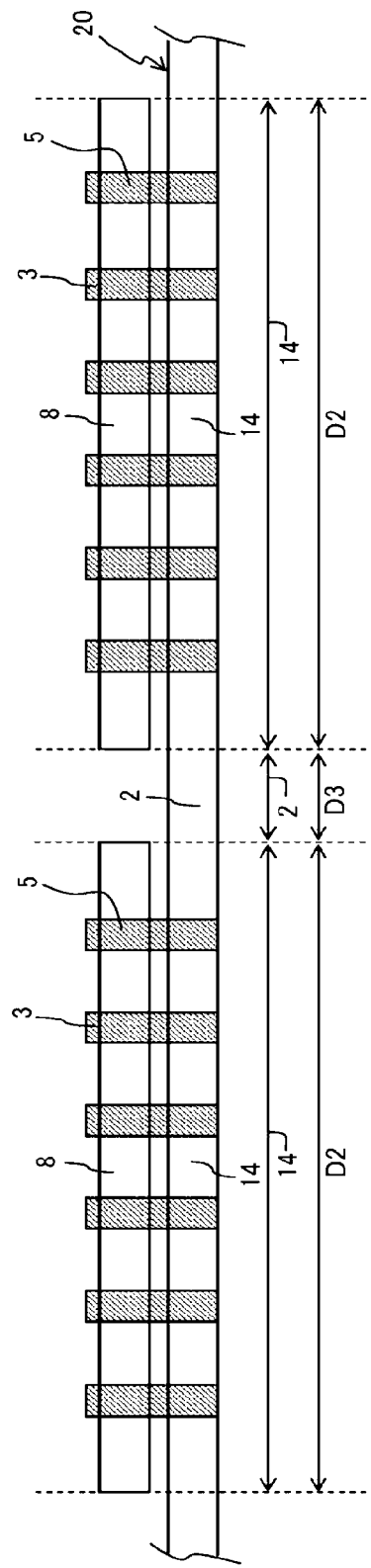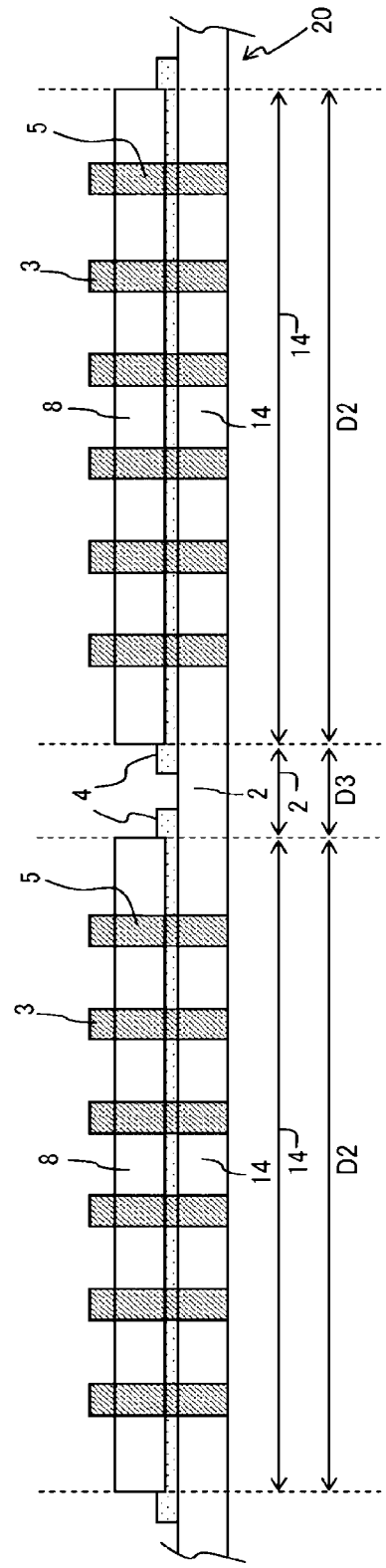

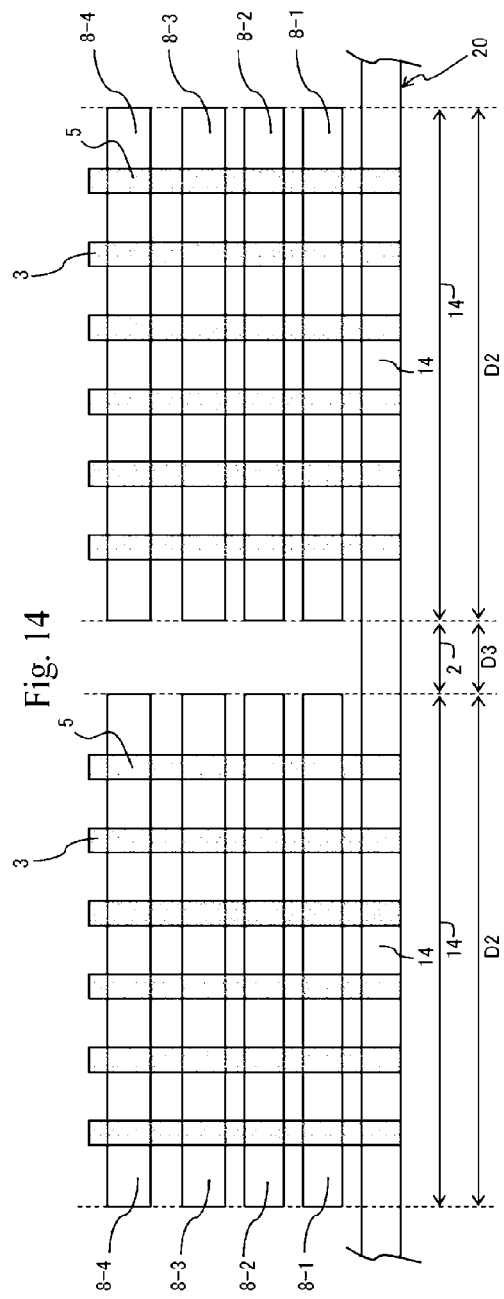
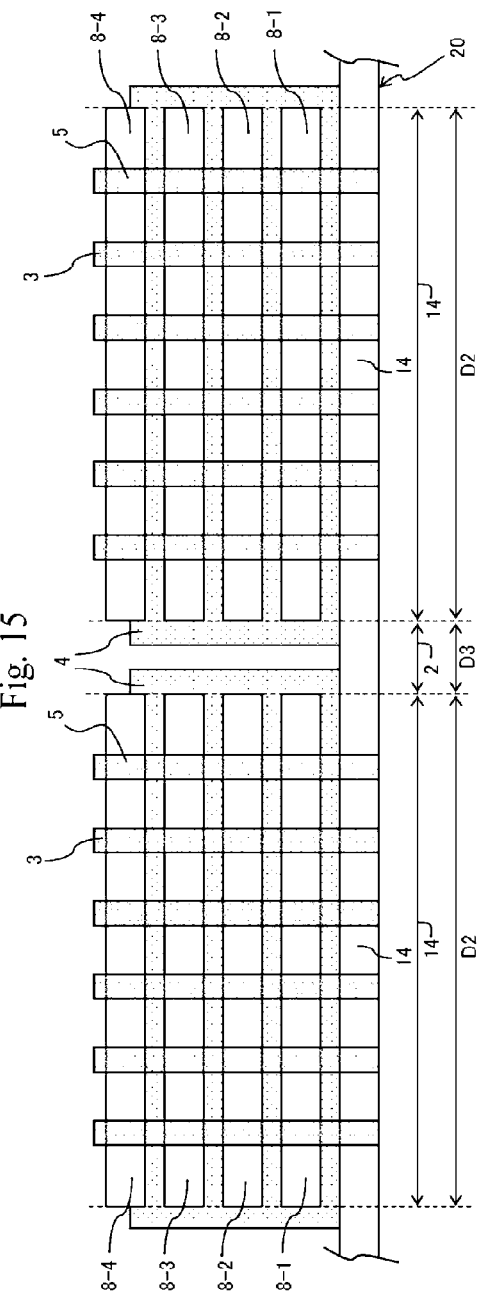

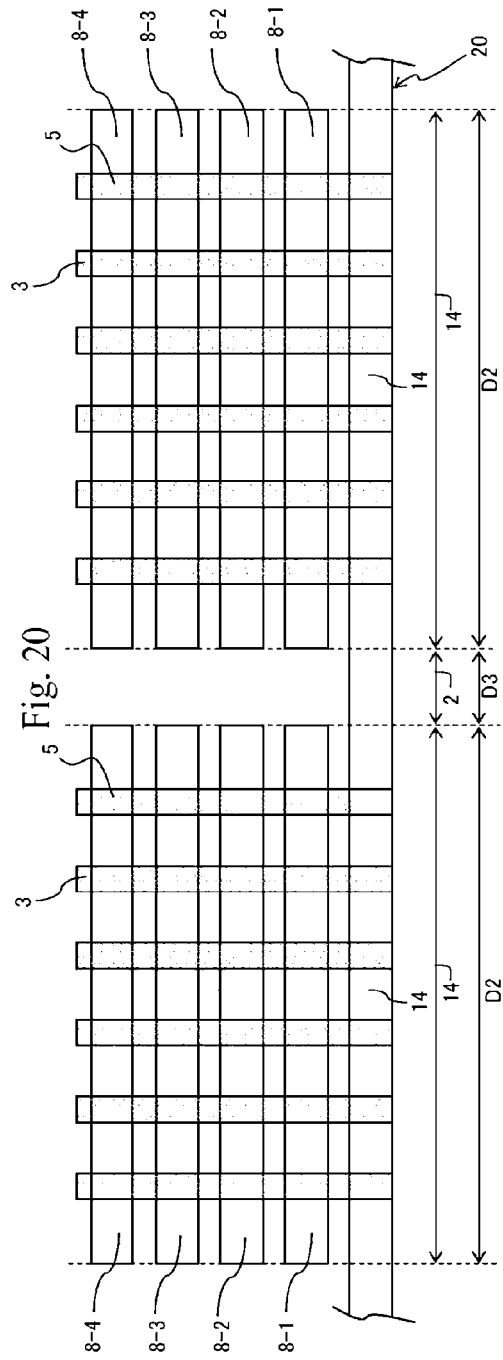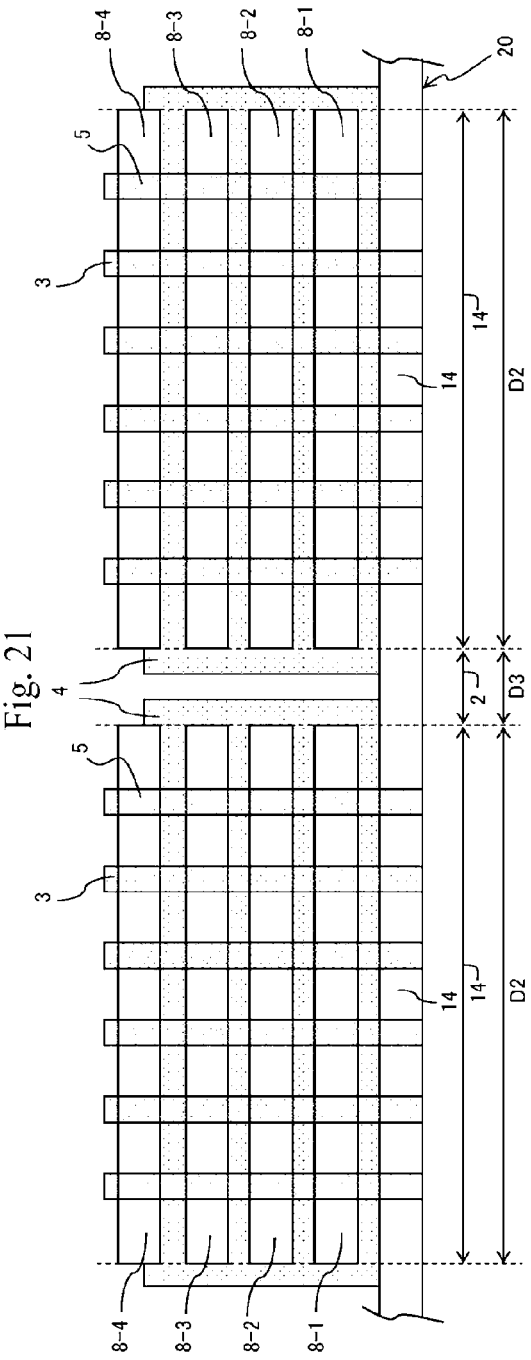

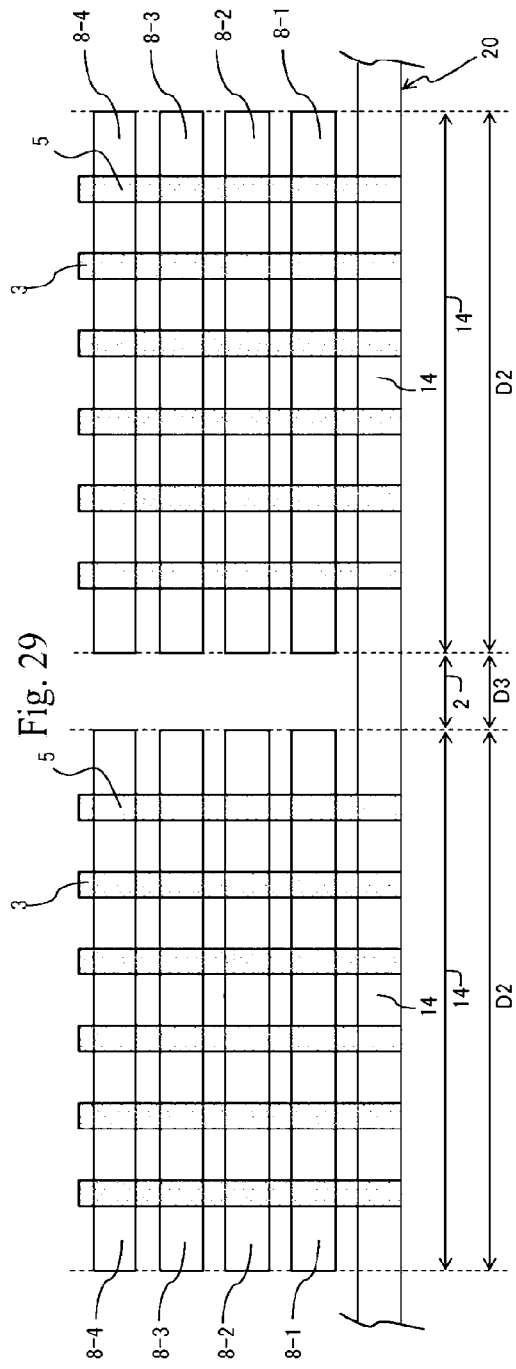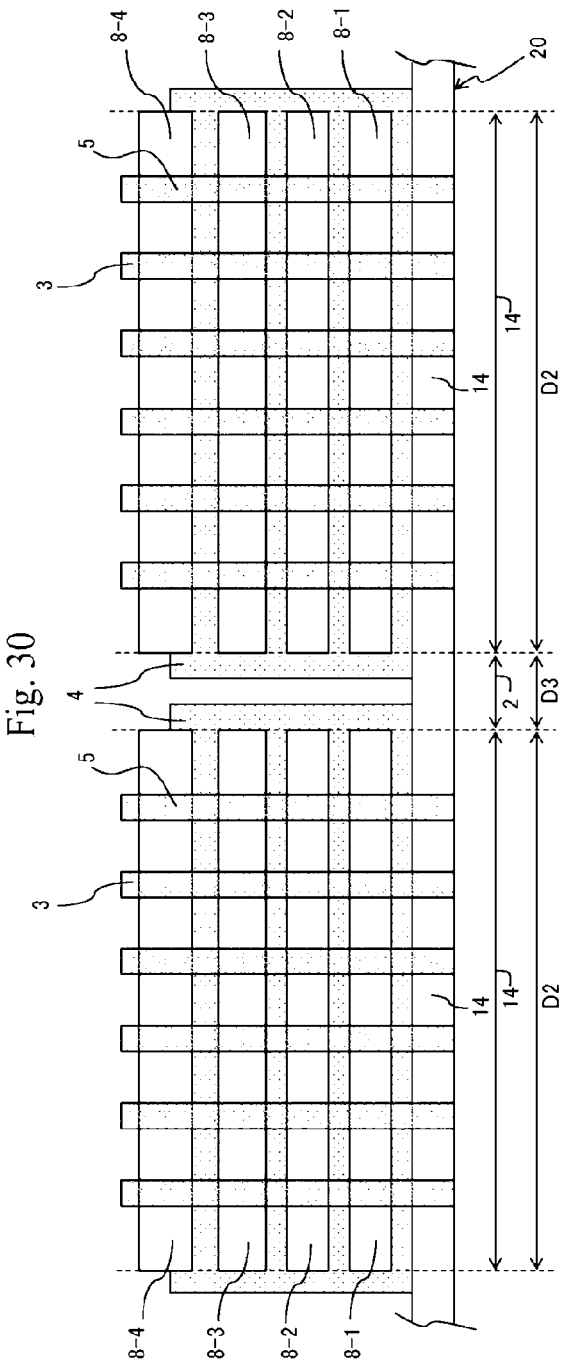

US 8,138,023 B2

METHOD FOR FORMING LAMINATED STRUCTURE AND METHOD FOR MANUFACTURING SEMICONDUCTOR DEVICE USING THE METHOD THEREOF

BACKGROUND OF THE INVENTION

Field of the Invention

The present invention relates to a method for forming a laminated structure and a method for manufacturing a semiconductor device using the method thereof, especially a method for laminating a plurality of chips in which a through-electrode is formed, and a method for manufacturing a semiconductor device using the method thereof.

A heretofore known method for laminating semiconductor chips is disclosed in Japan Patent Application Publication JP-A-2002-170919 (especially page 4 and FIG. 1). This heretofore known method is a lamination packaging method of semiconductor chips in which a plurality of solder-applied semiconductor chips are sequentially laminated, and then the packaging of those chips is completed. More specifically, solder on opposing semiconductor chips is activated, and alignment of these opposing semiconductor chips is conducted. Then, these opposing semiconductor chips are laminated and joined by applying pressure on them without forming a solder joint layer. After the steps of lamination and joining of all the semiconductor chips are completed, a solder joint layer is formed by collectively heating the group of the semiconductor chips. The objective of this method for laminating semiconductor chips is to reduce the number of the heating steps conducted for the joint portions of chips. However, it is not intended to reduce the number of the pressurization steps as an objective of this method. Also, according to this method, a semiconductor chip block comprised of a laminated structure is formed by sequentially laminating all of the plurality of semiconductor chips. Then, this semiconductor chip block is mounted on a support substrate and the resin seal is conducted for this semiconductor chip block. Therefore, the total amount of stress applied to a through-electrode and a bump is not decreased in the lamination step.

Another example of the heretofore known method for laminating a semiconductor chip is disclosed in Japan Patent Application Publication JP-A-2003-347502 (especially paragraph 0029 and FIGS. 3 and 4). This heretofore known method is a lamination packaging method in which a plurality of chips having through-electrode are sequentially laminated, and then the packaging of those chips is completed. More specifically, the through-electrode is formed askew with respect to a chip plane, and thus resistance of the through-electrode to the vertical force is increased by the stress dispersion effect that is caused by laminating a plurality of chips. However, all of the plurality of semiconductor chips are sequentially laminated, and a semiconductor chip block comprised of a laminated structure is formed. Then, this semiconductor chip block is mounted on a support substrate, and a resin seal is conducted for this semiconductor chip block. Therefore, the total amount of stress applied to a through-electrode and a bump is not decreased in the lamination step.

However, the above described heretofore known methods disclosed in the Japan Patent Application Publications have the following problems.

In the above described methods, all of the plurality of semiconductor chips are sequentially laminated, and a semiconductor chip block comprised of a laminated structure is formed. Then, this semiconductor chip block is mounted on the support substrate, and a resin seal is conducted for this semiconductor chip block. Therefore, the total amount of stress applied to a through-electrode and a bump is not decreased in the lamination step.

SUMMARY OF THE INVENTION

It is there an objective of the present invention to resolve the above described problem and to provide a method for laminating chips without the above described problem.

Also, it is an objective of the present invention to provide a method for manufacturing a semiconductor device using the method for laminating chips that does not have the above described problem.

Also, it is an objective of the present invention to provide a method for laminating chips in which the total amount of stress applied to a through-electrode and a bump can be reduced in a lamination step.

Also, it is an objective of the present invention to provide a method for manufacturing a semiconductor device which uses a method for laminating chips in which the total amount of stress applied to a through-electrode and a bump can be reduced in a lamination step.

In accordance with a first aspect of the present invention, a method for forming a laminated structure is comprised of the steps of (a) preparing a wafer including a first circuit formation region and a first surrounding region formed to surround the first circuit formation region, (b) laminating a first chip, which has a plane dimension that is substantially the same as a plane dimension of the first circuit formation region, on the first circuit formation region, and (c) pouring a first underfill into a first space between the first circuit formation region and the first chip from the first surrounding region.

Also, in accordance with a second aspect of the present invention, a method for manufacturing a semiconductor device is comprised of the steps of (a) preparing a wafer including a first circuit formation region and a first surrounding region formed to surround the first circuit formation region, (b) laminating a first chip, which has a plane dimension that is substantially the same as a plane dimension of the first circuit formation region, on the first circuit formation region, (c) pouring a first underfill into a first space between the first circuit formation region and the first chip from the first surrounding region, (d) hardening the first underfill, (e) forming a laminated structure comprised of a first chip block that includes a second chip including the first circuit formation region, the first chip, and the first underfill by conducting dicing with respect to the wafer, and (f) laminating the laminated structure on a substrate.

Also, in accordance with a third aspect of the present invention, a method for forming a laminated structure is comprised of the steps of (a) preparing a wafer including a plurality of circuit formation regions and a first surrounding region formed to surround the plurality of circuit formation regions, (b) laminating a plurality of first chips, which has plane dimensions that are substantially the same as plane dimensions of the plurality of the circuit formation regions, respectively, on the plurality of circuit formation regions, respectively, (c) pouring a first underfill into first spaces between the plurality of circuit formation regions and the plurality of first chips from the first surrounding region, (d) hardening the first underfill, (e) forming a plurality of first chip sub-blocks that include each of a plurality of second chips including each of the plurality of circuit formation regions, each of the plurality of first chips, and the first underfill by conducting dicing with respect to the wafer, and (d)

forming a laminated structure comprised of the plurality of first chip sub-blocks by laminating the plurality of first chip sub-blocks with each other.

Also, in accordance with a fourth aspect of the present invention, a method for manufacturing a semiconductor device is comprised of the steps of (a) preparing a wafer including a plurality of circuit formation regions and a first surrounding region formed to surround the plurality of the circuit formation regions, (b) laminating a plurality of first chips, which has plane dimensions that are substantially the same as plane dimensions of the plurality of circuit formation regions, respectively, on the plurality of the circuit formation regions, respectively, (c) pouring a first underfill into first spaces between the plurality of the circuit formation regions and the plurality of the first chips from the first surrounding region, (d) hardening the first underfill, and (e) forming a plurality of first chip sub-blocks that include each of a plurality of second chips including each of the plurality of the circuit formation regions, each of the plurality of the first chips, and the first underfill by conducting dicing with respect to the wafer.

Also, in accordance with a fifth aspect of the present invention, a method for forming a laminated structure is comprised of the steps of (a) forming a first chip block by laminating a first chip that has a first plane dimension and includes a surrounding region and a second chip having a second plane dimension that is smaller than the first plane dimension, and (b) pouring a first underfill into a first space between the first chip and the second chip from the surrounding region.

Also, in accordance with a sixth aspect of the present invention, a method of manufacturing a semiconductor device is comprised of the steps of (a) forming a first chip block by laminating a first chip that has a first plane dimension and includes a surrounding region and a second chip having a second plane dimension that is smaller than the first plane dimension, (b) pouring a first underfill into a first space between the first chip and the second chip from the surrounding region, (c) forming a laminated structure comprised of the first chip block by hardening the first underfill, and (d) laminating the laminated structure on a substrate.

Also, in accordance with a seventh aspect of the present invention, a method for forming a laminated structure is comprised of the steps of (a) preparing a first substance having a first plane that is substantially flat and includes a first region and a second region formed to surround the first region, (b) laminating a first chip, which has a plane dimension that is substantially the same as a plane dimension of the first region, on the first region, and (c) pouring a first underfill into a first space between the first region and the first chip from the second region.

In the present application, the phrase "a plane dimension that is substantially the same as" means a plane dimension having some portion of the above described surrounding region remaining.

According to the present invention, the fist chip, which has a plane dimension that is substantially the same as the plane dimension of the first circuit formation region of the wafer, is laminated on the first circuit formation region. Then, the first underfill is provided on the first surrounding region that is formed to surround the surrounding portion of the first circuit formation region, and thus a spontaneous capillary flow phenomenon will be caused. Because of the spontaneous capillary flow phenomenon, the above described first underfill is poured into the first space between the above described first circuit formation region and the above described first chip. Then, the first underfill is hardened. Also, the first chip block, which is comprised of the second chip including the above described first circuit formation region, the above described first chip, and the above described first under fill, is formed by conducting dicing with respect to the above described wafer.

As described above, the hardened first underfill is formed in the space between the above described first chip and the above described second chip. Therefore, stress applied to the bump located between the above described first chip and the above described second chip is reduced or relieved, even if this first chip block is laminated in a later lamination step. As a result, it is possible to inhibit generation of defects (e.g., a crack) in this bump.

These and other objects, features, aspects, and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure:

FIG. 1 is a vertical cross-section diagram showing a manufacturing step of a semiconductor device having a multilayer laminated structure of chips in accordance with a first embodiment of the present invention.

FIG. 2 is a vertical cross-section diagram showing a manufacturing step of a semiconductor device having a multilayer laminated structure of chips in accordance with the first embodiment of the present invention.

FIG. 14 is a vertical cross-section diagram showing a manufacturing step of a semiconductor device having a multilayer laminated structure of chips in accordance with a third embodiment of the present invention.

FIG. 15 is a vertical cross-section diagram showing a manufacturing step of a semiconductor device having a multilayer laminated structure of chips in accordance with the third embodiment of the present invention.

FIG. 20 is a vertical cross-section diagram showing a manufacturing step of a semiconductor device having a multilayer laminated structure of chips in accordance with a fifth embodiment of the present invention.

FIG. 21 is a vertical cross-section diagram showing a manufacturing step of a semiconductor device having a multilayer laminated structure of chips in accordance with the fifth embodiment of the present invention.

FIG. 29 is a vertical cross-section diagram showing a manufacturing step of a semiconductor device having a multilayer laminated structure of chips in accordance with a seventh embodiment of the present invention.

FIG. 30 is a vertical cross-section diagram showing a manufacturing step of a semiconductor device having a multilayer laminated structure of chips in accordance with the seventh embodiment of the present invention.

DETAILED DESCRIPTION OF THE PREFERRED EMBODIMENTS

Figure 3A:
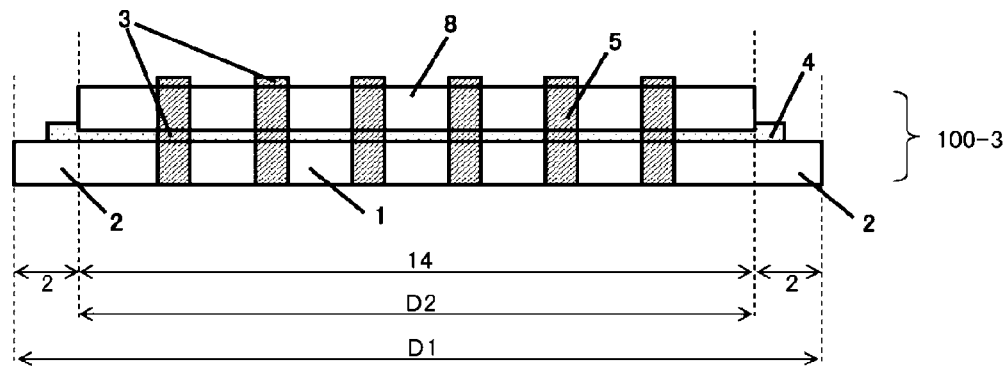
FIGS. 3A to 3C are vertical cross-section diagrams showing a manufacturing step of a semiconductor device having a multilayer laminated structure of chips in accordance with the first embodiment of the present invention.

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

Referring now to the drawings, preferred embodiments of the present invention will be described in detail.

First Embodiment

According to the first embodiment of the present invention, a method for manufacturing a laminated structure in which a plurality of chips with different dimensions are laminated is provided. Two types of chips with different dimensions are used for forming the laminated structure. More specifically, three chips per each type of chip are used for forming the laminated structure. Thus, a six-layer laminated structure is formed by using a total of six chips of the two types of chips. Also, the two types of chips have through-electrodes in the corresponding positions, respectively.

Lamination Step

FIGS. 1, 2, 3A, 3B, 3C, 4A, 4B, 5, and 6 are vertical cross-section diagrams showing a manufacturing process of a semiconductor device having a multilayer laminated structure of chips in accordance with the first embodiment of the present invention.

As shown in FIG. 1, a wafer 20 is prepared, which includes a two-dimensional array of a plurality of circuit formation regions 14 and a surrounding region 2 surrounding the plurality of the circuit formation regions 14. Each of the plurality of the circuit formation regions 14 is a three-dimensional region with a rectangular plane shape. The above described two-dimensional array is a two-dimensional matrix array. The surrounding region 2 is a three-dimensional region whose plane is formed in a lattice shape so that it surrounds each of the plurality of the circuit formation regions 14 laid out in the two-dimensional matrix. Each of the plurality of the circuit formation regions 14 has a second horizontal dimension D2. The surrounding region 2 has a generally constant width D3. The width D3 of the surrounding region 2 is preferably set to 0.1 mm or more. As a typical example, no circuits are formed on the surrounding region 2. Also, each of the plurality of the circuit formation regions 14 has a plurality of through-electrodes 5 and a plurality of bumps 3. The plurality of the bumps 3 are formed on the surface of the through-electrodes 5 on the first plane side.

A plurality of the second type chips 8 with the second horizontal dimension D2 are prepared. The dimension of each of the plurality of the second type chips 8 is the same as that of each of the plurality of the circuit formation regions 14 of the wafer 20. Also, each of the plurality of the second type chips 8 has a plurality of the through-electrodes 5 and a plurality of the bumps 3. The plurality of the through-electrodes 5 of the second type chips 8 and the plurality of the through-electrodes 5 of the wafer 20 are formed in the corresponding positions with each other in the horizontal direction. Each of the second type chips 8 has a circuit formation region 14 but does not have any surrounding region. The following lamination process is conducted by using the wafer 20 and the plurality of the second type chips 8 as fundamental components.

As shown in FIG. 1, the plurality of the second type chips 8 are laminated on the plurality of the circuit formation regions 14 of the wafer 20, which are laid out in the two-dimensional matrix. As described above, the plurality of the through-electrodes 5 formed in the second type chips 8 and the plurality of the through-electrodes 5 formed in the wafer 20 are formed in the corresponding positions with each other in the horizontal direction. Therefore, the plurality of the through-electrodes 5 formed in the wafer 20 and the plurality of the through-electrodes 5 formed in the second type chips 8 are electrically connected with each other through the bumps 3. The circuit formation region 14 of the wafer 20 and the second type chips 8 are completely overlapped in the horizontal direction. On the other hand, the surrounding region 2 of the wafer 20 is extended outside the second type chips 8 in the horizontal direction.

As shown in FIG. 2, a first type underfill 4 is provided on the surrounding region 2 of the wafer 20 so that the first type underfill 4 comes in contact with the lateral side of the second type chips 8. The first type underfill 4 is comprised of an insulating resin that has low-viscosity and works as a liquid. The first type underfill 4 with a liquid nature penetrates the centers of the second type chips 8 through the spaces between the circuit formation region 14 of the wafer 20 and the second type chips 8 by so-called "the spontaneous capillary flow phenomenon." As a result, the spaces between the circuit formation region 14 of the wafer 20 and the second type chips 8 is completely filled with the first type underfill 4.

Then, the first type underfill which is poured into the spaces between the circuit formation region 14 of the wafer 20 and the second type chips 8 is hardened. If the first type underfill 4 is comprised of a thermosetting resin, it can be thermally hardened by applying heat. A thermosetting epoxy resin can be provided as a typical example of the thermosetting resin. In general, it is preferable for the seal resin to have a large amount of filler in order to maintain a highly reliable seal. However, as described above, the first type underfill 4 penetrates the spaces between the circuit formation region 14 of the wafer 20 and the second type chips 8 by the spontaneous capillary flow phenomenon. Therefore, the first type underfill 4 is required to have low-viscosity. Because of this, the amount of filler in the first type underfill 4 is lower than that of filler in the normal seal resin.

As described above, the first type underfill 4 can be provided on the surrounding region 2 by using a needle dispenser if the width D3 of the surrounding region 2 is 0.1 mm or more. It is preferable to set the spaces between the circuit formation regions 14 of the wafer 20 and the second type chips 8 to 10 μm or more for the purpose of making it possible for the first type underfill 4 provided on the surrounding region 2 to penetrate the spaces between the circuit formation regions 14 of the wafer 20 and the second type chips 8 by the spontaneous capillary flow phenomenon.

Figure 3B:
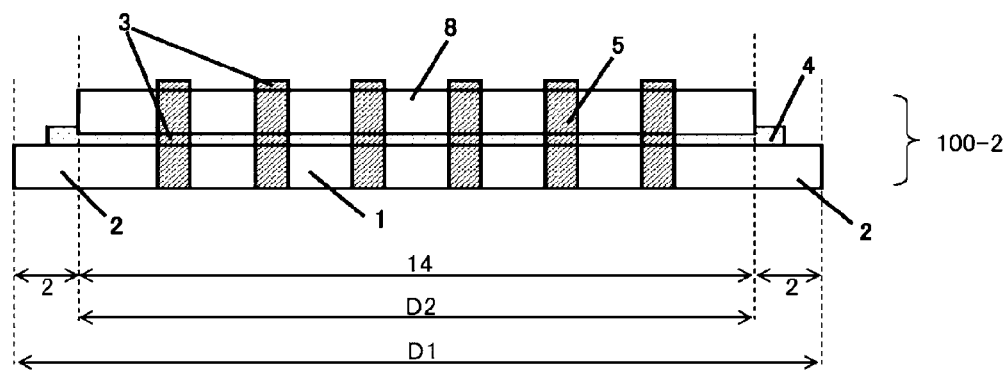
Figure 3C:
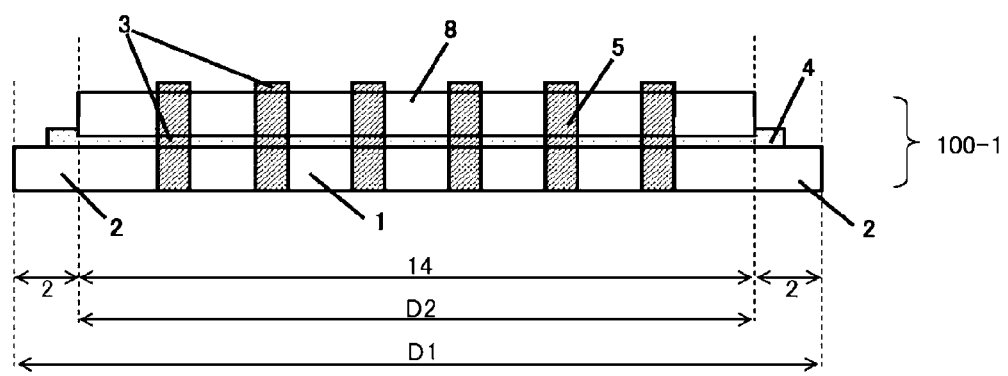

As shown in FIGS. 3A to 3C, the wafer 20 is divided into a plurality of first type chips 1 by conducting dicing with respect to the wafer 20 along the center line of the surrounding region 2 of the wafer 20. Thus, a plurality of two-chip sub-blocks 100 (i.e., a first two-chip sub-block 100-1, a second two-chip sub-block 100-2, and a third two-chip sub-block 100-3) are formed. Here, each of the plurality of the two-chip sub-blocks 100 is comprised of the first type chip 1, the second type chip 8, and the hardened first type underfill 4 formed in the space between the circuit formation region 14 of the first type chip 1 and the second type chip 8. Each of the plurality of the first type chips 1 has a first horizontal dimension D1. Each of the plurality of the first type chips 1 is comprised of the circuit formation region 14 and the surrounding region 2 remaining outside this circuit formation region 14. A lamination process is conducted by using three two-chip sub-blocks 100 as follows.

Figure 4A:
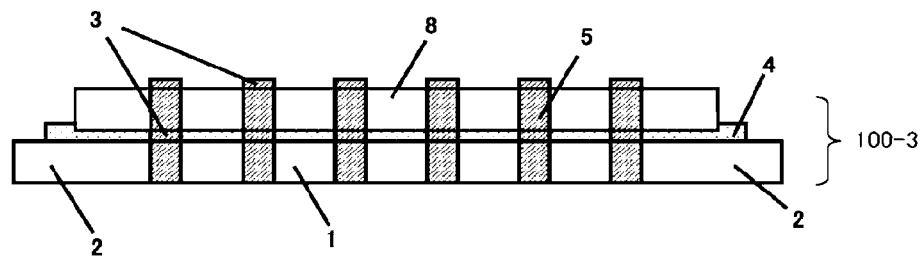
FIGS. 4A and 4B are vertical cross-section diagrams showing a manufacturing step of a semiconductor device having a multilayer laminated structure of chips in accordance with the first embodiment of the present invention.
Figure 4B:
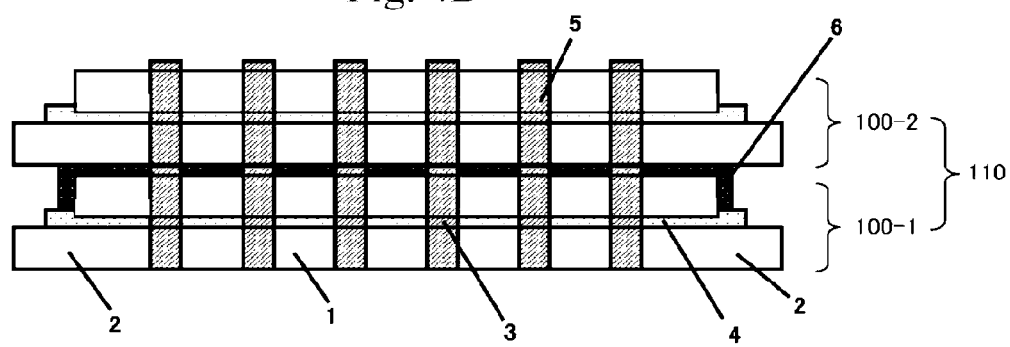

As shown in FIG. 4B, a second type underfill 6 is applied to the upper surface of the first two-chip sub-block 100-1, and the second two-chip sub-block 100-2 is laminated on the first two-chip sub-block 100-1. Thus, a four-chip sub-block 110 is formed. Here, the second type chip 8 of the first two-chip sub-block 100-1 and the first type chip 1 of the second two-chip sub-block 100-2 are laminated through the bumps 3 and the second type underfill 6. The second type underfill 6 is comprised of a resin whose viscosity and adhesion are higher than those of the first type underfill 4.

The hardened first type underfill 4 exists between the first type chip 1 and the second type chip 8, both of which comprise the first two-chip sub-block 100-1. In the lamination step of the first two-chip sub-block 100-1 and the second two-chip sub-block 100-2, stress which is applied to the bumps 3 located between the first type chip 1 and the second type chip 8 is reduced by the hardened first type underfill 4. As a result, it is possible to inhibit generation of defects (e.g., a crack) in the bumps 3 located between the first type chip 1 and the second type chip 8, both of which comprise the first two-chip sub-block 100-1.

In the same way, the hardened first type under fill 4 exists between the first type chip 1 and the second type chip 8, both of which comprise the second two-chip sub-block 100-2. In the lamination step of the first two-chip sub-block 100-1 and the second two-chip sub-block 100-2, stress which is applied to the bumps 3 located between the first type chip 1 and the second type chip 8 is reduced by the hardened first type underfill 4. As a result, it is possible to inhibit generation of defects (e.g., a crack) in the bumps 3 located between the first type chip 1 and the second type chip 8, both of which comprise the second two-chip sub-block 100-2.

After the four-chip sub-block 110 is formed by laminating the first two-chip sub-block 100-1 and the second two-chip sub-block 100-2, the second type underfill 6 poured between the first two-chip sub-block 100-1 and the second two-chip sub-block 100-2 is hardened. In this case, thermal hardening can be used for hardening the second type underfill 6.

Figure 5:
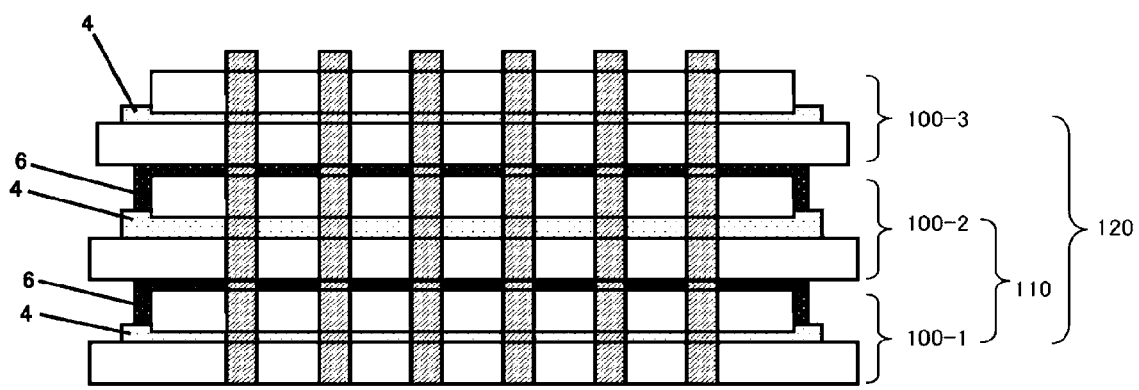
FIG. 5 is a vertical cross-section diagram showing a manufacturing step of a semiconductor device having a multilayer laminated structure of chips in accordance with the first embodiment of the present invention.

As shown in FIG. 5, the above described second type underfill 6 is applied to the upper surface of the above described four-chip sub-block 110, and the third two-chip sub-block 100-3 is laminated on the four-chip sub-block 110. Thus, a laminated structure comprised of a six-chip sub-block 120 is formed. Here, the second type chip 8 of the four-chip sub-block 110 and the first type chip 1 of the third two-chip sub-block 100-3 are laminated through the bumps 3 and the above described second type underfill 6.

The hardened first type underfill 4 exists between the first type chip 1 and the second type chip 8, both of which comprise the third two-chip sub-block 100-3. In the lamination step of the third two-chip sub-block 100-3 and the four-chip sub-block 110, stress which is applied to the bumps 3 located between the first type chip 1 and the second type chip 8, both of which comprise the third two-chip sub-block 100-3, is reduced by the hardened first type underfill 4. As a result, it is possible to inhibit generation of defects (e.g., a crack) in the bumps 3 located between the first type chip 1 and the second type chip 8, both of which comprise the third two-chip sub-block 100-3.

In the same way, the hardened first type underfill 4 and the hardened second underfill 6 exist in the spaces among the first type chips 1 and the second type chips 8. More specifically, the hardened first type underfill 4 exists (i) between the first type chip 1 and the second type 8, both of which comprise the first two-chip sub-block 100-1 and (ii) between the first type chip 1 and the second type 8, both of which comprise the second two-chip sub-block 100-2, in the four-chip sub-block 110. Also, the hardened underfill 6 exists between the second type chip 8 of the first two-chip sub-block 100-1 and the first type chip 1 of the second two-chip sub-block 100-2 in the four-chip sub-block 110. In the lamination step of the third two-chip sub-block 100-3 and the four-chip sub-block 110, stress which is applied to the bumps 3 located between the first type chip 1 and the second type chip 8, both of which comprise the four-chip sub-block 110, is reduced by the hardened first type underfill 4 and the hardened second type underfill 6. As a result, it is possible to inhibit generation of defects (e.g., a crack) in the bumps 3 between the first type chip 1 and the second type chip 8, both of which comprise the four-chip sub-block 110.

Then, the second type underfill 6 poured between the four-chip sub-block 110 and the third two-chip sub-block 100-3 is hardened. In this case, thermal hardening can be used for hardening the second type underfill 6.

Figure 6:
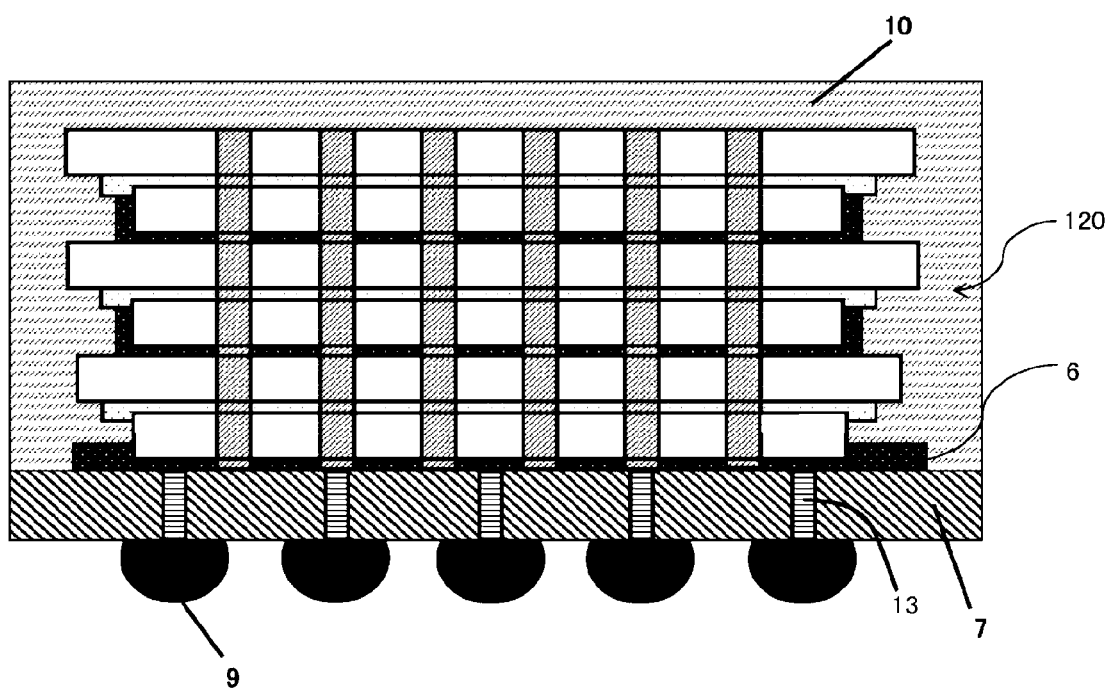
FIG. 6 is a vertical cross-section diagram showing a manufacturing step of a semiconductor device having a multilayer laminated structure of chips in accordance with the first embodiment of the present invention.

As shown in FIG. 6, the above described second type underfill 6 is applied to the upper surface of the second type chip 8 located at the top layer of a six-chip block 120. Then, the top second type chip 8 of the six-chip block 120 is turned downward, and a laminated structure comprised of the six-chip block 120 is laminated on an interposer 7 so that the top second type chip 8 faces the interposer 7. Here, the interposer 7 has a plurality of through-electrodes 13. The spacing of the plurality of the through-electrodes 13 formed in the interposer 7 is wider than that of the through-electrodes 5 formed in the laminated structure.

The hardened first type underfill 4 or the hardened second type underfill 6 exists in the spaces between the first type chips 1 and the second type chips 8, which comprise the six-chip block 120. More specifically, the hardened underfill 4 exists in the spaces between the first type chips 1 and the second type chips 8 in the first two-chip sub-block 100-1, the second two-chip sub-block 100-2, and the third two-chip sub-block 100-3, respectively. Also, the hardened second underfill 6 exists in the space between the first two-chip sub-block 100-1 and the second two-chip sub-block 100-2 and the space between the second two-chip sub-block 100-2 and the third two-chip sub-block 100-3. In the step of laminating the laminated structure comprised of the six-chip block 120 on the interposer 7, stress which is applied to the bumps 3 located between the first type chips 1 and the second type chips 8, which comprise the six-chip block 120, is reduced by the hardened first type underfill 4 and the hardened second type underfill 6. As a result, it is possible to inhibit generation of defects (e.g., a crack) in the bumps 3 located between the first type chips 1 and the second type chips 8, which comprise the six-chip block 120.

Then, the laminated structure, which is comprised of the six-chip block 120 laminated on the interposer 7, is sealed by a seal resin 10. Here, the amount of filler in the seal resin 10 is higher than that of the filler of the first type underfill 4 and that of the filler of the second type underfill 6 in order to maintain a highly reliable seal. It is possible to use a thermoplastic epoxy resin having a higher filler content than that of the filler in the above described first type underfill 4 and the second type underfill 6 as the seal resin 10. Finally, external terminals 9, which are electrically connected to the through-electrodes 13, are connected to the lower surface of the interposer 7, and thus a semiconductor device is manufactured.

The above described through-electrodes can be comprised of a variety of conductive materials, such as Au, Ag, Cu, Ni, W, SnAg, and poly-Si. The above described bumps 3 can be comprised of a variety of conductive materials, such as Sn/Pn, Au, Cu, and Cu+SnAg. The above described bumps 3 may be formed on the surface of the above described plurality of through-electrodes 5 on the second plane side of the first type chip 1 and the second type chip 8. The above described interposer 7 can be comprised of a glass epoxy resin, a polyimide resin, and a silicone resin, for instance.

The first embodiment of the present invention is different from the heretofore known methods, in which resin seal is conducted for a laminated structure comprised of a plurality of chips after it is laminated on a support substrate comprised of an interposer. According to the first embodiment of the present invention, the plurality of the second type chips are laminated on the plurality of circuit formation regions of the wafer that are laid out in a two-dimensional matrix. Here, the dimension of the second type chip is the same as that of this circuit formation region. Then, the first type underfill that has low viscosity and works as a liquid is provided on the surrounding region of the wafer, so that the first type underfill comes in contact with the lateral side of the second type chip. As a result, the first type underfill penetrates the centers of the second type chips through the spaces between the circuit formation region of the wafer and the second type chips by the spontaneous capillary flow phenomenon, and the spaces are completely filled with the first type underfill. Then, the poured first type underfill is hardened. Furthermore, dicing of the wafer is conducted, and the plurality of two-chip sub-blocks are formed, each of which is comprised of the circuit formation region and the surrounding region remaining around this circuit formation region. In other words, the finished two-chip sub-block is comprised of the first type chip, the second type chip, and the hardened first type underfill formed between those two types of chips.

Furthermore, the laminated structure comprised of the six-chip block is formed by laminating these two-chip sub-blocks with the second type underfill. Then, the laminated structure comprised of the six-chip block is laminated on the interposer through the second type underfill 6.

Accordingly, in the steps of laminating chip sub-blocks and laminating the laminated structure comprised of the chip block on the interposer functioning as the support substrate, either the hardened first type underfill or the hardened second type underfill is necessarily formed in the spaces between the first type chips and the second type chips. Therefore, stress which is applied to the bumps located between the first type chips and the second type chips, is reduced or relieved. Because of this, it is possible to inhibit generation of defects (e.g., a crack) in the bumps 3.

As described above, the laminated structure comprised of the six-chip block is mounted on the support substrate after the laminated structure is formed. However, the present invention is not necessarily limited to this example. For example, in order to set the number of applying weight and heat with respect to each of the multilayer of chips to the same in the lamination steps, the following structure may be formed. First, four two-chip sub-blocks, each of which is comprised of a first type chip 1, a second type chip 8, and a first type underfill 4 formed between the first type chip 1 and the second type chip 8, may be formed. Then, two four-chip sub-blocks may be formed by further laminating these two-chip sub-blocks through a second type underfill 6. Furthermore, a laminated structure comprised of an eight-chip block may be formed by laminating these two four-chip sub-blocks through the second type underfill 6. Finally, this laminated structure may be mounted on a support substrate through the second type underfill 6.

In addition, the wafer 20 and the second type chip 8 may be laminated so that the circuit formation plane of the circuit formation region 14 of the wafer 20 and the circuit formation plane of the second type chip 8 face with each other. Then, immediately after this step, the space between the circuit formation region 14 of the wafer 20 and the second type chip 8 may be filled with the first type underfill 4 with the above described method. Because of this, the circuit formation plane of the circuit formation region 14 and the circuit formation plane of the second type chip 8 are always protected by the first type underfill 4 in the later steps. Therefore, this change in the lamination step is also acceptable.

Second Embodiment

According to the second embodiment of the present invention, a method for manufacturing a laminated structure in which a plurality of chips with different dimensions are laminated is provided. Two types of chips with different dimensions are used for forming the laminated structure. More specifically, three chips per each type of chips are used for forming the laminated structure. Thus, a six-layer laminated structure is formed by using a total of six chips of the two types of chips. Also, the two types of chips have through-electrodes in the corresponding positions, respectively.

Lamination Step

FIGS. 7A, 7B, 7C, 8A, 8B, 9, and 10 are vertical cross-section diagrams showing a manufacturing process of a semiconductor device having a multilayer laminated structure of chips in accordance with the second embodiment of the present invention.

Figure 7A:
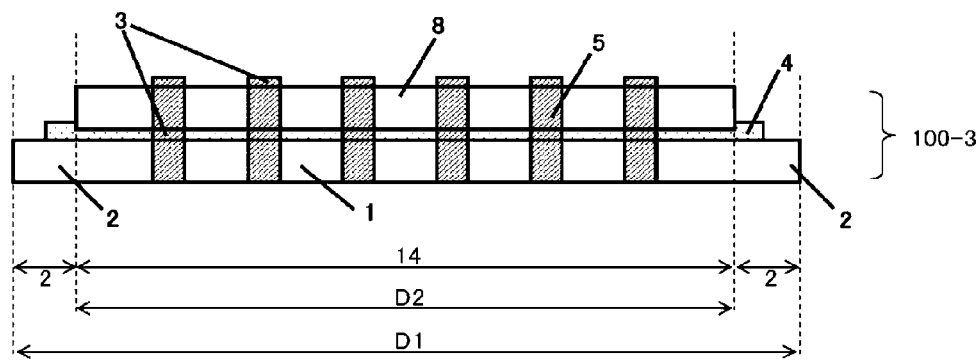
FIGS. 7A-7C are vertical cross-section diagrams showing a manufacturing step of a semiconductor device having a multilayer laminated structure of chips in accordance with a second embodiment of the present invention.
Figure 7B:
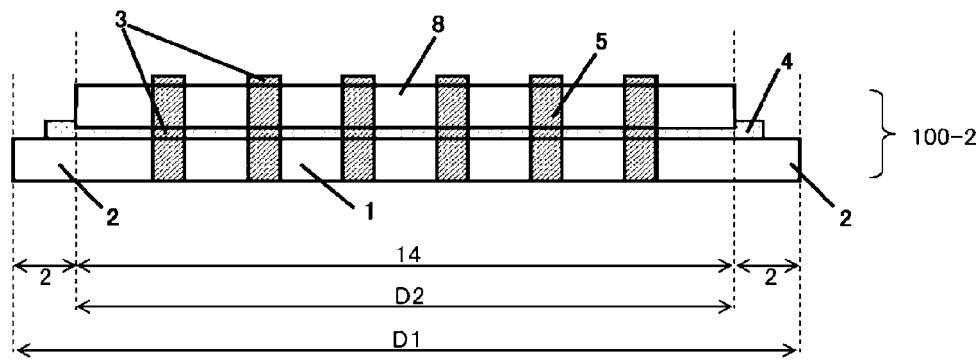
Figure 7C:
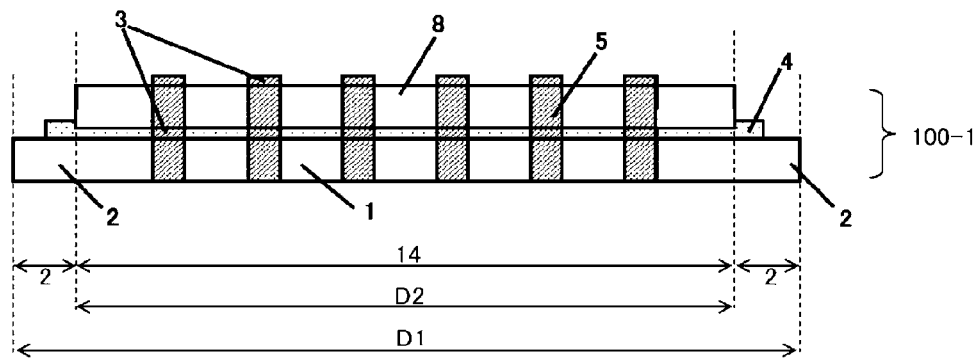

As shown in FIGS. 7A to 7C, three first type chips 1 having a first horizontal dimension D1 are prepared. In addition, three second type chips 8 having a second horizontal dimension D2, which is smaller than the first horizontal dimension D1, are prepared. In the present application, the term "horizontal direction" means a direction parallel to the surface of a chip. Also, the term "horizontal dimension of a chip" means a two-dimensional horizontal dimension of a chip. Each of the first type chips 1 has a plurality of through-electrodes 5. Also, each of the first type chips 1 has a plurality of bumps 3. The plurality of the bumps 3 are formed on the first plane of the first type chip, more specifically, on the surface of the plurality of the through-electrodes 5. The first type chip 1 is comprised of a circuit formation region 14 and a surrounding region 2 that surrounds the circuit formation region 14. The circuit formation region 14 has the above described second horizontal dimension D2. In other words, the circuit formation region 14 has the horizontal dimension that is same with the horizontal dimension of the second type chip 8. On the other hand, the surrounding region 2 has a width corresponding to half of the difference between the first horizontal dimension D1 and the second horizontal dimension D2. The width of the surrounding region 2 is preferably set to 0.1 mm or more. As a typical example, no circuits are formed on the surrounding region 2. However, the structure of the surrounding region 2 is not necessarily limited to this structure, and a circuit may be formed on the surrounding region 2.

Each of the plurality of the second type chips 8 has a plurality of through-electrodes 5. The plurality of the through-electrodes 5 of the second type chips 8 and the plurality of the through-electrodes 5 of the above described first type chips 1 are formed in the corresponding positions with each other in the horizontal direction. Also, each of the second type chips 8 has a plurality of bumps 3. The plurality of the bumps 3 are formed on the first plane of the second type chips 8, more specifically, on the surface of the plurality of the through-electrodes 5. Each of the second type chips 8 has a circuit formation region 14 but does not have any surrounding region. The following lamination process is conducted by using these three first type chips 1 and three second type chips 8 as fundamental components.

As shown in FIGS. 7A to 7C, three first type chips 1 and three second type chips 8 are laminated, respectively, and thus three two-chip sub-blocks 100 (i.e., a first two-chip sub-block 100-1, a second two-chip sub-block 100-2, and a third two-chip sub block 100-3) are formed. Each of the first to third two-chip sub-blocks 100-1, 100-2, and 100-3 is comprised of a first type chip 1 and a second type chip 8. Furthermore, as described above, the plurality of through-electrodes 5 formed in the second type chips 8 and the plurality of the through-electrodes 5 formed in the above described first type chips 1 are formed in the corresponding positions with each other in the horizontal direction. Therefore, the plurality of the through-electrodes 5 formed in the first type chips 1 and the plurality of the through-electrodes 5 formed in the second type chips 8 are electrically connected with each other through the bumps 3. The circuit formation region 14 of the first type chips 1 and the second type chips 8 are completely overlapped in the horizontal direction. On the other hand, the surrounding region 2 of the first type chips 1 is extended outside the second type chips 8 in the horizontal direction.

Therefore, each of the first to third two-chip sub-blocks 100-1, 100-2, and 100-3 has a terrace (or a stage) comprised of the surrounding region 2 of the first type chips 1.

Then, a first type underfill 4 is poured in the spaces between the first type chips 1 and the second type chips 8 from the lateral side of the two-chip sub-blocks 100, and the poured first type underfill 4 is hardened. Also, before the first type underfill 4 is poured, each of the first to third two-chip sub-blocks 100-1, 100-2, 100-3 is allocated so that the first type chip 1 is located under the second type chips 8. Then, the first type underfill 4 is provided on the terrace (or the stage) comprised of the surrounding region 2 of the above described first type chips 1 in each of the first to third two-chip sub-blocks 100-1, 100-2, and 100-3. Here, the first type underfill 4 is provided so that it comes in contact with the lateral side of the second type chips 8. The first type underfill 4 is comprised of an insulating resin that has low-viscosity and works as a liquid. The first type underfill 4 with a liquid nature penetrates the center of the two-chip sub-blocks 100 through the spaces between the first type chips 1 and the second type chips 8 by so-called "the spontaneous capillary flow phenomenon." As a result, the spaces between the first type chips 1 and the second type chips 8 is completely filled with the first type underfill 4.

Then, the first type underfill which is poured into the spaces between the first type chips 1 and the second type chips 8 is hardened. In other words, each of the finished two-chip sub-blocks 100 is comprised of the first type chip 1, the second type chip 8, and the hardened first type underfill 4 that is formed between the first type chip 1 and the second type chip 8.

If the first type underfill 4 is comprised of a thermosetting resin, it can be thermally hardened by applying heat. A thermosetting epoxy resin can be provided as a typical example of the thermosetting resin. In general, it is preferable for the seal resin to have a higher filler content in order to maintain a highly reliable seal. However, as described above, the first type underfill 4 penetrates the spaces between the first type chips 1 and the second type chips 8 by the spontaneous capillary flow phenomenon. Therefore, the first type underfill 4 is required to have low-viscosity. Because of this, the amount of filler in the first type underfill 4 is lower than that of filler in the normal seal resin.

As described above, the first type underfill 4 can be provided on the surrounding region 2 by using a needle dispenser if the width of the surrounding region 2 is 0.1 mm or more. It is preferable to set the spaces between the first type chips 1 and the second type chips 8 to 10 μm or more for the purpose of making it possible for the first type underfill 4 provided on the surrounding region 2 to penetrate the spaces between the first type chips 1 and the second type chips 8 by the spontaneous capillary flow phenomenon.

Figure 8A:
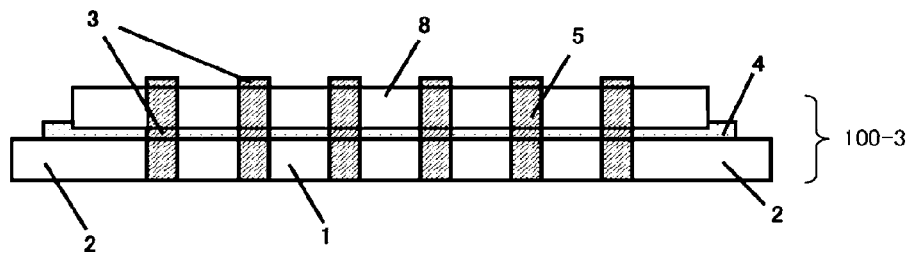
FIGS. 8A and 8B are vertical cross-section diagrams showing a manufacturing step of a semiconductor device having a multilayer laminated structure of chips in accordance with the second embodiment of the present invention.
Figure 8B:
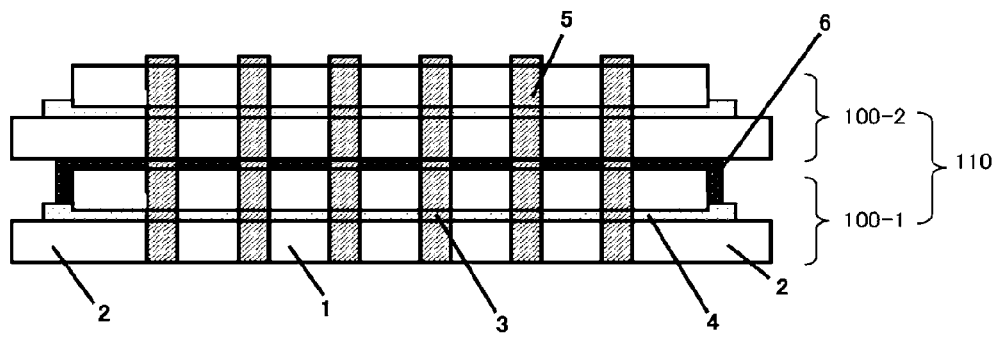

As shown in FIG. 8B, a second type underfill 6 is applied to the upper surface of the first two-chip sub-block 100-1, and the second two-chip sub-block 100-2 is laminated on the first two-chip sub-block 100-1. Thus, a four-chip sub-block 110 is formed. Here, the second type chip 8 of the first two-chip sub-block 100-1 and the first type chip 1 of the second two-chip sub-block 100-2 are laminated through the bumps 3 and the second type underfill 6. The second type underfill 6 is comprised of a resin whose viscosity and adhesion are higher than those of the first type underfill 4.

The hardened first type underfill 4 exists between the first type chip 1 and the second type chip 8, both of which comprise the first two-chip sub-block 100-1. In the lamination step of the first two-chip sub-block 100-1 and the second two-chip sub-block 100-2, stress which is applied to the bumps 3 located between the first type chip 1 and the second type chip 8 is reduced by the hardened first type underfill 4. As a result, it is possible to inhibit generation of defects (e.g., a crack) in the bumps 3 located between the first type chip 1 and the second type chip 8, both of which comprise the first two-chip sub-block 100-1.

In the same way, the hardened first type under fill 4 exists between the first type chip 1 and the second type chip 8, both of which comprise the second two-chip sub-block 100-2. In the lamination step of the first two-chip sub-block 100-1 and the second two-chip sub-block 100-2, stress which is applied to the bumps 3 located between the first type chip 1 and the second type chip 8 is reduced by the hardened first type underfill 4. As a result, it is possible to inhibit generation of defects (e.g., a crack) in the bumps 3 located between the first type chip 1 and the second type chip 8, both of which comprise the second two-chip sub-block 100-2.

After the four-chip sub-block 110 is formed by laminating the first two-chip sub-block 100-1 and the second two-chip sub-block 100-2, the second type underfill 6 between the first two-chip sub-block 100-1 and the second two-chip sub-block 100-2 is hardened. In this case, thermal hardening can be used for hardening the second type underfill 6.

Figure 9:
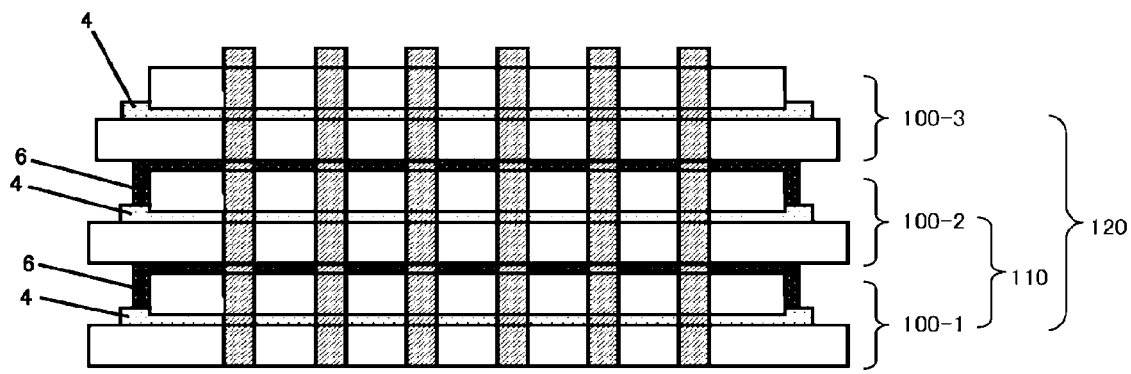
FIG. 9 is a vertical cross-section diagram showing a manufacturing step of a semiconductor device having a multilayer laminated structure of chips in accordance with the second embodiment of the present invention.

As shown in FIG. 9, the above described second type underfill 6 is applied to the upper surface of the above described four-chip sub-block 110, and the third two-chip sub-block 100-3 is laminated on the four-chip sub-block 110. Thus, a laminated structure comprised of a six-chip sub-block 120 is formed. Here, the second type chip 8 of the four-chip sub-block 110 and the first type chip 1 of the third two-chip sub-block 100-3 are laminated through the bumps 3 and the above described second type underfill 6.

The hardened first type underfill 4 exists between the first type chip 1 and the second type chip 8, both of which comprise the third two-chip sub-block 100-3. In the lamination step of the third two-chip sub-block 100-3 and the four-chip sub-block 110, stress which is applied to the bumps 3 located between the first type chip 1 and the second type chip 8, both of which comprise the third two-chip sub-block 100-3, is reduced by the hardened first type underfill 4. As a result, it is possible to inhibit generation of defects (e.g., a crack) in the bumps 3 located between the first type chip 1 and the second type chip 8, both of which comprises the third two-chip sub-block 100-3.

In the same way, the hardened first type underfill 4 and the hardened second underfill 6 exist in the spaces among the first type chips 1 and the second type chips 8. More specifically, the hardened first type underfills 4 exist (i) between the first type chip 1 and the second type 8, both of which comprise the first two-chip sub-block 100-1 and (ii) between the first type chip 1 and the second type 8, both of which comprise the second two-chip sub-block 100-2, in the four-chip sub-block 110. Also, the hardened underfill 6 exists between the second type chip 8 of the first two-chip sub-block 100-1 and the first type chip 1 of the second two-chip sub-block 100-2. In the lamination step of the third two-chip sub-block 100-3 and the four-chip sub-block 110, stress which is applied to the bumps 3 located between the first type chip 1 and the second type chip 8, both of which comprise the four-chip sub-block 110, is reduced by the hardened first type underfill 4 and the hardened second type underfill 6. As a result, it is possible to inhibit generation of defects (e.g., a crack) in the bumps 3 located between the first type chip 1 and the second type chip 8, both of which comprise the four-chip sub-block 110.

Then, the second type underfill 6 between the four-chip sub-block 110 and the third two-chip sub-block 100-3 is hardened. In this case, thermal hardening can be used for hardening the second type underfill 6.

Figure 10:
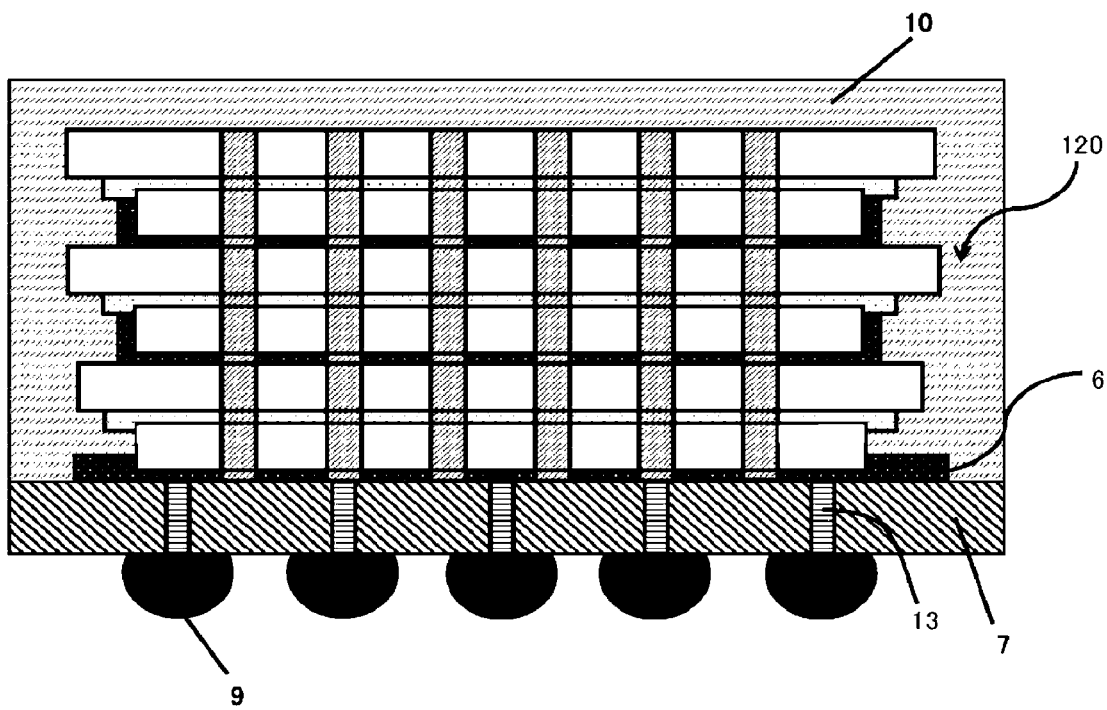
FIG. 10 is a vertical cross-section diagram showing a manufacturing step of a semiconductor device having a multilayer laminated structure of chips in accordance with the second embodiment of the present invention.

As shown in FIG. 10, the above described second type underfill 6 is applied to the upper surface of the second type chip 8 located at the top layer of a six-chip block 120. Then, the top second type chip 8 of the six-chip block 120 is turned downward, and a laminated structure comprised of the six-chip block 120 is laminated on an interposer 7 so that the top second type chip 8 faces the interposer 7. Here, the interposer 7 has a plurality of through-electrodes 13. The spacing of the plurality of the through-electrodes 13 formed in the interposer 7 is wider than that of the through-electrodes 5 formed in the laminated structure.

The hardened first type underfill 4 or the hardened second type underfill 6 exists in the spaces between the first type chips 1 and the second type chips 8, which comprise the six-chip block 120. More specifically, the hardened underfill 4 exists in the spaces between the first type chips 1 and the second type chips 8 in the first two-chip sub-block 100-1, the second two-chip sub-block 100-2, and the third two-chip sub-block 100-3, respectively. Also, the hardened second underfill 6 exists in the space between the first two-chip sub-block 100-1 and the second two-chip sub-block 100-2 and the space between the second two-chip sub-block 100-2 and the third two-chip sub-block 100-3. In the step of laminating the laminated structure comprised of the six-chip block 120 on the interposer 7, stress which is applied to the bumps 3 located between the first type chips 1 and the second type chips 8, which comprise the six-chip block 120, is reduced by the hardened first type underfill 4 and the hardened second type underfill 6. As a result, it is possible to inhibit generation of defects (e.g., a crack) in the bumps 3 located between the first type chips 1 and the second type chips 8, which comprise the six-chip block 120.

Then, the laminated structure, which is comprised of the six-chip block 120 laminated on the interposer 7, is sealed by a seal resin 10. Here, the amount of filler contained in the seal resin 10 is higher than that of filler of the first type underfill 4 and that of filler of the second type underfill 6 in order to maintain a highly reliable seal. It is possible to use a thermoplastic epoxy resin having a higher content of filler than that of the filler in the above described first type underfill 4 and the second type underfill 6 as the seal resin 10. Finally, external terminals 9, which are electrically connected to the through-electrodes 13, are connected to the lower surface of the interposer 7, and thus a semiconductor device is manufactured.

The above described through-electrodes can be comprised of a variety of conductive materials, such as Au, Ag, Cu, Ni, W, SnAg, and poly-Si. The above described bump 3 can be comprised of a variety of conductive materials, such as Sn/Pn, Au, Cu, and Cu+SnAg. The above described bumps 3 may be formed on the surface of the above described plurality of through-electrodes 5 on the second plane side of the first type chip 1 and the second type chip 8. The above described interposer 7 can be comprised of a glass epoxy resin, a polyimide resin, and a silicone resin, for instance.

The second embodiment of the present invention is different from the heretofore known methods, in which resin seal is conducted for a laminated structure comprised of a plurality of chips after it is laminated on a support substrate comprised of an interposer. According to the second embodiment of the present invention, two types of chips with different dimensions are laminated. Then, after a plurality of two-chip sub-blocks are formed and before other steps are conducted, the first type underfill that has low viscosity and works as a liquid is provided on the terrace (or the stage) comprised of the surrounding region of the first type chip so that the first type underfill comes in contact with the lateral side of the two-chip sub-blocks. As a result, the first type underfill penetrates the center of the two-chip sub-blocks through the space between the first type chips and the second type chips by the spontaneous capillary flow phenomenon, and the spaces are completely filled with the first type underfill. Then, the poured first type underfill is hardened.

In other words, the finished two-chip sub-block is comprised of the first type chip, the second type chip, and the hardened first type underfill formed between those two types of chips. Furthermore, the laminated structure comprised of the six-chip block is formed by laminating these two-chip sub-blocks with the second type underfill. Then, the laminated structure comprised of the six-chip block is laminated on the interposer through the second type underfill 6.

Accordingly, in the steps of laminating chip sub-blocks and laminating the laminated structure comprised of the chip block on the interposer functioning as the support substrate, either the hardened first type underfill or the hardened second type underfill is necessarily formed in the spaces between the first type chips and the second type chips. Therefore, stress which is applied to the bumps located between the first type chips and the second type chips is reduced or relieved. Because of this, it is possible to inhibit generation of defects (e.g., a crack) in the bumps 3.

As described above, the laminated structure comprised of the six-chip block is mounted on the support substrate after the laminated structure is formed. However, the present invention is not necessarily limited to this example. For example, in order to set the number of applying weight and heat with respect to each of the multilayer of chips to the same in the lamination steps, the following structure may be formed. First, four two-chip sub-blocks, each of which is comprised of a first type chip 1, a second type chip 8, and a first type underfill 4 formed between the first type chip 1 and the second type chip 8, may be formed. Then, two four-chip sub-blocks may be formed by further laminating these two-chip sub-blocks through a second type underfill 6. Furthermore, a laminated structure comprised of an eight-chip block may be formed by laminating these four-chip sub-blocks through the second type underfill 6. Finally, this laminated structure may be mounted on a support substrate through the second type underfill 6.

In the present embodiment, the laminated structure with an even number of the multilayer is explained, but the present invention is not necessarily limited to this example. The present invention can be effectively applied to the laminated structure with 3 or more odd number of the multilayer.

In addition, the first type chip 1 and the second type chip 8 may be laminated so that the circuit formation plane of the first type chip 1 and the circuit formation plane of the second type chip 8 face with each other. Then, immediately after this step, the space between the first type chip 1 and the second type chip 8 may be filled with the first type underfill 4 with the above described method. Because of this, the circuit formation plane of the first type chip 1 and the circuit formation plane of the second type chip 8 are always protected by the first type underfill 4 in the later steps. Therefore, this change in the lamination step is also acceptable.

In the present embodiment, the second type underfill 6 is used in addition to the first type underfill 4. However, it is possible to fill all of the spaces between the first type chips 1 and the second type chips 8 by using only the first type underfill 4.

Figure 11A:
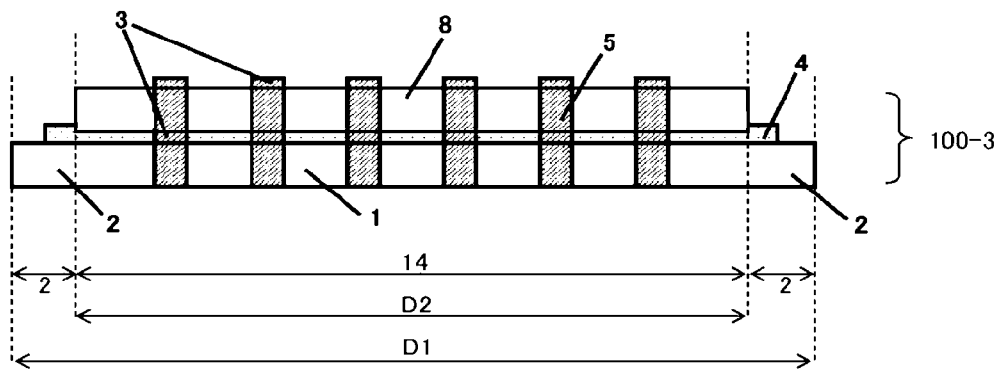
FIGS. 11A to 11C are vertical cross-section diagrams showing a manufacturing step of a semiconductor device having a multilayer laminated structure of chips in accordance with an alternative version of the second embodiment of the present invention.
Figure 11B:
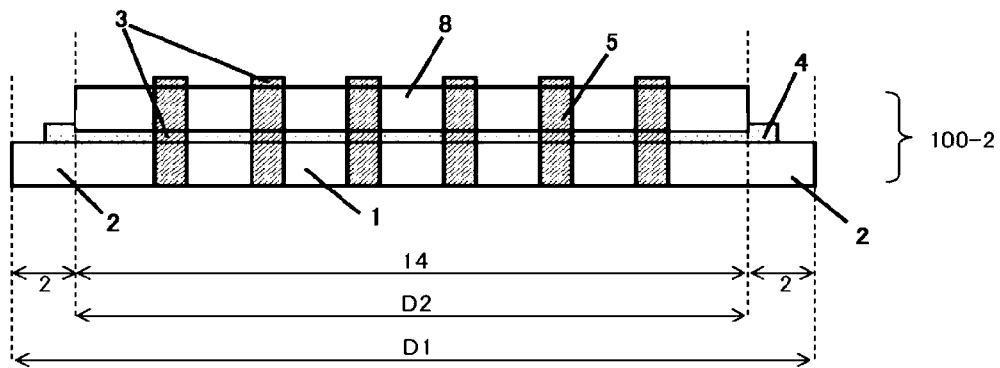
Figure 11C:
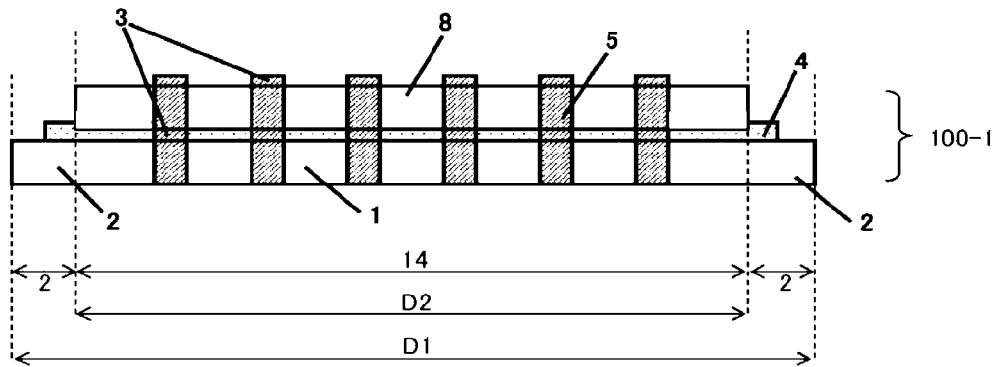

That is, as shown in FIGS. 11A to 11O, three two-chip sub-blocks 100 (i.e., a first two-chip sub-block 100-1, a second two-chip sub-block 100-2, and a third two-chip sub-block 100-3) are formed by laminating three first type chips 1 and three second type chips 8, respectively. A first type underfill 4 is provided on a terrace (or a stage) comprised of a surrounding region 2 of the first type chip 1 in each of the first to third two-chip sub-blocks 100-1, 100-2, and 100-3. Here, the first type underfill 4 is provided so that it comes in contact with the lateral side of the second type chips 8. The first type underfill 4 is comprised of an insulating resin that has low-viscosity and works as a liquid. The first type underfill 4 with a liquid nature penetrates the center of the two-chip sub-blocks 100 through the spaces between the first type chips 1 and the second type chips 8 by the spontaneous capillary flow phenomenon. As a result, the spaces between the first type chips 1 and the second type chips 8 are completely filled with the first type underfill 4. Then, the first type underfill which is poured into the spaces between the first type chips 1 and the second type chips 8 is hardened.

Figure 12A:
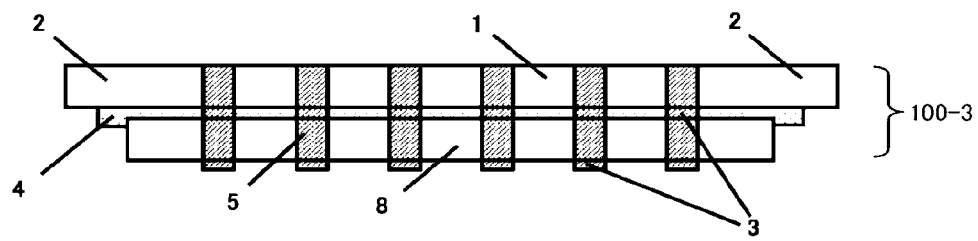
FIGS. 12A and 12B are vertical cross-section diagrams showing a manufacturing step of a semiconductor device having a multilayer laminated structure of chips in accordance with the alternative version of the second embodiment of the present invention.
Figure 12B:
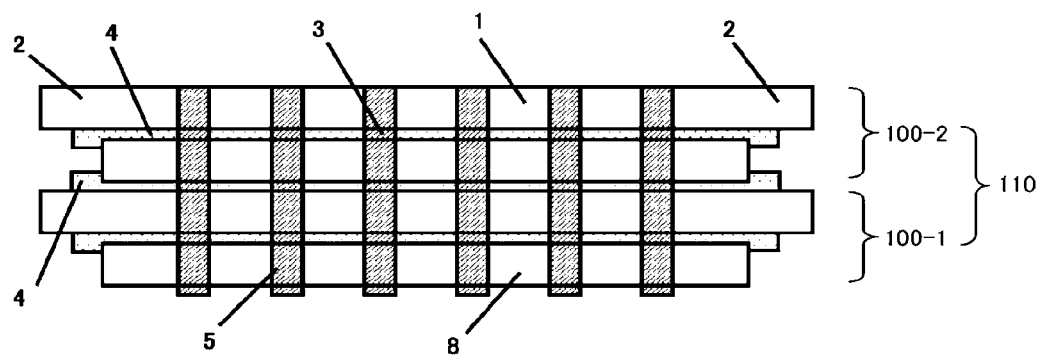

Next, as shown in FIGS. 12A and 12B, each of the first to third two-chip sub-blocks 100-1, 100-2, and 100-3 are turned upside down so that the first type chip 1 is located above the second type chip 8. A four-chip sub-block 110 is formed by laminating a second two-chip sub-block 100-2 on a first two-chip sub-block 100-1. Then, the first type underfill 4 is provided on the terrace (or the stage) comprised of the surrounding region 2 of the first type chip 1, which is the lower chip of the two first type chips 1 comprising the four-chip sub-block 110 (i.e., the first type chip 1 of the first two-chip sub-block 100-1). Thus, the space between the second type chip 8, which is the upper chip of the second type chips 8 comprising the four-chip sub-block 110 (i.e., the second type chip of the second two-chip sub-block 100-2), and the above described lower first type chip 1 (i.e., the first type chip 1 of the first two-chip sub-block 100-1) is filled with the first type underfill 4.

Figure 13:
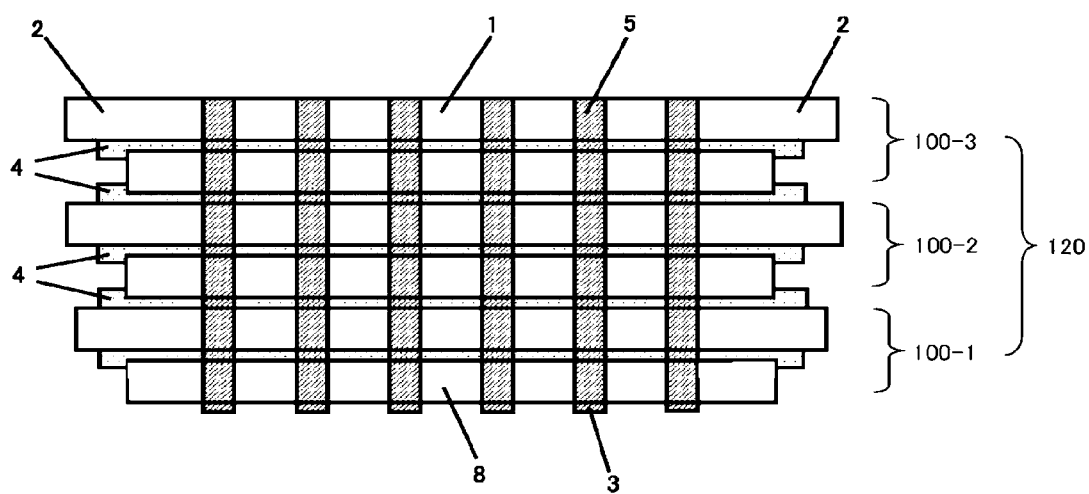
FIG. 13 is a vertical cross-section diagram showing a manufacturing step of a semiconductor device having a multilayer laminated structure of chips in accordance with an alternative version of the second embodiment of the present invention.

As shown in FIG. 13, a third two-chip sub-block 100-3 is laminated on the four-chip sub-block 110 and thus a laminated structure comprised of a six-chip block 120 is formed. Then, the first type underfill 4 is provided on the terrace (or the stage) comprised of the surrounding region 2 of the first type chip 1, which is the middle chip of the three first type chips 1 comprising the six-chip block 120 (i.e., the first type chip 1 of the second two-chip sub-block 100-2). Thus, the first type underfill 4 is filled in the space between the second type chip 8, which is the top chip of the three second type chips 8 comprising the six-chip block 120 (i.e., the second type chip 8 of the third two-chip block 100-3), and the above described middle first type chip 1 (i.e., the first type chip 1 of the second two-chip sub-block 100-2). Because of this, it is possible for all the spaces between the first chips 1 and the second chips 8, which comprise the laminated structure comprised of the six-chip block 120, to be filled with the first type underfill 4.

In this case, the above described first effect can be obtained. That is, in the step of laminating the chip sub-blocks and the step of laminating the laminated structure comprised of the chip block on the interposer, the hardened first type underfill certainly exists in the spaces between the first type chips and the second type chips. Therefore, stress which is applied to the bumps 3 located between the first type chips and the second type chips is reduced or relieved by the hardened first type underfill.

Also, in the present embodiment, two types of chips having different dimensions are used. However, it is possible to apply the present invention in accordance with the present embodiment to the case in which a chip sub-block is formed with 3 or more types of chips with different dimensions. In other words, it is possible to fill the spaces between chips having different dimensions with the first type underfill by allocating a chip with a larger dimension below a chip with a smaller dimension and by providing the above described first type underfill on the surrounding region of the chip with the larger dimension in forming a chip sub-block comprised of three or more types of chips having different dimensions.

Furthermore, it is possible to apply the present invention in accordance with the present embodiment to the case in which a laminated structure comprised of a chip block is formed by using chips with different dimensions from each other. In other words, it is possible to fill the spaces between chips with different dimensions from each other with the first type underfill by allocating a chip with a larger dimension below a chip with a smaller dimension and by providing the above described first type underfill on the surrounding region of the chip with the larger dimension in forming a chip block comprised of chips with different dimensions from each other.

Third Embodiment

According to the above described first embodiment of the present invention, a chip layer comprised of a plurality of second type chips 8 is laminated on a plurality of the circuit formation regions 14 of the wafer 20, which are arrayed in the two-dimensional matrix. However, in the third embodiment of the present invention, a multilayer of chips comprised of a plurality of second type chips 8 are laminated on a plurality of circuit formation regions 14 of the wafer 20, which are arrayed in the two-dimensional matrix. Referring now to the drawings, the third embodiment of the present invention will be described in detail.

Lamination Step

FIGS. 14 to 18 are vertical cross-section diagrams showing a manufacturing process of a semiconductor device having a multilayer laminated structure of chips in accordance with the third embodiment of the present invention.

As shown in FIG. 14, a wafer 20 is prepared, which includes a two-dimensional array of a plurality of circuit formation regions 14 and a surrounding region 2 surrounding the plurality of the circuit formation regions 14. Each of the plurality of circuit formation regions 14 has a nearly rectangular shape. The above described two-dimensional array is a two-dimensional matrix array. The surrounding region 2 is formed in a lattice shape when seen in a plan view so that it surrounds each of the plurality of the circuit formation regions 14 laid out in the two-dimensional matrix. Each of the plurality of the circuit formation regions 14 has a second horizontal dimension D2. The surrounding region 2 has a generally constant width D3. The width D3 of the surrounding region 2 is preferably set to 0.1 mm or more. As a typical example, no circuits are formed on the surrounding region 2. Also, each of the plurality of the circuit formation regions 14 has a plurality of through-electrodes 5 and a plurality of bumps 3. The plurality of the bumps 3 are formed on the surface of the through-electrodes 5 on the first plane side.

Also, a plurality of the second type chips 8 with the second horizontal dimension D2 are prepared. The dimension of each of the plurality of the second type chips 8 is the same as that of each of the plurality of the circuit formation regions 14 of the wafer 20. Also, each of the plurality of the second type chips 8 has a plurality of the through-electrodes 5 and a plurality of the bumps 3. The plurality of the through-electrodes 5 of the second type chips 8 and the plurality of the through-electrodes 5 of the wafer 20 are formed in the corresponding positions with each other in the horizontal direction. Each of the second type chips 8 has a circuit formation region 14 but does not have any surrounding region. The following lamination process is conducted by using the wafer 20 and the plurality of the second type chips 8 as fundamental components.

As shown in FIG. 14, four layers of chips comprised of the plurality of the second type chips 8 are laminated on the plurality of circuit formation regions 14 of the wafer 20, which are laid out in the two-dimensional matrix, respectively. As described above, the plurality of the through-electrodes 5 formed in the second type chips 8 and the plurality of the through-electrodes 5 formed in the wafer 20 are formed in the corresponding positions with each other in the horizontal direction. Therefore, the plurality of the through-electrodes 5 formed in the wafer 20 and the plurality of the through-electrodes 5 formed in the second type chips 8 are electrically connected with each other through the bumps 3. The circuit formation region 14 of the wafer 20 and the second type chips 8 laminated in the form of the four layers are completely overlapped in the horizontal direction. On the other hand, the surrounding portion 2 of the wafer 20 is extended outside the second type chips 8 laminated in the form of the four layers when seen in the horizontal direction.

As shown in FIG. 15, a first type underfill 4 is provided on the surrounding region 2 of the wafer 20 so that the first type underfill 4 comes in contact with the lateral side of the second type chips 8 laminated in the form of the four layers. The first type underfill 4 is comprised of an insulating resin that has low-viscosity and works as a liquid. The first type underfill 4 with a liquid nature penetrates the centers of the second type chips 8 through the spaces between the circuit formation regions 14 of the wafer 20 and the second type chips 8 and the spaces between the second type chips 8 by the spontaneous capillary flow phenomenon. As a result, the spaces between the circuit formation regions 14 of the wafer 20 and the second type chips 8, and the space between the second type chips 8, are completely filled with the first type underfill 4.

Then, the first type underfill 4 which is poured into the spaces between the circuit formation regions 14 of the wafer 20 and the second type chips 8, and the spaces between the second type chips 8, is hardened. If the first type underfill 4 is comprised of a thermosetting resin, it can be thermally hardened by applying heat. A thermosetting epoxy resin can be provided as a typical example of the thermosetting resin. In general, it is preferable for the seal resin to have a large amount of filler in order to maintain a highly reliable seal. However, as described above, the first type underfill 4 penetrates the spaces between the circuit formation regions 14 of the wafer 20 and the second type chips 8 and the spaces between the second type chips 8 by the spontaneous capillary flow phenomenon. Therefore, the first type underfill 4 is required to have low-viscosity. Because of this, the amount of filler contain in the first type underfill 4 is lower than that of the filler in normal seal resin.

As described above, the first type underfill 4 can be provided on the surrounding region 2 by using a needle dispenser if the width D3 of the surrounding region 2 is 0.1 mm or more. It is preferable to set the spaces between the circuit formation regions 14 of the wafer 20 and the second type chips 8 and the spaces between the second type chips 8 to 10 μm or more for the purpose of making it possible for the first type underfill 4 provided on the surrounding region 2 to penetrate the spaces between the circuit formation regions 14 of the wafer 20 and the second type chips 8 and the spaces between the second type chips 8 by the spontaneous capillary flow phenomenon.

Figure 16:
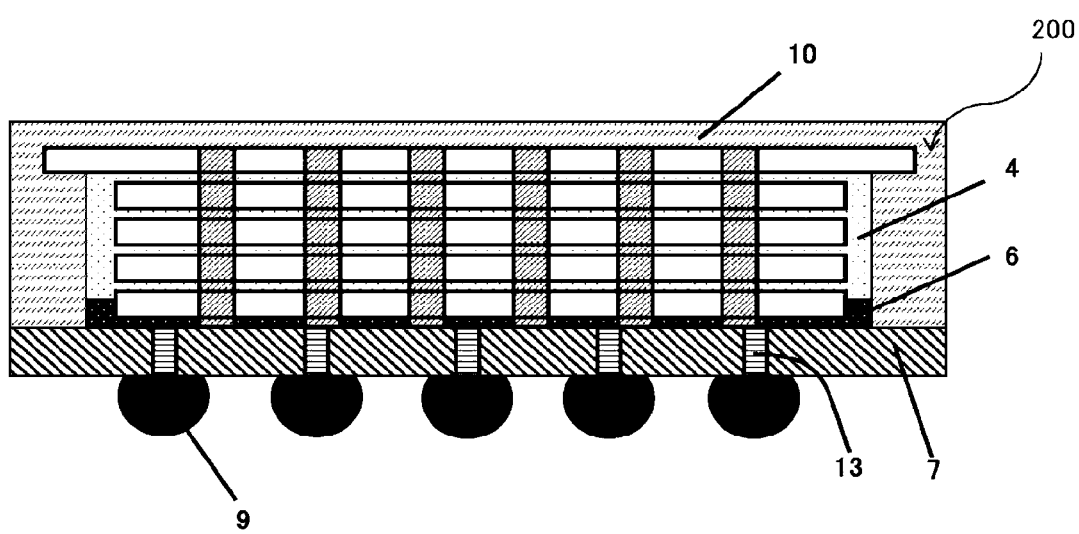
FIG. 16 is a vertical cross-section diagram showing a manufacturing step of a semiconductor device having a multilayer laminated structure of chips in accordance with the third embodiment of the present invention.

As shown in FIG. 16, the wafer 20 is divided into a plurality of first type chips 1 by conducting dicing with respect to the wafer 20 along the center line of the surrounding region 2 of the wafer 20. Thus, a five-chip sub-block 200 is formed. Here, The five-chip sub-block 200 is comprised of the first type chip 1, four second type chips 8-1, 8-2, 8-3. and 8-4, and the hardened first type underfill 4 formed in the spaces between the circuit formation region 14 of the first type chip 1 and the second type chip 8 and the spaces between the second type chips 8. The first type chip 1 has a first horizontal dimension D1. The first type chip 1 is comprised of the circuit formation region 14 and the surrounding region 2 remaining outside this circuit formation region 14.

A second type underfill 6 is applied to the upper surface of the second type chip 8-4 located at the top layer of the five-chip block 200. Then, the five-chip block 200 is turned upside down so that the first type chip 1 is located above the four second type chips 8, and it is laminated on an interposer 7. The second type underfill 6 is comprised of a resin whose viscosity and adhesion are higher than those of the first type underfill 4. Here, the interposer 7 has a plurality of through-electrodes 13. The spacing of the plurality of the through-electrodes 13 formed in the interposer 7 is wider than that of the through-electrodes 5 formed in the laminated structure.

The hardened first type underfill 4 exists in the space between the first type chip 1 and the second type chip 8, which comprise the five-chip block 200 and the spaces between the plurality of the second type chips 8. In the step of laminating the laminated structure comprised of the five-chip block 200 on the interposer 7, stress that is applied to the bumps 3 located between the first type chip 1 and the second type chip 8, which comprise the five-chip block 200, and the bumps 3 located between the second type chips 8, is reduced by the hardened first type underfill 4. As a result, it is possible to inhibit generation of defects (e.g., a crack) in the bumps 3 located between the first type chip 1 and the second type chip 8, which comprise the five-chip block 200 and the bumps 3 located between the plurality of the second type chips 8.

Then, the laminated structure, which is comprised of the five-chip block 200 laminated on the interposer 7, is sealed by a seal resin 10. Here, the amount of filler in the seal resin 10 is higher than that of the filler of the first type underfill 4 and that of the filler of the second type underfill 6 in order to maintain a highly reliable seal. It is possible to use a thermoplastic epoxy resin having a larger amount of filler than that of filler in the above described first type underfill 4 and the second type underfill 6 as the seal resin 10. Finally, external terminals 9, which are electrically connected to the through-electrodes 13, are connected to the lower surface of the interposer 7, and thus a semiconductor device is manufactured.

The above described through-electrodes can be comprised of a variety of conductive materials, such as Au, Ag, Cu, Ni, W, SnAg, and poly-Si. The above described bumps 3 can be comprised of a variety of conductive materials, such as Sn/Pn, Au, Cu, and Cu+SnAg. The above described bumps 3 may be formed on the surface of the above described plurality of through-electrodes 5 on the second plane side of the first type chip 1 and the second type chip 8. The above described interposer 7 can be comprised of a glass epoxy resin, a polyimide resin, and a silicone resin, for instance.

The third embodiment of the present invention is different from the heretofore known methods in which resin seal is conducted for a laminated structure comprised of a plurality of chips after it is laminated on a support substrate comprised of an interposer. According to the third embodiment of the present invention, the plurality of the second type chips are laminated on the plurality of circuit formation regions of the wafer that are laid out in a two-dimensional matrix. In other words, the multilayer of the plurality of the second type chips are formed on the plurality of the circuit formation regions, respectively. Here, dimension of the second type chip is the same as that of this circuit formation region. Then, the first type underfill that has low viscosity and works as a liquid is provided on the surrounding region of the wafer so that the first type underfill comes in contact with the lateral side of the second type chips laminated in the form of the multilayer. As a result, the first type underfill penetrates the centers of the second type chips through the spaces between the circuit formation regions of the wafer and the second type chips and the spaces between the second type chips by the spontaneous capillary flow phenomenon, and these spaces are completely filled with the first type underfill. Then, the poured first type underfill is hardened. Furthermore, dicing of the wafer is conducted, and the five-chip blocks are formed, which are comprised of the circuit formation region and the surrounding region remaining around this circuit formation region, respectively. In other words, all the finished five-chip blocks are comprised of the first type chip, the second type chip, and the hardened first type underfill formed in the space between the circuit formation region of the first type chip and the second type chip and the spaces between the second type chips. Then, the laminated structure comprised of the five-chip block is laminated on the interposer through the second type underfill 6.

According to the third embodiment of the present invention, the following two effects are produced. First, the hardened first type underfill 4 exists in the space between the first type chip 1 and the second type chip 8, which comprise the five-chip block 200 and the spaces between the plurality of the second type chips 8. In addition, in the step of laminating the laminated structure comprised of the five-chip block 200 on the interposer 7, stress which is applied to the bumps 3 located between the first type chip 1 and the second type chip 8, which comprise the five-chip block 200 and the bumps 3 located between the plurality of the second type chips 8, is reduced by the hardened first type underfill 4. As a result, it is possible to inhibit generation of defects (e.g., a crack) in the bumps 3 located between the first type chip 1 and the second type chip 8, which comprise the five-chip block 200 and the bumps 3 located between the plurality of the second type chips 8.

Second, according to the third embodiment of the present invention, a chip block is formed by laminating a plurality of chips having a smaller dimension on a chip having a larger dimension compared to the smaller dimension of the plurality of chips. Then, the first type underfill that has low-viscosity and works as a liquid is provided on the terrace (or the stage) comprised of the surrounding region of the chip with the larger dimension, and it is poured into the spaces between the plurality of chips having the smaller dimension, and the space between the chip having the larger dimension and the bottom chip of the plurality of chips having the smaller dimension by using the spontaneous capillary flow phenomenon. After this step, the underfill poured into these spaces is simultaneously hardened. Therefore, it is possible to reduce the number of the steps of pouring and hardening the underfill.

Fourth Embodiment

According to the above described second embodiment of the present invention, a chip sub-block is formed by laminating a plurality of chips with different dimensions. The first type underfill that has low-viscosity and works as a liquid is provided on the terrace (or the stage) comprised of the surrounding region of the chip having a larger dimension of the plurality of the chips comprising the chip sub-block, and the underfill is poured into the spaces between the adjacent chips having different dimensions by using the spontaneous capillary flow phenomenon.

On the other hand, according to the fourth embodiment of the present invention, two chip sub-blocks are formed by laminating a plurality of chips with smaller dimensions on a chip with a larger dimension compared to the smaller dimensions of the plurality of chips. Then, a first type underfill that has low-viscosity and works as a liquid is provided on a terrace (or a stage) comprised of a surrounding region of the chip with the larger dimension, and the underfill is simultaneously poured into the spaces between the plurality of chips with the smaller dimensions and the space between the above described chip with the larger dimension and the bottom chip of the plurality of chips with the smaller dimensions by using the spontaneous capillary flow phenomenon. Thus, the number of the steps of pouring the underfill is decreased. Then, the first type underfill poured into the plurality of spaces is simultaneously hardened. Thus, the number of the steps of hardening the underfill is reduced. Referring now to the drawings, the fourth embodiment of the present invention will be described in detail.

Lamination Step

Figure 17:
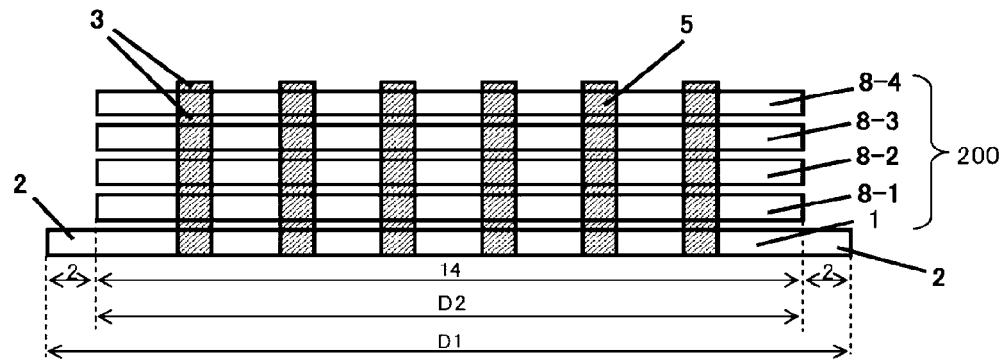
FIG. 17 is a vertical cross-section diagram showing a manufacturing step of a semiconductor device having a multilayer laminated structure of chips in accordance with a fourth embodiment of the present invention.
Figure 18:
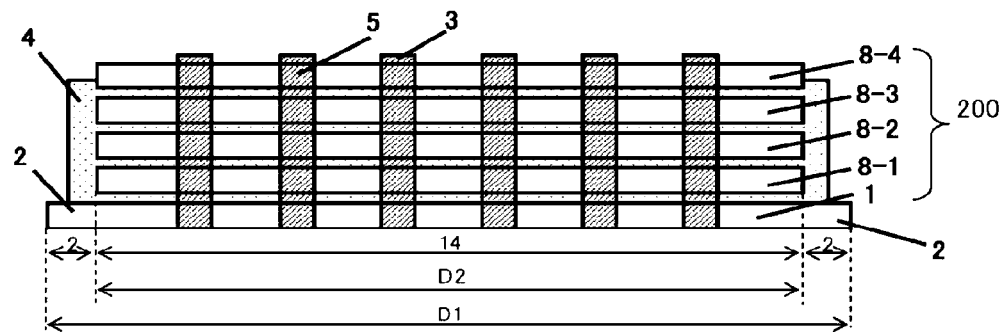
FIG. 18 is a vertical cross-section diagram showing a manufacturing step of a semiconductor device having a multilayer laminated structure of chips in accordance with the fourth embodiment of the present invention.
Figure 19:
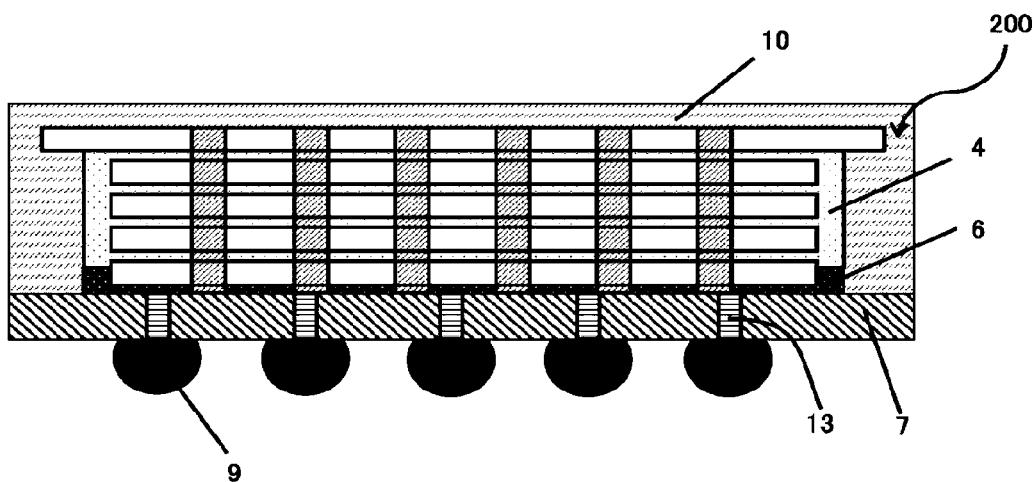
FIG. 19 is a vertical cross-section diagram showing a manufacturing step of a semiconductor device having a multilayer laminated structure of chips in accordance with the fourth embodiment of the present invention.

FIGS. 17 to 19 are vertical cross-section diagrams showing a manufacturing process of a semiconductor device having a multilayer laminated structure of chips in accordance with the fourth embodiment of the present invention.

As shown in FIG. 17, a first type chip 1 having a first horizontal dimension D1 is prepared. In addition, four second type chips 8 having a second horizontal dimension D2, which is smaller than the first horizontal dimension D1, are prepared. The first type chip 1 has a plurality of through-electrodes 5. Also, the first type chip 1 has a plurality of bumps 3. The plurality of the bumps 3 are formed on the first plane of the first type chip, more specifically, on the surface of the plurality of the through-electrodes 5. The first type chip 1 is comprised of a circuit formation region 14 and a surrounding region 2 that surrounds the circuit formation region 14. The circuit formation region 14 has the above described second horizontal dimension D2. In other words, the circuit formation region 14 has a horizontal dimension that is the same as the horizontal dimension of the second type chip 8. On the other hand, the surrounding region 2 has a width corresponding to half of the difference between the first horizontal dimension D1 and the second horizontal dimension D2. The width of the surrounding region 2 is preferably set to 0.1 mm or more. As a typical example, no circuits are formed on the surrounding region 2. However, the structure of the surrounding region is not necessarily limited to this structure, and a circuit may be formed on the surrounding region 2.

Each of the plurality of the second type chips 8 has a plurality of through-electrodes 5. The plurality of the through-electrodes 5 of the second type chips 8 and the plurality of the through-electrodes 5 of the above described first type chips 1 are formed in the corresponding positions with each other in the horizontal direction. Also, each of the second type chips 8 has a plurality of bumps 3. The plurality of bumps 3 are formed on the first plane of the second type chips 8, more specifically, on the surface of the plurality of the through-electrodes 5. Each of the second type chips 8 has a circuit formation region 14 but does not have any surrounding region. The following lamination process is conducted by using the first type chip 1 and the four second type chips 8 as fundamental components.

As shown in FIG. 17, four second type chips 8-1, 8-2, 8-3, and 8-4 are sequentially laminated on a first type chip, and a five-chip block 200 is formed. Therefore, the plurality of the through-electrodes 5 formed on any chip of those five chips comprising the five-chip block 200 are electrically connected with each other through the plurality of the through-electrodes 5 and the bumps 3 formed on an adjacent chip/adjacent chips. The circuit formation region 14 of the first type chip 1 and the second type chips 8 are completely overlapped in the horizontal direction. On the other hand, the surrounding region 2 of the first type chip 1 is extended outside the second type chips 8 in the horizontal direction. Therefore, the five-chip block 200 has a terrace (or a stage) comprised of the surrounding region 2 of the first type chip 1.

As shown in FIG. 18, a first type underfill 4 is poured in the space between the first type chip 1 and the bottom second type chip 8, and the spaces between four second type chips 8 from the lateral side of the five-chip block 200, and the poured first type underfill 4 is hardened. Also, before the first type underfill 4 is poured, the five-chip block 200 is allocated so that the first type chip 1 is located under the second type chips 8. Then, the first type underfill 4 is provided on the terrace (or the stage) comprised of the surrounding region 2 of the above described first type chips 1 in the five-chip block 200. Here, the first type underfill 4 is provided so that it comes in contact with the lateral side of the second type chips 8. The first type underfill 4 is comprised of an insulating resin that has low-viscosity and works as a liquid. The first type underfill 4 with a liquid nature penetrates the center of the five-chip block 200 through the space between the first type chip and the bottom second type chip 8 and the spaces between the plurality of the second type chips 8 by the spontaneous capillary flow phenomenon. As a result, the space between the first type chip 1 and the bottom second type chips 8 and the spaces between the plurality of the second type chips 8 are completely filled with the first type underfill 4.

Then, the first type underfill which is poured into the above described spaces is hardened. In other words, the finished five-chip block 200 is comprised of the first type chip 1, the second type chips 8, and the hardened first type underfill 4 that is formed in the space between the first type chip 1 and the bottom second type chip 8 and the spaces between the plurality of the second type chips 8.

If the first type underfill 4 is comprised of a thermosetting resin, it can be thermally hardened by applying heat. A thermosetting epoxy resin can be provided as a typical example of the thermosetting resin. In general, it is preferable for the seal resin to have large amount of filler in order to maintain a highly reliable seal. However, as described above, the first type underfill 4 penetrates the space between the first type chips 1 and the bottom second type chip 8 and the spaces between the plurality of the second type chips 8 by the spontaneous capillary flow phenomenon. Therefore, the first type underfill 4 is required to have low-viscosity. Because of this, the amount of filler contained in the first type underfill 4 is lower than that of filler in a normal seal resin.

As described above, the first type underfill 4 can be provided on the surrounding region 2 by using a needle dispenser if the width of the surrounding region 2 is 0.1 mm or more. It is preferable to set the space between the first type chip 1 and the bottom second type chip 8 and the spaces between the plurality of the second type chips 8 to 10 μm or more for the purpose of making it possible for the first type underfill 4 provided on the surrounding region 2 to penetrate the space between the first type chip 1 and the bottom second type chip 8 and the spaces between the plurality of the second type chips 8 by the spontaneous capillary flow phenomenon.

As shown in FIG. 19, a second type underfill 6 is applied to the upper surface of the chip located at the top of the five-chip block 200 (i.e., the second type chip 8-4). Then, the 5-chip block 200 is turned upside down so that the first type chip 1 is located above the second type chips 8, and it is laminated on an interposer 7. The second type underfill 6 is comprised of a resin whose viscosity and adhesion are higher than those of the first type underfill 4. Here, the interposer 7 has a plurality of through-electrodes 13. The spacing of the plurality of the through-electrodes 13 formed in the interposer 7 is wider than that of the through-electrodes 5 formed in the laminated structure.

The hardened first type underfill 4 exists in the space between the first type chip 1 and the second type chip 8, which comprise the five-chip block 200, and in the spaces between the plurality of the second type chips 8. In the step of laminating the laminated structure comprised of the five-chip block 200 on the interposer 7, stress which is applied to the bumps 3 located between the first type chip 1 and the second type chip 8, which comprise the five-chip block 200, and the bumps 3 located between the plurality of the second type chips 8, is reduced by the hardened first type underfill 4. As a result, it is possible to inhibit generation of defects (e.g., a crack) of the bumps 3 located between the first type chip 1 and the second type chip 8, which comprise the five-chip block 200 and the bumps 3 located between the plurality of the second type chips 8.

Then, the laminated structure, which is comprised of the five-chip block 200 laminated on the interposer 7, is sealed by a seal resin 10. Here, the amount of filler contained in the seal resin 10 is higher than that of the filler of the first type underfill 4 and that of the filler of the second type underfill 6 in order to maintain high seal reliability. It is possible to use a thermoplastic epoxy resin whose filler content is higher than that of the filler in the above described first type underfill 4 and the second type underfill 6 as the seal resin 10. Finally, external terminals 9, which are electrically connected to the through-electrodes 13, are connected to the lower surface of the interposer 7, and thus a semiconductor device is manufactured.

The above described through-electrodes can be comprised of a variety of conductive materials, such as Au, Ag, Cu, Ni, W, SnAg, and poly-Si. The above described bump 3 can be comprised of a variety of conductive materials, such as Sn/Pn, Au, Cu, and Cu+SnAg. The above described bumps 3 may be formed on the surface of the above described plurality of through-electrodes 5 on the second plane side of the first type chip 1 and the second type chip 8. The above described interposer 7 can be comprised of a glass epoxy resin, a polyimide resin, and a silicone resin, for instance.

The fourth embodiment of the present invention is different from the heretofore known methods, in which resin seal is conducted for a laminated structure comprised of a plurality of chips after it is laminated on a support substrate comprised of an interposer. That is, according to the fourth embodiment of the present invention, a single five-cihp block 200 is formed by sequentially laminating four second type chips 8-1, 8-2, 8-3, and 8-4 on a single first type chip 1. The first type underfill 4 that has low-viscosity and works as a liquid is provided on the terrace (or the stage) comprised of the surrounding region 2 of the first type chip 1. Here, the first type underfill 4 is provided so that it comes in contact with the lateral side of the second type chips 8-1, 8-2, 8-3, and 8-4. The first type underfill 4 is comprised of an insulating resin that has low-viscosity and works as a liquid. The first type underfill 4 with a liquid nature penetrates the center of the five-chip block 200 through the space between the first type chip 1 and the bottom second type chip (i.e., the second type chip 8-1), and the spaces between the plurality of the second type chips 8-1, 8-2, 8-3, and 8-4 by the spontaneous capillary flow phenomenon. As a result, the space between the first type chip 1 and the bottom second type chip (i.e., the second type chip 8-1), and the spaces between the plurality of the second type chips 8-1, 8-2, 8-3, and 8-4 are completely filled with the first type underfill 4e. Then, the first type underfill 4 which is poured into those spaces is hardened.

According to the fourth embodiment of the present invention, the following two effects are produced. First, the hardened first type underfill 4 exists in the space between the first type chip 1 and the second type chip 8, which comprise the five-chip block 200 and the spaces between the plurality of the second type chips 8. In addition, in the step of laminating the laminated structure comprised of the five-chip block 200 on the interposer 7, stress which is applied to the bumps 3 located between the first type chip 1 and the second type chip 8, which comprise the five-chip block 200 and the bumps 3 located between the plurality of the second type chips 8, is reduced by the hardened first type underfill 4. As a result, it is possible to inhibit generation of defects (e.g., a crack) in the bumps 3 located between the first type chip 1 and the second type chip 8, which comprise the five-chip block 200 and the bumps 3 located between the plurality of the second type chips 8.

Second, according to the fourth embodiment of the present invention, a chip block is formed by laminating a plurality of chips having a smaller dimension onto a chip having a larger dimension compared to the smaller dimension of the plurality of chips. Then, the first type underfill that has low-viscosity and works as a liquid is provided on the terrace (or the stage) comprised of the surrounding region of the chip with the larger dimension, and it is pored into the spaces between the plurality of chips having the smaller dimension, and the space between the above described chip with the larger dimension and the bottom chip of the plurality of chips with the smaller dimensions by using the spontaneous capillary flow phenomenon. After this step, the underfill poured into these spaces is simultaneously hardened. Therefore, it is possible to reduce the number of the steps of pouring and hardening the underfill.

Fifth Embodiment

According to the above described first embodiment of the present invention, a chip layer comprised of a plurality of second type chips 8 is laminated on a plurality of circuit formation regions 14 of the wafer 20, which are arrayed in a two-dimensional matrix. However, in the fifth embodiment of the present invention, a multilayer of chips comprised of a plurality of second type chips 8 are laminated on a plurality of circuit formation regions 14 of the wafer 20, which are arrayed in a two-dimensional matrix. Referring now to the drawings, the fifth embodiment of the present invention will be described in detail.

Lamination Step

FIGS. 20, 21, 22A, 22B, 23, and 24 are vertical cross-section diagrams showing a manufacturing process of a semiconductor device having a multilayer laminated structure of chips in accordance with the fifth embodiment of the present invention.

As shown in FIG. 20, a wafer 20 is prepared, which includes a two-dimensional array of a plurality of circuit formation regions 14 and a surrounding region 2 surrounding the plurality of the circuit formation regions 14. Each of the plurality of circuit formation regions 14 has a nearly rectangular shape. The above described two-dimensional array is a two-dimensional matrix array. The surrounding region 2 is formed in a lattice shape when seen in a plan view so that it surrounds each of the plurality of the circuit formation regions 14 laid out in the two-dimensional matrix. Each of the plurality of the circuit formation regions 14 has a second horizontal dimension D2. The surrounding region 2 has a generally constant width D3. The width D3 of the surrounding region 2 is preferably set to 0.1 mm or more. As a typical example, no circuits are formed on the surrounding region 2. Also, each of the plurality of the circuit formation regions 14 has a plurality of through-electrodes 5 and a plurality of bumps 3. The plurality of the bumps 3 are formed on the surface of the through-electrodes 5 on the first plane side.

Also, a plurality of the second type chips 8 with the second horizontal dimension D2 are prepared. The dimension of each of the plurality of the second type chips 8 is the same as that of each of the plurality of the circuit formation regions 14 of the wafer 20. Also, each of the plurality of the second type chips 8 has a plurality of the through-electrodes 5 and a plurality of the bumps 3. The plurality of the through-electrodes 5 of the second type chips 8 and the plurality of the through-electrodes 5 of the wafer 20 are formed in the corresponding positions with each other in the horizontal direction. Each of the second type chips 8 has a circuit formation region 14 but does not have any surrounding region. The following lamination process is conducted by using the wafer 20 and the plurality of the second type chips 8 as fundamental components.

As shown in FIG. 20, four layers of chips comprised of the plurality of the second type chips 8 are laminated on the plurality of circuit formation regions 14 of the wafer 20, which are laid out in the two-dimensional matrix, respectively. As described above, the plurality of the through-electrodes 5 formed in the second type chips 8 and the plurality of the through-electrodes 5 formed in the wafer 20 are formed in the corresponding positions with each other in the horizontal direction. Therefore, the plurality of the through-electrodes 5 formed in the wafer 20 and the plurality of the through-electrodes 5 formed in the second type chips 8 are electrically connected with each other through the bumps 3. The circuit formation region 14 of the wafer 20 and the second type chips 8 laminated in the form of the four layers are completely overlapped in the horizontal direction. On the other hand, the surrounding region 2 of the wafer 20 is extended outside the second type chips 8 laminated in the form of the four layers when seen in the horizontal direction.

As shown in FIG. 21, a first type underfill 4 is provided on the surrounding region 2 of the wafer 20 so that the first type underfill 4 comes in contact with the lateral side of the second type chips 8 laminated in the form of the four layers. The first type underfill 4 is comprised of an insulating resin that has low-viscosity and works as a liquid. The first type underfill 4 with a liquid nature penetrates the centers of the second type chips 8 through the spaces between the circuit formation regions 14 of the wafer 20 and the second type chips 8 and the spaces between the second type chips 8 by the spontaneous capillary flow phenomenon. As a result, the spaces between the circuit formation regions 14 of the wafer 20 and the second type chips 8, and the spaces between the second type chips 8, are completely filled with the first type underfill 4 with a liquid nature.

Then, the first type underfill 4 which is poured into the spaces between the circuit formation regions 14 of the wafer 20 and the second type chips 8, and the spaces between the second type chips 8, is hardened. If the first type underfill 4 is comprised of a thermosetting resin, it can be thermally hardened by applying heat. A thermosetting epoxy resin can be provided as a typical example of the thermosetting resin. In general, it is preferable for the seal resin to have a large amount of filler in order to maintain a highly reliable seal. However, as described above, the first type underfill 4 penetrates the spaces between the circuit formation regions 14 of the wafer 20 and the second type chips 8 and the spaces between the second type chips 8 by the spontaneous capillary flow phenomenon. Therefore, the first type underfill 4 is required to have low-viscosity. Because of this, the amount of filler in the first type underfill 4 is lower than that of the filler in a normal seal resin.

As described above, the first type underfill 4 can be provided on the surrounding region 2 by using a needle dispenser if the width D3 of the surrounding region 2 is 0.1 mm or more. It is preferable to set the spaces between the circuit formation regions 14 of the wafer 20 and the second type chips 8 and the spaces between the second type chips 8 to 10 μm or more for the purpose of making it possible for the first type underfill 4 provided on the surrounding region 2 to penetrate the spaces between the circuit formation regions 14 of the wafer 20 and the second type chips 8 and the spaces between the second type chips 8 by the spontaneous capillary flow phenomenon.

Figure 22A:
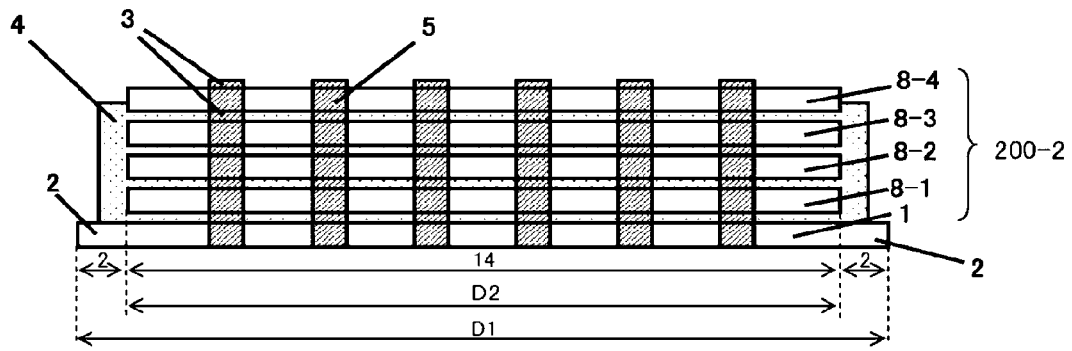
FIGS. 22A and 22B are vertical cross-section diagrams showing a manufacturing step of a semiconductor device having a multilayer laminated structure of chips in accordance with the fifth embodiment of the present invention.
Figure 22B:
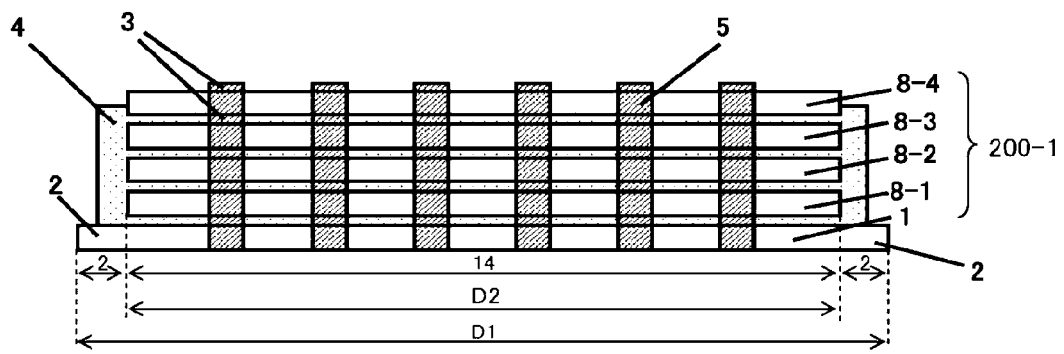

As shown in FIGS. 22A and 22B, the wafer 20 is divided into a plurality of first type chips 1 by conducting dicing with respect to the wafer 20 along the center line of the surrounding region 2 of the wafer 20. Thus, a plurality of five-chip sub-blocks 200 (e.g., a first five-chip sub-block 200-1 and a second five-chip sub-block 200-2) are formed. Here, each of the five-chip sub-blocks 200 is comprised of the first type chip 1, four second type chips 8-1, 8-2, 8-3. and 8-4, and the hardened first type underfill 4 formed in the space between the circuit formation region 14 of the first type chip 1 and the second type chip 8 and the spaces between the second type chips 8. The first type chip 1 has a first horizontal dimension D1. The first type chip 1 is comprised of the circuit formation region 14 and the surrounding region 2 remaining outside this circuit formation region 14.

Figure 23:
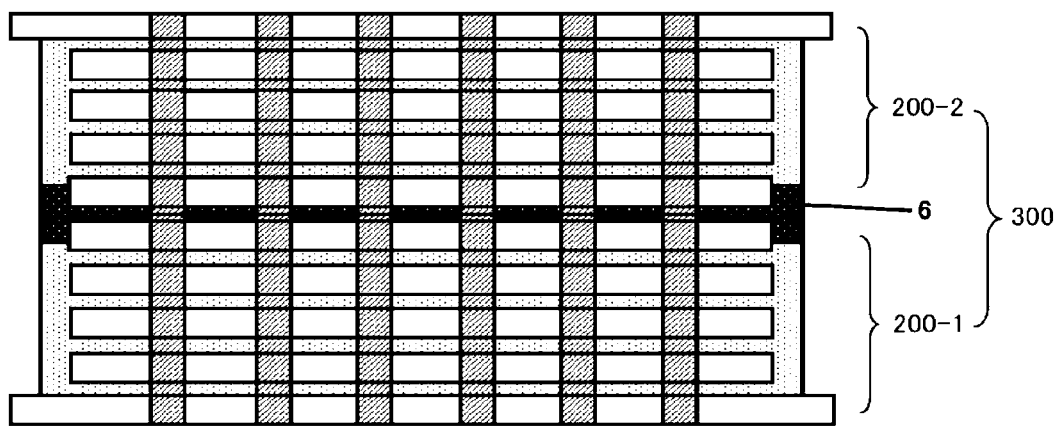
FIG. 23 is a vertical cross-section diagram showing a manufacturing step of a semiconductor device having a multilayer laminated structure of chips in accordance with the fifth embodiment of the present invention.

As shown in FIG. 23, a laminated structure comprised of a ten-chip block 300 is formed by laminating the first five-chip sub-block 200-1 and the second five-chip sub-block 200-2 through the second type underfill 6. Here, the first five-chip sub-block 200-1 and the second five-chip sub-block 200-2 are laminated so that the second type chip 8-4 included in the first five-chip sub-block 200-1 and the second type chip 8-4 included in the second five-chip sub-block 200-2 face with each other. The second type underfill 6 is comprised of a resin whose viscosity and adhesion are higher than those of the first type underfill 4.

The hardened first type underfill 4 exists in the space between the first type chip 1 and the second type chips 8, which comprise the first five-chip sub-block 200-1 and the spaces between the plurality of the second type chips 8 in the first five-chip sub-block 200-1. Also, the hardened first type underfill 4 exists in the space between the first type chip 1 and the second type chips 8, which comprise the second five-chip sub-block 200-2 and the spaces between the plurality of the second type chips 8 in the second five-chip sub-block 200-2. In the step of laminating the first five-chip sub-block 200-1 and the second five-chip sub-block 200-2, stress which is applied to the bumps 3 located between the first type chip 1 and the second type chips 8, which comprise the first five-chip sub-block 200-1 and the bumps 3 located between the plurality of the second type chips 8 in the first five-chip block 200-1, is reduced by the hardened first type underfill 4 of the first five-chip sub-block 200-1. Also, stress which is applied to the bumps 3 located between the first type chip 1 and the second type chips 8, which comprise the second five-chip sub-block 200-2 and the bumps 3 located between the plurality of the second type chips 8 in the second five-chip sub-block 200-2, is reduced by the hardened first type underfill 4 of the second five-chip sub-block 200-2. As a result, it is possible to inhibit generation of defects (e.g., a crack) in the bumps 3 located between the first type chip 1 and the second type chips 8, which comprise the first five-chip sub-block 200-1 and the bumps 3 located between the plurality of the second type chips 8 in the first five-chip sub-block 200-1. Also, it is possible to inhibit generation of defects (e.g., a crack) in the bumps 3 located between the first type chip 1 and the second type chips 8, which comprise the second five-chip sub-block 200-2 and the bumps 3 located between the plurality of the second type chips 8 in the second five-chip sub-block 200-2.

Then, the second type underfill 6 is hardened. The second type underfill 6 may be hardened by a thermal hardening step.

Figure 24:
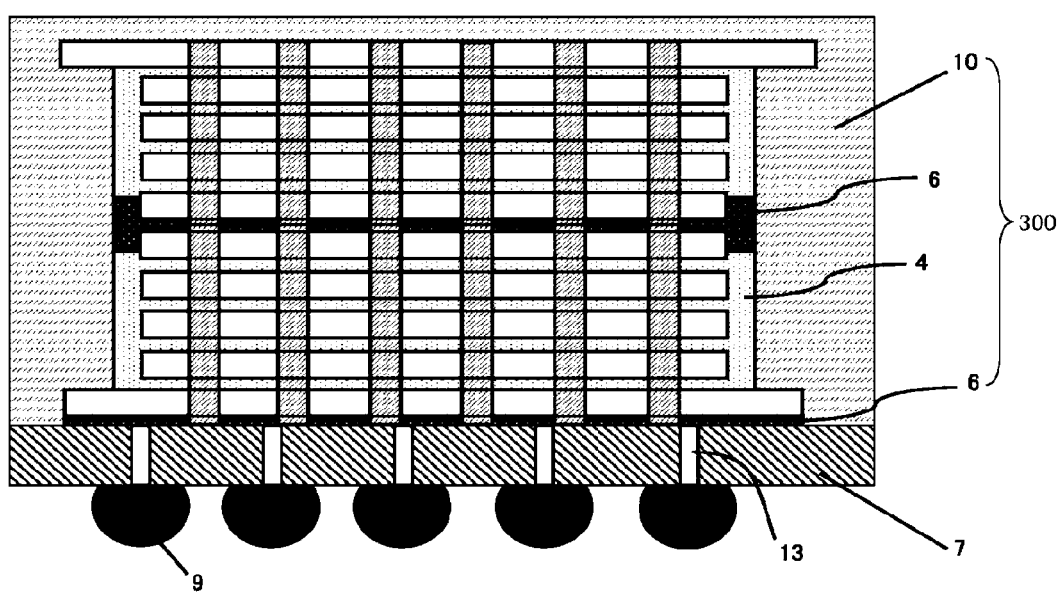
FIG. 24 is a vertical cross-section diagram showing a manufacturing step of a semiconductor device having a multilayer laminated structure of chips in accordance with the fifth embodiment of the present invention.

As shown in FIG. 24, a laminated structure comprised of the 10-chip block 300 is laminated on an interposer 7. Here, the interposer 7 has a plurality of through-electrodes 13. The spacing of the plurality of the through-electrodes 13 formed in the interposer 7 is wider than that of the through-electrodes 5 formed in the laminated structure.

The hardened first type underfill 4 and the hardened second type underfill 6 exist in the spaces among the first type chips 1 and the second type chips 8, which comprise the 10-chip block 300. More specifically, the hardened first type underfill 4 exists in (i) the space between the first type chip 1 and the second type chips 8, which comprise the first two-chip sub-block 200-1, (ii) the spaces between the second type chips 8 in the first two-chip sub-block 200-1, (iii) the space between the first type chip 1 and the second type chips 8, which comprise the second two-chip sub-block 200-2, and (iv) the spaces between the second type chips 8 in the second two-chip sub-block 200-2. On the other hand, the hardened second type underfill 6 exists in the space between the second type chip 8-4 of the first two-chip sub-block 200-1 and the second type chip 8-4 of the second two-chip sub-block 200-2. In the step of laminating the laminated structure comprised of the ten-chip block 300 on the interposer 7, stress that is applied to the bumps 3 located between the first type chips 1 and the second type chips 8, which comprise the 10-chip block 300 and the bumps 3 located between the second type chips 8 in the 10-chip block 300 is reduced by the hardened first type underfill 4 and the hardened second type underfill 6. As a result, it is possible to inhibit generation of defects (e.g., a crack) in the bumps 3 located between the first type chips 1 and the second type chips 8, which comprise the ten-chip block 300 and the bumps 3 located between the plurality of the second type chips 8 in the ten-chip block 300.

Then, the laminated structure, which is comprised of the ten-chip block 300 laminated on the interposer 7, is sealed by a seal resin 10. Here, the amount of filler in the seal resin 10 is higher than that of the filler of the first type underfill 4 and that of the filler of the second type underfill 6 in order to maintain a highly reliable seal. It is possible to use a thermoplastic epoxy resin having a larger amount of filler than that of filler in the above described first type underfill 4 and the second type underfill 6 as the seal resin 10. Finally, external terminals 9, which are electrically connected to the through-electrodes 13, are connected to the lower surface of the interposer 7, and thus a semiconductor device is manufactured.

The fifth embodiment of the present invention is different from the heretofore known methods in which the resin seal is conducted for a laminated structure comprised of a plurality of chips after it is laminated on a support substrate comprised of an interposer. According to the fifth embodiment of the present invention, the plurality of the second type chips are laminated on the plurality of the circuit formation regions of the wafer, which are laid out in the 2-dimensional matrix. In other words, the multilayer of the second type chips are formed on the plurality of the circuit formation regions, respectively. Here, dimension of the second type chip is the same as that of this circuit formation region. Then, the first type underfill that has low viscosity and works as a liquid is provided on the surrounding region of the wafer so that the first type underfill comes in contact with the lateral side of the second type chips laminated in the form of the multilayer. As a result, the first type underfill penetrates the centers of the second type chips through the spaces between the circuit formation region of the wafer and the second type chips and the spaces between the second type chips by the spontaneous capillary flow phenomenon, and these spaces are completely filled with the first type underfill. Then, the poured first type underfill is hardened. Furthermore, dicing of the wafer is conducted, and the five-chip sub-blocks are formed, which are comprised of the circuit formation region and the surrounding region remaining around this circuit formation region, respectively. In other words, all the finished five-chip sub-blocks are comprised of the first type chip, the second type chip, and the hardened first type underfill formed in the space between the circuit formation region of the first type chip and the second type chip and the spaces between the second type chips. Then, the laminated structure comprised of the 10-chip block is formed by laminating two five-chip sub-blocks through the second underfill. This laminated structure is laminated on the interposer through the second type underfill.

According to the fifth embodiment of the present invention, the following three effects are produced. First, the hardened first type underfill 4 and the hardened second type underfill 6 exist in the space between the first type chip 1 and the second type chips 8, which comprise the first five-chip sub-block 200-1 and the second five-chip sub-block 200-2, respectively, and the space between the plurality of the second type chips 8 in the first five-chip sub-block 200-1 and the second five-chip sub-block 200-2. In the step of laminating the first five-chip sub-block 200-1 and the second 5-chip sub-block 200-2, stress which is applied to the bumps 3 located between the first type chip 1 and the second type chips 8 comprising the first five-chip sub-block 200-1 and the second five-chip sub-block 200-2, respectively, and the bumps 3 located between the plurality of the second type chips 8 in the first five-chip sub-block 200-1 and the second five-chip sub-block 200-2, is reduced by the hardened first type underfill 4. Furthermore, in the step of laminating the laminated structure comprised of the ten-chip block 300 on the interposer 7, stress which is applied to the bumps 3 located between the first type chips 1 and the second type chips 8, which comprise the ten-chip block 300 and the bumps 3 located between the plurality of the second type chips 8 in the ten-chip sub-block 300, is reduced by the hardened first type underfill 4 and the second type underfill 6. As a result, it is possible to inhibit generation of defects (e.g., a crack) in the bumps 3 located between the first type chips 1 and the second type chips 8, which comprise the ten-chip block 300 and the bumps 3 located between the plurality of the second type chips 8 in the ten-chip block 300.

Second, according to the present embodiment of the present invention, a plurality of the chip sub-blocks are formed by laminating a plurality of chips having a smaller dimension on a chip having a larger dimension compared to the smaller dimension of the plurality of chips. Then, the first type underfill that has low-viscosity and works as a liquid is provided on the terrace (or the stage) comprised of the surrounding region of the chip with the larger dimension, and it is poured into the spaces between the plurality of chips having the smaller dimension, and the space between the above described chip with the larger dimension and the bottom chip of the plurality of chips with the smaller dimension by using the spontaneous capillary flow phenomenon. After this step, those poured underfills are simultaneously hardened. Therefore, it is possible to reduce the number of the steps of pouring and hardening the underfill.

Third, in the heretofore known inventions, there is a limitation for the number of laminated chips in which an underfill can be simultaneously poured into the plurality of spaces between the chips. On the other hand, according to the present invention, a plurality of chip sub-blocks are formed by laminating the maximum number of the chips in which an underfill can be simultaneously poured. Then, the underfill is poured into spaces between the plurality of chips comprising each of a plurality of chip sub-blocks, and it is hardened. After this step, a plurality of chip sub-blocks are laminated with each other and a laminated structure comprised of a chip block is formed. Thus, it is possible to apply the above described present invention to the case in which the number of the laminated chips of the laminated structure exceeds the number of the laminated chips in which an underfill can be simultaneously poured into spaces between the chips.

Sixth Embodiment

According to the above described second embodiment of the present invention, a chip sub-block is formed by laminating a plurality of chips with different dimensions. The first type underfill that has low-viscosity and works as a liquid is provided on the terrace (or the stage) comprised of the surrounding region of the chip having a larger dimension of the plurality of the chips comprising the chip sub-block, and the underfill is poured into the spaces between the adjacent chips having different dimensions by using the spontaneous capillary flow phenomenon.

On the other hand, according to the sixth embodiment of the present invention, two chip sub-blocks are formed by laminating a plurality of chips with smaller dimensions on the chip with a larger dimension compared to the smaller dimensions of the plurality of chips. Then, a first type underfill that has low-viscosity and works as a liquid is provided on a terrace (or a stage) comprised of a surrounding region of the chip with the larger dimension, and the underfill is simultaneously poured into the spaces between the plurality of chips with the smaller dimension and the space between the above described chip with the larger dimension and the bottom chip of the plurality of chips with the smaller dimension by using the spontaneous capillary flow phenomenon. Thus, the number of the steps of pouring the underfill is decreased. Then, the first type underfill poured into the plurality of spaces are simultaneously hardened. Thus, the number of the steps of hardening the underfill is reduced. Then, a laminated structure comprised of a ten-chip block is formed by laminating the two chip sub-blocks having the hardened first type underfill through the second type underfill. Referring now to the drawings, the fourth embodiment of the present invention will be described in detail.

Lamination Step

FIGS. 25A, 25B, 26A, 26B, 27, and 28 are vertical cross-section diagrams showing a manufacturing process of a semiconductor device having a multilayer laminated structure of chips in accordance with the sixth embodiment of the present invention.

Figure 25A:
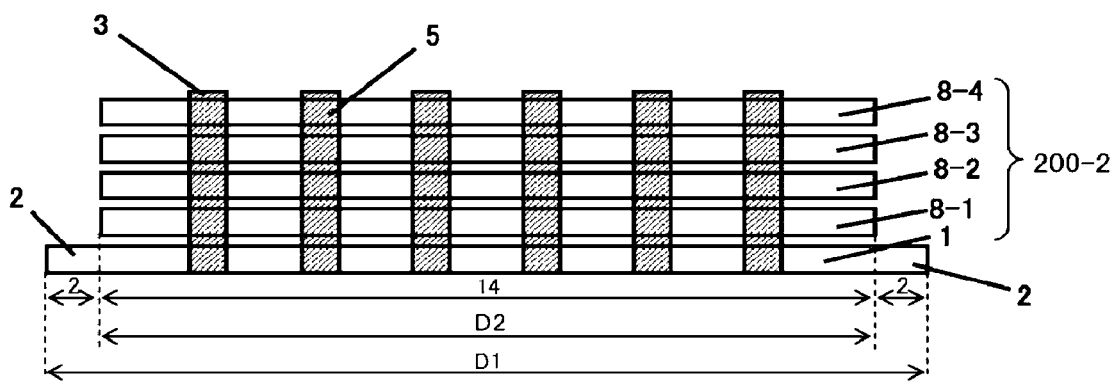
FIGS. 25A and 25B are vertical cross-section diagrams showing a manufacturing step of a semiconductor device having a multilayer laminated structure of chips in accordance with a sixth embodiment of the present invention.
Figure 25B:
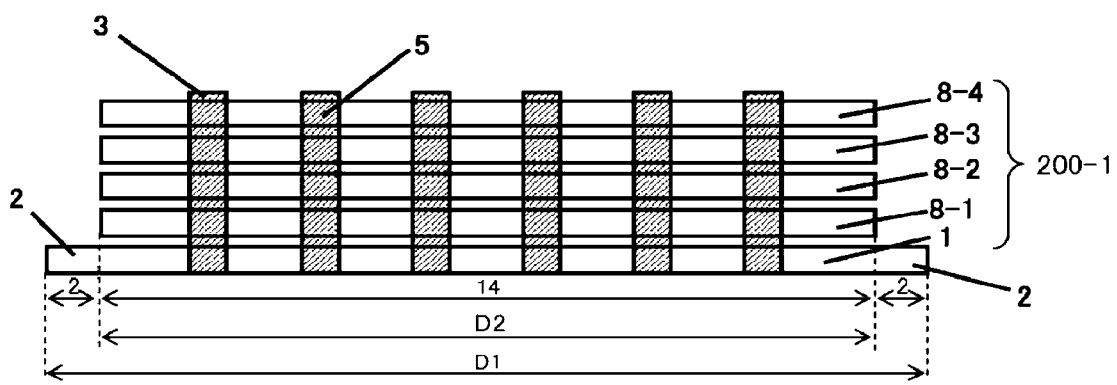

As shown in FIGS. 25A and 25B, two first type chips 1 having a first horizontal dimension D1 are prepared. In addition, eight second type chips 8 having a second horizontal dimension D2, which is smaller than the first horizontal dimension D1, are prepared. The first type chip 1 has a plurality of through-electrodes 5. Also, the first type chip 1 has a plurality of bumps 3. The plurality of the bumps 3 are formed on the first plane of the first type chip, more specifically, on the surface of the plurality of the through-electrodes 5. The first type chip 1 is comprised of a circuit formation region 14 and a surrounding region 2 surrounding the circuit formation region 14. The circuit formation region 14 has the above described second horizontal dimension D2. In other words, the circuit formation region 14 has the horizontal dimension that is the same as the horizontal dimension of the second type chip 8. On the other hand, the surrounding region 2 has a width corresponding to half of the difference between the first horizontal dimension D1 and the second horizontal dimension D2. The width of the surrounding region 2 is preferably set to 0.1 mm or more. As a typical example, no circuits are formed on the surrounding region 2. However, the structure of the surrounding region is not necessarily limited to this structure, and a circuit may be formed on the surrounding region 2.

Each of the plurality of the second type chips 8 has a plurality of through-electrodes 5. The plurality of the through-electrodes 5 of the second type chips 8 and the plurality of the through-electrodes 5 of the above described first type chips 1 are formed in the corresponding positions with each other in the horizontal direction. Also, each of the second type chips 8 has a plurality of bumps 3. The plurality of the bumps 3 are formed on the first plane of the second type chips 8, more specifically, on the surface of the plurality of the through-electrodes 5. Each of the second type chips 8 has a circuit formation region 14 but does not have any surrounding region. The following lamination process is conducted by using the two first type chips 1 and the eight second type chips 8 as fundamental components.

As shown in FIG. 25B, four second type chips 8-1, 8-2, 8-3, and 8-4 are sequentially laminated on a first type chip 1, and a first five-chip block 200-1 is formed. Therefore, the plurality of the through-electrodes 5 formed on any chip of those five chips comprising the first five-chip sub-block 200-1 are electrically connected with each other through the plurality of the through-electrodes 5 and the bumps 3 formed on an adjacent chip/adjacent chips. The circuit formation region 14 of the first type chip 1 and the second type chips 8 are completely overlapped in the horizontal direction. On the other hand, the surrounding region 2 of the first type chip 1 is extended outside the second type chips 8 in the horizontal direction. Therefore, the first five-chip sub-block 200-1 has a terrace (or a stage) comprised of the surrounding region 2 of the first type chip 1.

In the same way, as shown in FIG. 25A, a second five-chip sub-block 200-2 is formed by sequentially laminating four second type chips 8-1, 8-2, 8-3, and 8-4 on the first type chip 1. As a result, the plurality of the through-electrodes 5 formed on any chip of five chips comprising the second five-chip sub-block 200-2 are electrically connected with each other through the plurality of the through-electrodes 5 and the bumps 3 formed on an adjacent chip/adjacent chips. The circuit formation region 14 of the first type chip 1 and the second type chips 8 are completely overlapped in the horizontal direction. On the other hand, the second five-chip sub-block 200-2 is extended outside the second type chips 8 in the horizontal direction. Therefore, the second five-chip sub-block 200-2 has a terrace (or a stage) comprised of the surrounding portion 2 of the first type chip 1.

Figure 26A:
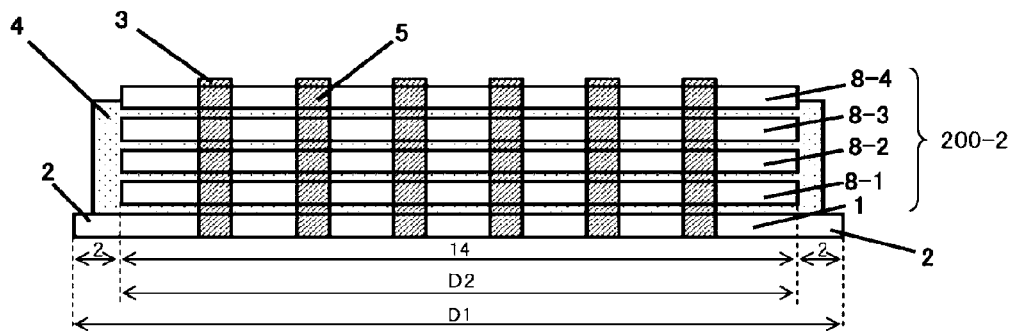
FIGS. 26A and 26B are vertical cross-section diagrams showing a manufacturing step of a semiconductor device having a multilayer laminated structure of chips in accordance with the sixth embodiment of the present invention.
Figure 26B:
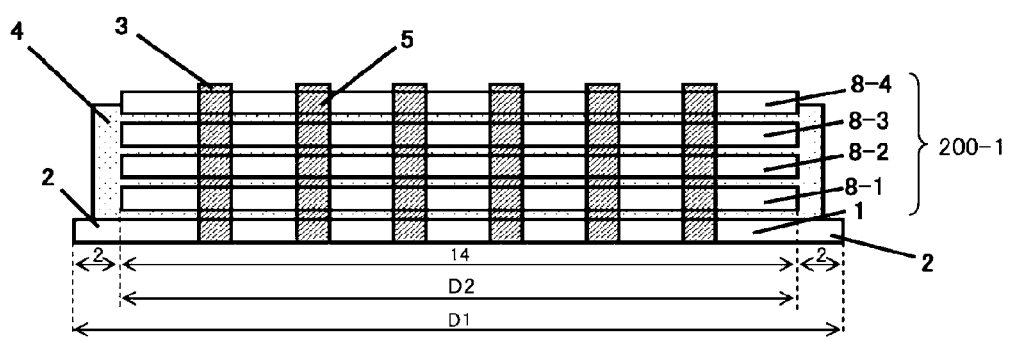

As shown in FIG. 26B, a first type underfill 4 is poured in the space between the first type chip 1 and the bottom second type chip 8, and the spaces between four second type chips 8 from the lateral side of the first five-chip sub-block 200-1, and the poured first type underfill 4 is hardened. Also, before the first type underfill 4 is poured, the first five-chip sub-block 200-1 is allocated so that the first type chip 1 is located under the second type chips 8. Then, the first type underfill 4 is provided on the terrace (or the stage) comprised of the surrounding region 2 of the above described first type chips 1 in the first five-chip sub-block 200-1. Here, the first type underfill 4 is provided so that it comes in contact with the lateral side of the second type chips 8. The first type underfill 4 is comprised of an insulating resin that has low-viscosity and works as a liquid. The first type underfill 4 with a liquid nature penetrates the center of the first five-chip sub-block 200-1 through the space between the first type chip and the bottom second type chip 8 and the spaces between the plurality of the second type chips 8 by the spontaneous capillary flow phenomenon. As a result, the space between the first type chip 1 and the bottom second type chips 8 and the spaces between the plurality of the second type chips 8 are completely filled with the first type underfill 4 with a liquid nature.

In the same way, as shown in FIG. 26A, the first type underfill 4 is poured in the space between the first type chip 1 and the bottom second type chip 8, and the spaces between four second type chips 8 from the lateral side of the second five-chip sub-block 200-2, and the poured first type underfill 4 is hardened. Also, before the first type underfill 4 is poured, the second five-chip sub-block 200-2 is allocated so that the first type chip 1 is located under the second type chips 8. Then, the first type underfill 4 is provided on the terrace (or the stage) comprised of the surrounding region 2 of the above described first type chips 1 in the second five-chip sub-block 200-2. Here, the first type underfill 4 is provided so that it comes in contact with the lateral side of the second type chips 8. The first type underfill 4 is comprised of an insulating resin that has low-viscosity and works as a liquid. The first type underfill 4 with a liquid nature penetrates the center of the second five-chip sub-block 200-2 through the space between the first type chip and the bottom second type chip 8 and the space between the plurality of the second type chips 8 by the spontaneous capillary flow phenomenon. As a result, the space between the first type chip 1 and the bottom second type chips 8 and the spaces between the plurality of the second type chips 8 are completely filled with the first type underfill 4 with a liquid nature.

Then, the first type underfill which is poured into the above described spaces in the first five-chip sub-block 200-1 is hardened. In other words, the finished first five-chip sub-block 200-1 is comprised of the first type chip 1, the second type chips 8, and the hardened first type underfill 4 that is formed in the space between the first type chip 1 and the bottom second type chip 8 and the spaces between the plurality of the second type chips 8.

In the same way, the first underfill 4 which is poured into the above described spaces in the second five-chip sub-block 200-2 is hardened. In other words, the finished second five-chip sub-block 200-2 is comprised of the first type chip 1, the second type chips 8, and the hardened first type underfill 4 that is formed in the space between the first type chip 1 and the bottom second type chip 8 and the spaces between the plurality of the second type chips 8.

If the first type underfill 4 is comprised of a thermosetting resin, it can be thermally hardened by applying heat. A thermosetting epoxy resin can be provided as a typical example of the thermosetting resin. In general, it is preferable for the seal resin to have a large amount of filler in order to maintain a highly reliable seal. However, as described above, the first type underfill 4 penetrates the space between the first type chips 1 and the bottom second type chip 8 and the spaces between the plurality of the second type chips 8 by the spontaneous capillary flow phenomenon. Therefore, the first type underfill 4 is required to have low-viscosity. Because of this, the amount of filler in the first type underfill 4 is lower than that of the filler in the normal seal resin.

As described above, the first type underfill 4 can be provided on the surrounding region 2 by using a needle dispenser if the width of the surrounding region 2 is 0.1 mm or more. It is preferable to set the space between the first type chip 1 and the bottom second type chip 8 and the spaces between the plurality of the second type chips 8 to 10 μm or more for the purpose of making it possible for the first type underfill 4 provided on the surrounding region 2 to penetrate the space between the first type chip 1 and the bottom second type chip 8 and the spaces between the plurality of the second type chips 8 by the spontaneous capillary flow phenomenon.

Figure 27:
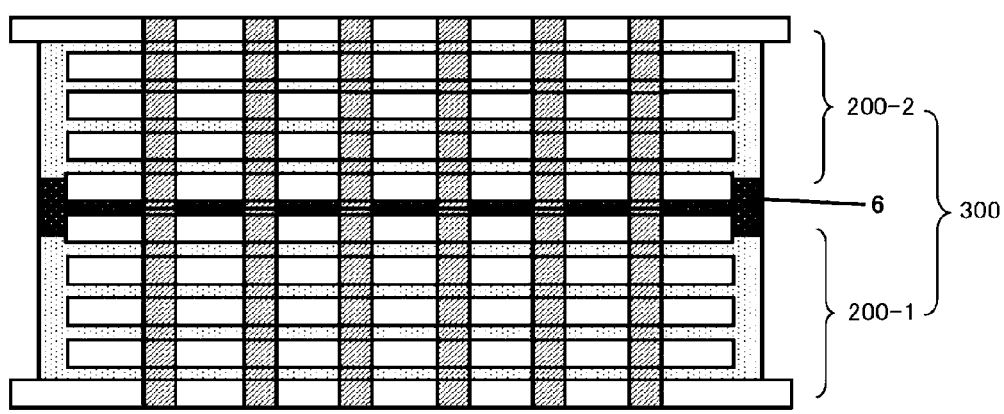
FIG. 27 is a vertical cross-section diagram showing a manufacturing step of a semiconductor device having a multilayer laminated structure of chips in accordance with the sixth embodiment of the present invention.

As shown in FIG. 27, a laminated structure comprised of a ten-chip block 300 is formed by laminating the first five-chip sub-block 200-1 and the second five-chip sub-block 200-2 through a second type underfill 6. Here, the first five-chip sub-block 200-1 and the second five-chip sub-block 200-2 are laminated so that the second type chip 8-4 included in the first five-chip sub-block 200-1 and the second type chip 8-4 included in the second five-chip sub-block 200-2 face with each other. The second type underfill 6 is comprised of a resin whose viscosity and adhesion are higher than those of the first type underfill 4.

The hardened first type underfill 4 exist in the space between the first type chip 1 and the second type chips 8, which comprise the first five-chip sub-block 200-1 and the spaces between the plurality of the second type chips 8 in the first five-chip sub-block 200-1. In the same way, the hardened first type underfill 4 exists in the space between the first type chip 1 and the second type chip 8, which comprise the second five-chip sub-block 200-2 and the spaces between the plurality of the second type chips 8 in the second five-chip sub-block 200-2. In the step of laminating the first five-chip sub-block 200-1 and the second five-chip sub-block 200-2, stress which is applied to the bumps 3 located between the first type chip 1 and the second type chips 8, which comprise the first five-chip sub-block 200-1 and the bumps 3 located between the plurality of the second type chips 8 in the first five-chip sub-block 200-1, is reduced by the hardened first type underfill 4 of the first five-chip sub-block 200-1. In the same way, stress which is applied to the bumps 3 located between the first type chip 1 and the second type chips 8, which comprise the second five-chip sub-block 200-2 and the bumps 3 located between the plurality of the second type chips 8 in the second five-chip sub-block 200-2, is reduced by the hardened first type underfill 4 of the second five-chip sub-block 200-2. As a result, it is possible to inhibit generation of defects (e.g., a crack) in the bumps 3 located between the first type chip 1 and the second type chips 8, which comprise the first five-chip sub-block 200-1 and the bumps 3 located between the plurality pf the second type chips 8 in the first five-chip sub-block 200-1. In the same way, it is possible to inhibit generation of defects (e.g., a crack) in the bumps 3 located between the first type chip 1 and the second type chips 8, which comprise the second five-chip sub-block 200-2 and the bumps 3 located between the plurality of the second type chips 8 in the second five-chip sub-block 200-2.

Then, the second type underfill 6 is hardened. The second type underfill 6 can be hardened by a thermal hardening step.

Figure 28:
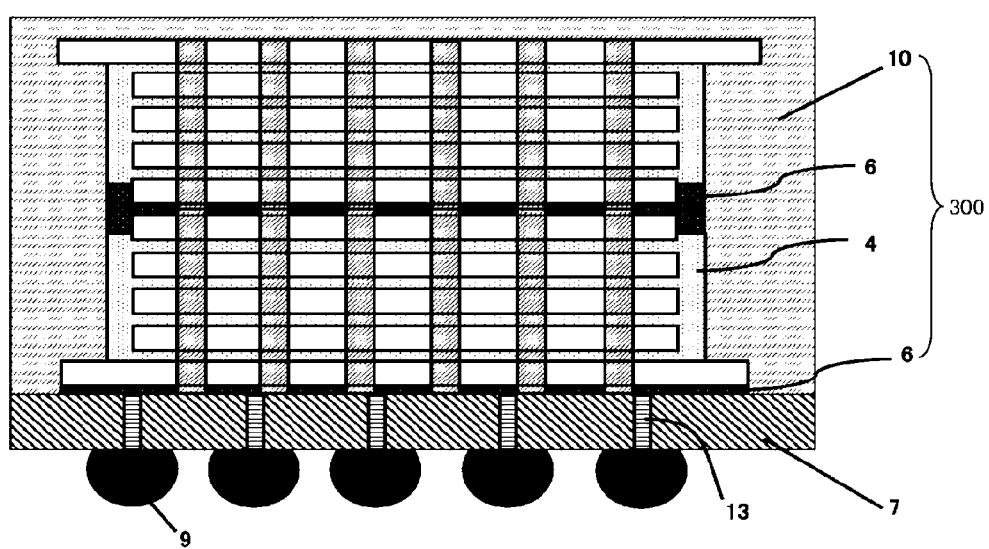
FIG. 28 is a vertical cross-section diagram showing a manufacturing step of a semiconductor device having a multilayer laminated structure of chips in accordance with the sixth embodiment of the present invention.

As shown in FIG. 28, the laminated structure comprised of the ten-chip block 300 is laminated on an interposer 7. Here, the interposer 7 has a plurality of through-electrodes 13. The spacing of the plurality of the through-electrodes 13 formed in the interposer 7 is wider than that of the through-electrodes 5 formed in the laminated structure.

The hardened first type underfill 4 and the second type underfill 6 exist in the space between the first type chip 1 and the second type chips 8, which comprise the ten-chip block 300, and in the spaces between the plurality of the second type chips 8. In the step of laminating the laminated structure comprised of the ten-chip block 300 on the interposer 7, stress which is applied to the bumps 3 located between the first type chip 1 and the second type chips 8, which comprise the ten-chip block 300 and the bumps 3 located between the plurality of the second type chips 8, is reduced by the hardened first type underfill 4 and the second type underfill 6. As a result, it is possible to inhibit generation of defects (e.g., a crack) in the bumps 3 located between the first type chip 1 and the second type chips 8, which comprise the ten-chip block 300 and the bumps 3 located between the plurality of the second type chips 8.

Then, the laminated structure, which is comprised of the ten-chip block 300 laminated on the interposer 7, is sealed by a seal resin 10. Here, the amount of filler in the seal resin 10 is higher than that of the filler of the first type underfill 4 and that of the filler of the second type underfill 6 in order to maintain a highly reliable seal. It is possible to use a thermoplastic epoxy resin having a larger amount of filler than that of filler in the above described first type underfill 4 and the second type underfill 6 as the seal resin 10. Finally, external terminals 9, which are electrically connected to through-electrodes 13, are connected to the lower surface of the interposer 7, and thus a semiconductor device is manufactured.

The sixth embodiment of the present invention is different from the heretofore known methods in which resin seal is conducted for a laminated structure comprised of a plurality of chips after it is laminated on a support substrate comprised of an interposer. That is, according to the sixth embodiment of the present invention, each of the first five-chip sub-block 200-1 and the second five-chip block 200-2 is formed by sequentially laminating the four second type chips 8-1, 8-2, 8-3, and 8-4 on the first type chip 1. The first type underfill 4 that has low-viscosity and works as a liquid is provided on the terrace (or the stage) comprised of the surrounding region 2 of the first type chip 1 of each of the first five-chip sub-block 200-1 and the second five-chip sub-block 200-2. Here, the first type underfill 4 is provided so that it comes in contact with the lateral side of the second type chips 8-1, 8-2, 8-3, and 8-4. The first type underfill 4 is comprised of an insulating resin that has low-viscosity and works as a liquid. The first type underfill 4 with a liquid nature simultaneously penetrates the center of the first five-chip sub-block 200-1 and that of the second five-chip sub-block 200-2 through the space between the first type chip 1 and the bottom second type chip 8-1, and the spaces between the plurality of the second type chips 8-1, 8-2, 8-3, and 8-4 in the first five-chip sub-block 200-1 and the second five-chip sub-block 200-2, respectively, by the spontaneous capillary flow phenomenon. As a result, the space between the first type chip 1 and the bottom second type chips 8-1, and the spaces between the plurality of the second type chips 8-1, 8-2, 8-3, and 8-4 in each of the first five-chip sub-block 200-1 and the second five-chip sub-block 200-2 are simultaneously completely filled with the first type underfill 4 with a liquid nature. Then, the first type underfill 4 which is poured into those spaces in each of the first five-chip sub-block 200-1 and the second five-chip sub-block 200-2 is hardened. After this step, the first five-chip sub-block 200-1 and the second five-chip sub-block 200-2 are laminated through the second type underfill 6, and the second type underfill 6 is hardened.

According to the sixth embodiment of the present invention, the following three effects are produced. First, the hardened first type underfill 4 and the hardened second type underfill 6 exist in the space between the first type chips 1 and the second type chips 8, which comprise the first five-chip sub-block 200-1 and the second five-chip sub-block 200-2, respectively, and the spaces between the plurality of the second type chips 8 in the first five-chip sub-block 200-1 and the second five-chip sub-block 200-2. In addition, in the step of laminating the first five-chip sub-block 200-1 and the second five-chip sub-block 200-2, stress which is applied to the bumps 3 located between the first type chip 1 and the second type chips 8, which comprise the first five-chip sub-block 200-1 and the second five-chip sub-block 200-2, respectively, and the bumps 3 located between the plurality of the second type chips 8 in the first five-chip sub-block 200-1 and the second five-chip sub-block 200-2, is reduced by the hardened first type underfill 4. Furthermore, in the step of laminating the laminated structure comprised of the ten-chip block 300 on the interposer 7, stress which is applied to the bumps 3 located between the first type chips 1 and the second type chips 8, which comprise the ten-chip block 300 and the bumps 3 located between the plurality of the second type chips 8 in the ten-chip block 300, is reduced by the hardened first type underfill 4 and the hardened second type underfill 6. As a result, it is possible to inhibit generation of defects (e.g., a crack) in the bumps 3 located between the first type chips 1 and the second type chips 8, which comprise the ten-chip block 300 and the bumps 3 located between the plurality of the second type chips 8 in the ten-chip block 300.

Second, according to the present embodiment of the present invention, a plurality of chip sub-blocks are formed by laminating a plurality of chips having a smaller dimension on a chip having a larger dimension compared to the smaller dimension of the plurality of chips. Then, the first type underfill that has low-viscosity and works as a liquid is provided on the terrace (or the stage) comprised of the surrounding region of the chip with the larger dimension, and it is poured into the spaces between the plurality of chips having the smaller dimension, and the space between the above described chip with the larger dimension and the bottom chip of the plurality of chips with the smaller dimension by using the spontaneous capillary flow phenomenon. After this step, the poured underfill is simultaneously hardened. Therefore, it is possible to reduce the number of the steps of pouring and hardening the underfill.

Third, in the heretofore known inventions, there is a limitation for the number of the laminated chips in which an underfill can be simultaneously poured into the plurality of spaces between the chips. On the other hand, according to the present invention, a plurality of chip sub-blocks are formed by laminating the maximum number of chips in which an underfill can be simultaneously poured into the plurality of spaces between the chips. Then, an underfill is poured into the spaces between a plurality of chips comprising each of a plurality of chip sub-blocks, and it is hardened. After this step, the plurality of chip sub-blocks are laminated and a laminated structure comprised of a chip block is formed. Thus, it is possible to apply the above described present invention to the case in which the number of the laminated chips of the laminated structure exceeds the number of the laminated chips in which an underfill can be simultaneously poured into spaces between the chips.

Seventh Embodiment

According to the above described first embodiment of the present invention, a chip layer comprised of a plurality of second type chips 8 is laminated on a plurality of circuit formation regions 14 of the wafer 20, which are arrayed in the two-dimensional matrix. However, in the seventh embodiment of the present invention, a multilayer of chips comprised of a plurality of second type chips 8 are laminated on a plurality of circuit formation regions 14 of the wafer 20, which are arrayed in the two-dimensional matrix. Referring now to the drawings, the seventh embodiment of the present invention will be described in detail.

Lamination Step

FIGS. 29, 30, 31A, 31B, 32, and 33 are vertical cross-section diagrams showing a manufacturing process of a semiconductor device having a multilayer laminated structure of chips in accordance with the seventh embodiment of the present invention.

As shown in FIG. 29, a wafer 20 is prepared, which includes a two-dimensional array of a plurality of circuit formation regions 14 and a surrounding region 2 surrounding the plurality of the circuit formation regions 14. Each of the plurality of circuit formation regions 14 has a nearly rectangular shape. The above described two-dimensional array is a two-dimensional matrix array. The surrounding region 2 is formed in a lattice shape when seen in a plan view so that it surrounds each of the plurality of the circuit formation regions 14 laid out in the two-dimensional matrix. Each of the plurality of the circuit formation regions 14 has a second horizontal dimension D2. The surrounding region 2 has a generally constant width D3. The width D3 of the surrounding region 2 is preferably set to 0.1 mm or more. As a typical example, no circuits are formed on the surrounding region 2. Also, each of the plurality of the circuit formation regions 14 has a plurality of through-electrodes 5 and a plurality of bumps 3. The plurality of the bumps 3 are formed on the surface of the through-electrodes 5 on the first plane side.

Also, a plurality of the second type chips 8 with the second horizontal dimension D2 are prepared. The dimension of each of the plurality of the second type chips 8 is the same as that of each of the plurality of the circuit formation regions 14 of the wafer 20. Also, each of the plurality of the second type chips 8 has a plurality of the through-electrodes 5 and a plurality of the bumps 3. The plurality of the through-electrodes 5 of the second type chips 8 and the plurality of the through-electrodes 5 of the wafer 20 are formed in the corresponding positions with each other in the horizontal direction. Each of the second type chips 8 has a circuit formation region 14 but does not have any surrounding region. The following lamination process is conducted by using the wafer 20 and the plurality of the second type chips 8 as fundamental components.

As shown in FIG. 29, four layers of chips comprised of the plurality of the second type chips 8 are laminated on the plurality of circuit formation regions 14 of the wafer 20, which are laid out in the two-dimensional matrix, respectively. As described above, the plurality of the through-electrodes 5 formed in the second type chips 8 and the plurality of the through-electrodes 5 formed in the wafer 20 are formed in the corresponding positions with each other in the horizontal direction. Therefore, the plurality of the through-electrodes 5 formed in the wafer 20 and the plurality of the through-electrodes 5 formed in the second type chips 8 are electrically connected with each other through the bumps 3. The circuit formation region 14 of the wafer 20 and the second type chips 8 laminated in the form of the four layers are completely overlapped in the horizontal direction. On the other hand, the surrounding region 2 of the wafer 20 is extended outside the second type chips 8 laminated in the form of the four layers when seen in the horizontal direction.

As shown in FIG. 30, a first type underfill 4 is provided on the surrounding region 2 of the wafer 20 so that the first type underfill 4 comes in contact with the lateral side of the second type chips 8 laminated in the form of the four layers. The first type underfill 4 is comprised of an insulating resin that has low-viscosity and works as a liquid. The first type underfill 4 with a liquid nature penetrates the centers of the second type chips 8 through the spaces between the circuit formation regions 14 of the wafer 20 and the second type chips 8 and the spaces between the second type chips 8 by the spontaneous capillary flow phenomenon. As a result, the spaces between the circuit formation regions 14 of the wafer 20 and the second type chips 8, and the spaces between the second type chips 8, are completely filled with the first type underfill 4 with a liquid nature.

Then, the first type underfill 4 which is poured into the spaces between the circuit formation regions 14 of the wafer 20 and the second type chips 8, and the spaces between the second type chips 8, is hardened. If the first type underfill 4 is comprised of a thermosetting resin, it can be thermally hardened by applying heat. A thermosetting epoxy resin can be provided as a typical example of the thermosetting resin. In general, it is preferable for the seal resin to have a large amount of filler in order to maintain a highly reliable seal. However, as described above, the first type underfill 4 penetrates the spaces between the circuit formation regions 14 of the wafer 20 and the second type chips 8 and the spaces between the second type chips 8 by the spontaneous capillary flow phenomenon. Therefore, the first type underfill 4 is required to have low-viscosity. Because of this, the amount of filler in the first type underfill 4 is lower than that of filler in the normal seal resin.

As described above, the first type underfill 4 can be provided on the surrounding region 2 by using a needle dispenser if the width D3 of the surrounding region 2 is 0.1 mm or more. It is preferable to set the spaces between the circuit formation regions 14 of the wafer 20 and the second type chips 8 and the spaces between the second type chips 8 to 10 μm or more for the purpose of making it possible for the first type underfill 4 provided on the surrounding region 2 to penetrate the spaces between the circuit formation regions 14 of the wafer 20 and the second type chips 8 and the spaces between the second type chips 8 by the spontaneous capillary flow phenomenon.

Figure 31A:
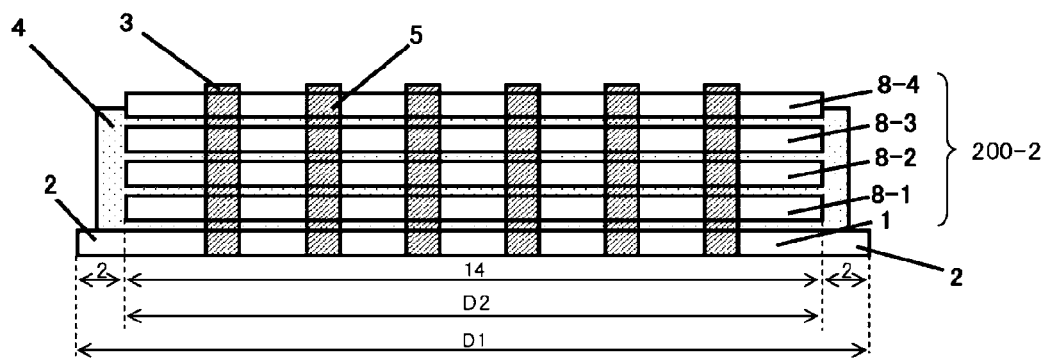
FIGS. 31A and 31B are vertical cross-section diagrams showing a manufacturing step of a semiconductor device having a multilayer laminated structure of chips in accordance with the seventh embodiment of the present invention.
Figure 31B:
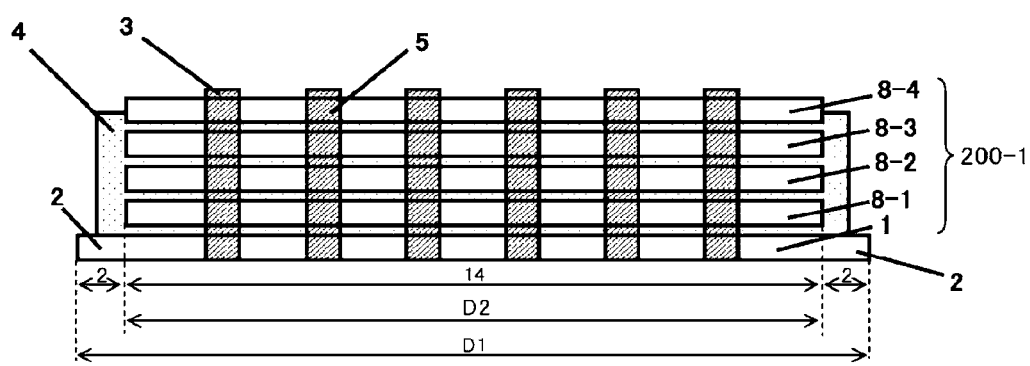

As shown in FIGS. 31A and 31B, the wafer 20 is divided into a plurality of first type chips 1 by conducting dicing with respect to the wafer 20 along the center line of the surrounding region 2 of the wafer 20. Thus, a plurality of five-chip sub-blocks 200 (e.g., a first five-chip sub-block 200-1 and a second five-chip sub-block 200-2) are formed. Here, each of the five-chip sub-blocks 200 is comprised of the first type chip 1, four second type chips 8-1, 8-2, 8-3, and 8-4, and the hardened first type underfill 4 formed in the space between the circuit formation region 14 of the first type chip 1 and the second type chip 8 and the spaces between the second type chips 8. The first type chip 1 has a first horizontal dimension D1. The first type chip 1 is comprised of the circuit formation region 14 and the surrounding region 2 remaining outside this circuit formation region 14.

Figure 32:
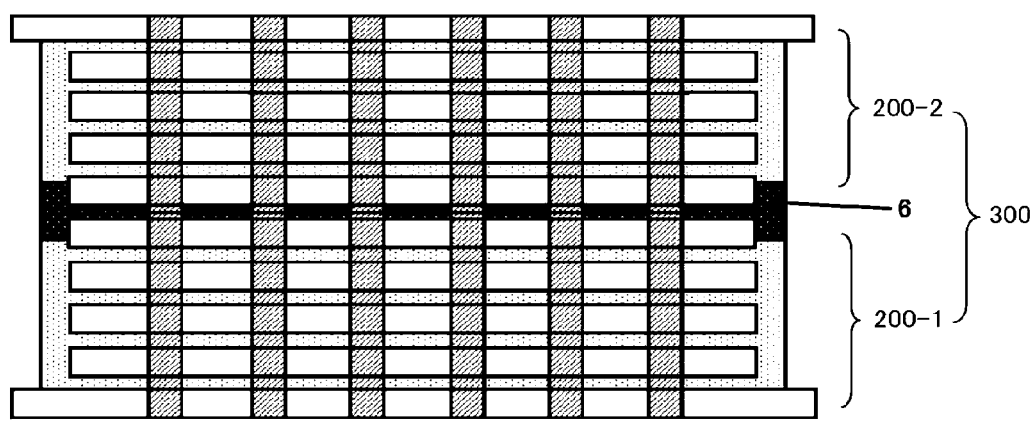
FIG. 32 is a vertical cross-section diagram showing a manufacturing step of a semiconductor device having a multilayer laminated structure of chips in accordance with the seventh embodiment of the present invention.

As shown in FIG. 32, a laminated structure comprised of a ten-chip block 300 is formed by laminating the first five-chip sub-block 200-1 and the second five-chip sub-block 200-2 through the second type underfill 6. Here, the first five-chip sub-block 200-1 and the second five-chip sub-block 200-2 are laminated so that the second type chip 8-4 included in the first five-chip sub-block 200-1 and the second type chip 8-4 included in the second five-chip sub-block 200-2 face with each other. The second type underfill 6 is comprised of a resin whose viscosity and adhesion are higher than those of the first type underfill 4.

The hardened first type underfill 4 exists in the space between the first type chip 1 and the second type chips 8, which comprise the first five-chip sub-block 200-1 and the spaces between the plurality of the second type chips 8 in the first five-chip sub-block 200-1. Also, the hardened first type underfill 4 exists in the space between the first type chip 1 and the second type chips 8, which comprise the second five-chip sub-block 200-2 and the spaces between the plurality of the second type chips 8. In the step of laminating the first five-chip sub-block 200-1 and the second five-chip sub-block 200-2, stress which is applied to the bumps 3 located between the first type chip 1 and the second type chips 8, which comprise the first five-chip sub-block 200-1 and the bumps 3 located between the plurality of the second type chips 8 in the first five-chip sub-block 200-1, is reduced by the hardened first type underfill 4 of the first five-chip sub-block 200-1. Also, stress which is applied to the bumps 3 located between the first type chip 1 and the second type chips 8, which comprise the second five-chip sub-block 200-2 and the bumps 3 located between the plurality of the second type chips 8 in the second five-chip sub-block 200-2, is reduced by the hardened first type underfill 4 of the second five-chip sub-block 200-2. As a result, it is possible to inhibit generation of defects (e.g., a crack) in the bumps 3 located between the first type chip 1 and the second type chips 8, which comprise the first five-chip sub-block 200-1 and the bumps 3 located between the plurality of the second type chips 8 in the first five-chip sub-block 200-1. Also, it is possible to inhibit generation of defects (e.g., a crack) in the bumps 3 located between the first type chip 1 and the second type chips 8, which comprise the second five-chip sub-block 200-2 and the bumps 3 located between the plurality of the second type chips 8 in the second five-chip sub-block 200-2.

Then, the second type underfill 6 is hardened. The second type underfill 6 may be hardened by a thermal hardening step.

Figure 33:
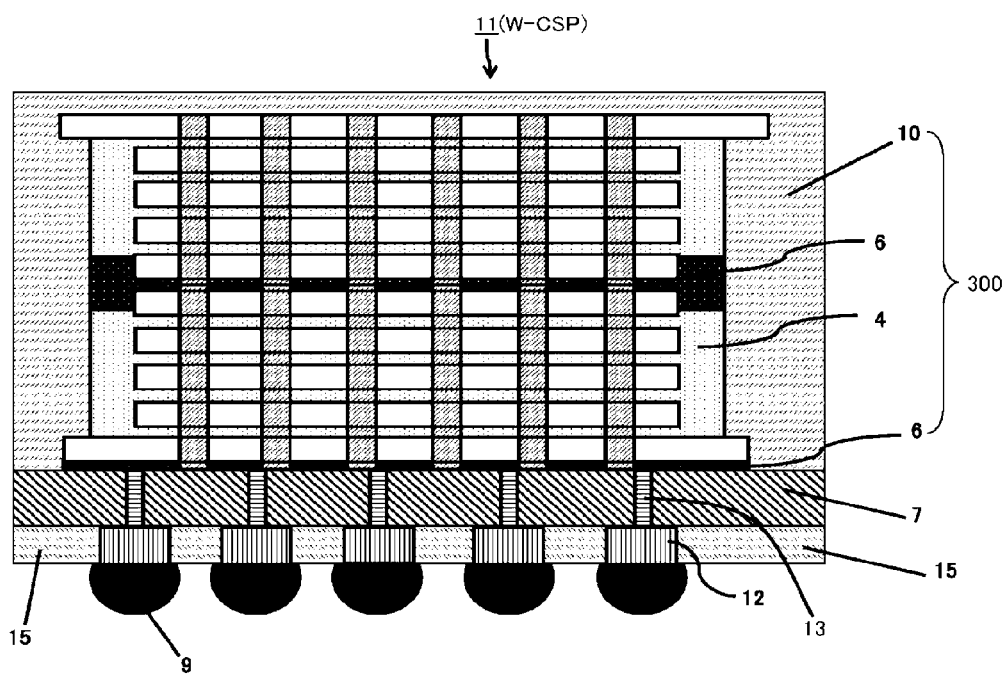
FIG. 33 is a vertical cross-section diagram showing a manufacturing step of a semiconductor device having a multilayer laminated structure of chips in accordance with the seventh embodiment of the present invention.

As shown in FIG. 33, a laminated structure comprised of the ten-chip block 300 is laminated on an interposer 7. Here, the interposer 7 has a plurality of through-electrodes 13. The spacing of the plurality of the through-electrodes 13 formed in the interposer 7 is wider than that of the through-electrodes 5 formed in the laminated structure.

The hardened first type underfill 4 and the hardened second type underfill 6 exist in the space between the first type chips 1 and the second type chips 8, which comprise the ten-chip block 300 and the spaces between the plurality of the second type chips 8 in the ten-chip block 300. In the step of laminating the laminated structure comprised of the ten-chip block 300 on the interposer 7, stress that is applied to the bumps 3 located between the first type chip 1 and the second type chips 8, which comprise the ten-chip block 300 and the bumps 3 located between the second type chips 8 in the ten-chip block 300, is reduced by the hardened first type underfill 4 and the hardened second type underfill 6. As a result, it is possible to inhibit generation of defects (e.g., a crack) in the bumps 3 located between the first type chips 1 and the second type chips 8, which comprise the ten-chip block 300 and the bumps 3 located between the plurality of the second type chips 8 in the ten-chip block 300.

Then, the laminated structure, which is comprised of the ten-chip block 300 laminated on the interposer 7, is sealed by a seal resin 10. Here, the amount of filler in the seal resin 10 is higher than that of the filler of the first type underfill 4 and that of the filler of the second type underfill 6 in order to maintain a highly reliable seal. It is possible to use a thermoplastic epoxy resin having an amount of filler that is higher than that of filler in the above described first type underfill 4 and the second type underfill 6 as the seal resin 10. In addition, a rewiring treatment is conducted on the lower plane of the interposer 7 with a heretofore known method. Furthermore, a plurality of posts 12 are formed, which are electrically connected to the through-electrodes 13. The plurality of the posts 12 may be comprised of a plurality of metal posts. As a typical example, they may be comprised of a plurality of copper posts. Furthermore, the lower plane of the interposer 7 and the lateral side of the above described plurality of the posts 12 are sealed by the seal resin 15. More specifically, the lower plane of the interposer 7 is sealed by the seal resin 15 with a transfer method so that the plurality of the posts 12 are implanted. Then, the seal resin 15 is grinded until the plurality of the posts 12 are exposed. Finally, external terminals 9 are connected to the surface of a plurality of exposed posts 12, and thus a semiconductor device is manufactured.

According to the seventh embodiment of the present invention, a plurality of posts 12 and a seal resin 15 is provided. Therefore, in addition to the effect of the above described fifth embodiment, an effect is produced, which the connection reliability of the semiconductor device is improved after it is mounted on the substrate.

Eighth Embodiment

In the above described first embodiment, a chip sub-block is formed by laminating a plurality of chips with different dimensions. The first type underfill that has the low viscosity and works as a liquid is provided on the terrace (or the stage) comprised of the surrounding region of the chip with a larger dimension of the plurality of chips comprised of this chip sub-block, and the first type underfill is poured into the spaces between the adjacent chips with different dimensions by using the spontaneous capillary flow phenomenon.

However, in the eighth embodiment of the present invention, two chip sub-blocks are formed by laminating a plurality of chips on a chip whose dimension is larger than the dimensions of the plurality of chips. Then, a first type underfill that has the low viscosity and works as a liquid is provided on a terrace (or a stage) comprised of a surrounding region of the chip with the larger dimension, and the underfill is poured into spaces between the plurality of chips with the smaller dimensions and a space between a chip with the larger dimension and a bottom chip of the plurality of chips with the smaller dimensions. Thus, the number of steps of pouring the underfill can be reduced. Then, the first type underfill poured into the plurality of spaces is simultaneously hardened. Thus, the number of steps of hardening the first type underfill can be reduced. Then, the two chip sub-blocks having the hardened first type underfill are laminated through a second type underfill. Thus, a laminated structure comprised of a 10-chip block is formed. Then, the laminated structure is laminated on an interposer 7, and a rewiring treatment is conducted and a plurality of metal posts are formed on the reverse face of the interposer 7. Furthermore, spaces between the plurality of the metal posts on the reverse face of the interposer 7 are sealed with a seal resin. A wafer level chip size package (W-CSP) is formed by forming external terminals that are connected to the plurality of the metal posts. Referring now to the drawings, the eighth embodiment of the present invention will be described in detail.

Lamination Step

The FIGS. 34A, 34B, 35A, 35B, 36, and 37 are vertical cross-section diagrams showing a manufacturing process of a semiconductor device having a multilayer laminated structure of chips in accordance with the eighth embodiment of the present invention.

Figure 34A:
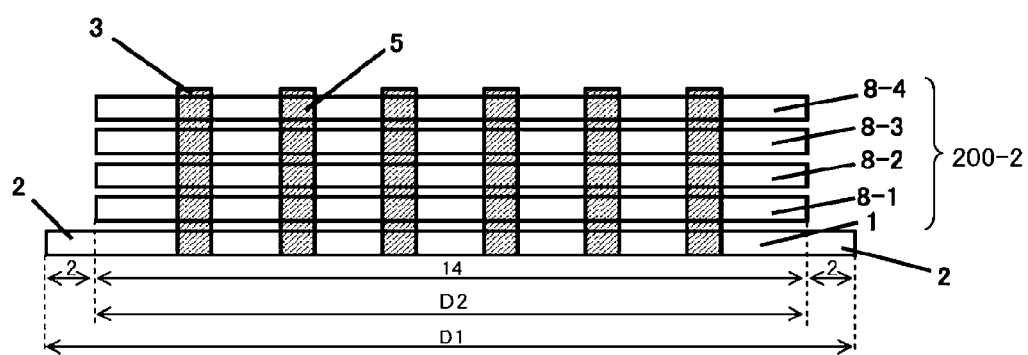
FIGS. 34A and 34B are vertical cross-section diagrams showing a manufacturing step of a semiconductor device having a multilayer laminated structure of chips in accordance with an eighth embodiment of the present invention.
Figure 34B:
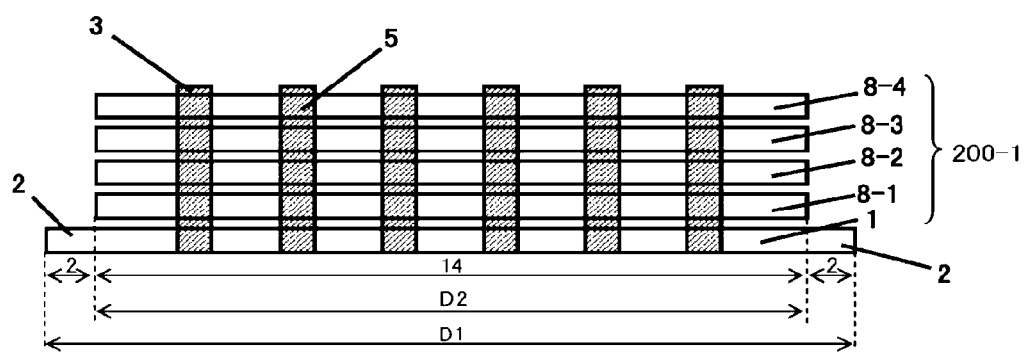

As shown in FIGS. 34A and 34B, two first type chips 1 with a first horizontal dimension D1 are prepared. In addition, eight second type chips 8 with a second horizontal dimension D2 are prepared. Here, the second horizontal dimension D2 is smaller than the first horizontal dimension D1. The first type chip 1 has a plurality of through-electrodes 5. In addition, the first type chip 1 has a plurality of bumps 3. The plurality of the bumps 3 are formed on the surface of the plurality of the through-electrodes 5 on the first plane side of the first type chip 1. Also, the first type chip 1 is comprised of a circuit formation region 14 and a surrounding region 2 surrounding the circuit formation region 14. The circuit formation region 14 has the second horizontal dimension D2. In other words, the horizontal dimension of the circuit formation region 14 is the same as that of the above described second type chip 8. On the other hand, the surrounding region 2 has the width corresponding to half of the difference between the first horizontal dimension D1 and the second horizontal dimension D2. The width of the surrounding region 2 is preferably set to 0.1 nm or more. As a typical example, no circuits are formed on the surrounding region 2. However, the structure of the surrounding region 2 is not limited to this structure, and a circuit may be formed on the surrounding region 2.

Each of the plurality of the second type chips 8 has a plurality of through-electrodes 5. The plurality of the through-electrodes 5 of the second type chip 8 and the plurality of the through-electrodes 5 of the above described first type chip 1 are formed on the corresponding positions with each other in the horizontal direction. In addition, each of the second type chips 8 has a plurality of bumps 3. The plurality of bumps 3 are formed on the surface of the above described plurality of the through-electrodes 5 on the first plane side of the second type chip 8. Each of the second type chips 8 has a circuit formation region 14 but does not have any surrounding region. The following lamination process is conducted by using these two first type chips and eight second type chips 8 as fundamental components.

As shown in FIG. 34B, four second type chips 8-1, 8-2, 8-3, and 8-4 are sequentially laminated on a first type chip 1. Thus, a first five-chip sub-bock 200-1 is formed. As a result, a plurality of through-electrodes 5 formed on any chip of the five chips comprising the first five-chip sub-block 200-1 are electrically connected with each other through the plurality of the through electrodes 5 and bumps 3 formed on the an adjacent chip/adjacent chips. A circuit formation region 14 of the first type chip 1 and the second type chips 8 are completely overlapped in the horizontal direction. On the other hand, a surrounding region 2 of the first type chip 1 is extended outside the second type chips 8 in the horizontal direction. Therefore, the first five-chip sub-block 200-1 has a terrace (or a stage) comprised of the surrounding region 2 of the first type chip 1.

In the same way, as shown in FIG. 34A, four second type chips 8-1, 8-2, 8-3, and 8-4 are sequentially laminated on a first type chip 1. Thus, a second five-chip sub-block 200-2 is formed. As a result, a plurality of through-electrodes 5 formed on any chip of the five chips comprising the second five-chip sub-block 200-2 are electrically connected with each other through the plurality of the through electrodes 5 and bumps 3 formed on an adjacent chip/adjacent chips. A circuit formation region 14 of the first type chip 1 and the second type chips 8 are completely overlapped in the horizontal direction. On the other hand, a surrounding region 2 of the first type chip 1 is extended outside the second type chips 8 in the horizontal direction. Therefore, the second five-chip sub-block 200-2 has a terrace (or a stage) comprised of the surrounding region 2 of the first type chip 1.

Figure 35A:
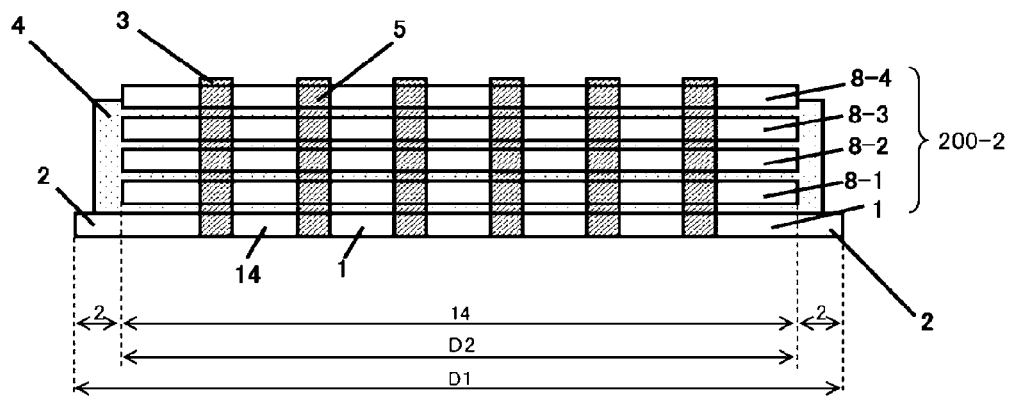
FIGS. 35A and 35B are vertical cross-section diagrams showing a manufacturing step of a semiconductor device having a multilayer laminated structure of chips in accordance with the eighth embodiment of the present invention.
Figure 35B:
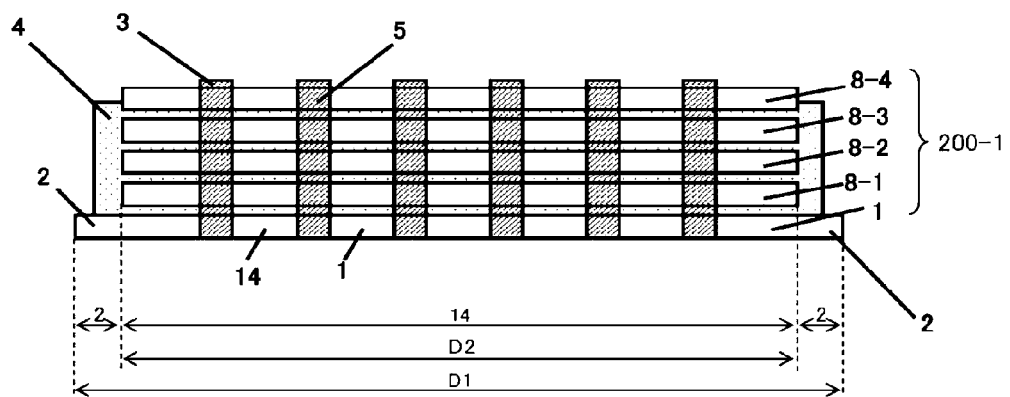

As shown in FIG. 35B, a first type underfill 4 is poured in a space between the first type chip 1 and the bottom second type chip 8 and spaces between the four second type chips 8 from the lateral sides of the first five-chip sub-block 200-1. Then, the poured first type underfill 4 is hardened. Also, before the first type underfill 4 is poured, the first five-chip sub-block 200-1 is allocated so that the first type chip 1 is located under the second type chips 8. Then, the first type underfill 4 is provided on the terrace (or the stage) comprised of the surrounding region 2 of the above described first type chip 1 in the first five-chip sub-block 200-1. Here, the first type underfill 4 is provided so that it comes in contact with the lateral sides of the second type chips 8-1, 8-2, 8-3, and 8-4. The first type underfill 4 is comprised of an insulating resin that has low viscosity and works as a liquid. The first type underfill 4 with a liquid nature penetrates the center of the first five-chip sub-block 200-1 through the space between the first type chip 1 and the bottom second type chip 8 and the spaces between the plurality of the second type chips 8 (i.e., the second type chips 8-1, 8-2, 8-3, and 8-4) by the spontaneous capillary flow phenomenon. As a result, the space between the first type chip 1 and the bottom second type chip 8 and the spaces between the plurality of the second type chips 8 are completely filled with the first type underfill 4 with a liquid nature.

In the same way, the first type underfill 4 is poured in the space between the first type chip 1 and the bottom second type chip 8 and the spaces between the four second type chips 8 from the lateral sides of the second five-chip sub-block 200-2. Then, the poured first type underfill 4 is hardened. Also, before the first type underfill 4 is poured, the second five-chip sub-block 200-2 is allocated so that the first type chip 1 is located under the second type chips 8. Then, the first type underfill 4 is provided on the terrace (or the stage) comprised of the surrounding region 2 of the above first type chip 1 in the second five-chip sub-block 200-2. Here, the first type underfill 4 is provided so that it comes in contact with the lateral sides of the second type chips 8-1, 8-2, 8-3, and 8-4. The first type underfill 4 is comprised of an insulating resin that has low viscosity and works as a liquid. The first type underfill 4 with a liquid nature penetrates the center of the second five-chip sub-block 200-2 through the space between the first type chip 1 and the bottom second type chip 8 and the spaces between the plurality of the second type chips 8 (i.e., the second type chips 8-1, 8-2, 8-3, and 8-4) by the spontaneous capillary flow phenomenon. As a result, the space between the first type chip 1 and the bottom second type chip 8 and the spaces between the plurality of the second type chips 8 are completely filled with the first type underfill 4 with a liquid nature.

Then, the first type underfill 4 which is poured in the above described spaces in the first five-chip sub-block 200-1 is hardened. In other words, the finished first five-chip sub-block 200-1 is comprised of the first type chip 1, the second type chips 8, the hardened first underfill 4 that is formed in the space between the first type chip 1 and the bottom second type chip 8 and the spaces between the plurality of the second type chips 8.

In the same way, the first type underfill 4 which is poured in the above described spaces in the second five-chip sub-block 200-2 is hardened. In other words, the finished second five-chip sub-block 200-2 is comprised of the first type chip 1, the second type chip 8, and the hardened first type underfill 4 that is formed in the space between the first type chip 1 and the bottom second type chip 8 and the spaces between the plurality of the second type chips 8.

If the first type underfill 4 is comprised of a thermosetting resin, it can be thermally hardened by applying heat. A thermosetting epoxy resin can be provided as a typical example of the thermosetting resin. In general, it is preferable for the seal resin to have a large amount of filler in order to maintain a highly reliable seal. However, as described above, the first type underfill 4 penetrates the space between the first type chip 1 and the bottom second type chip 8 and the spaces between the second type chips 8 by the spontaneous capillary flow phenomenon. Therefore, the first type underfill 4 is required to have low-viscosity. Because of this, the amount of filler in the first type underfill 4 is lower than that of filler in a normal seal resin.

As described above, the first type underfill 4 can be provided on the surrounding region 2 by using a needle dispenser if the width of the surrounding region 2 is 0.1 mm or more. It is preferable to set the space between the first type chip 1 and the bottom second type chip 8 and spaces between the plurality of the second type chips 8 to 10 μm or more for the purpose of making it possible for the first type underfill 4 provided on the surrounding region 2 to penetrate the space between the first type chip 1 and the bottom second type chip 8 and the spaces between the plurality of the second type chips 8 by the spontaneous capillary flow phenomenon.

Figure 36:
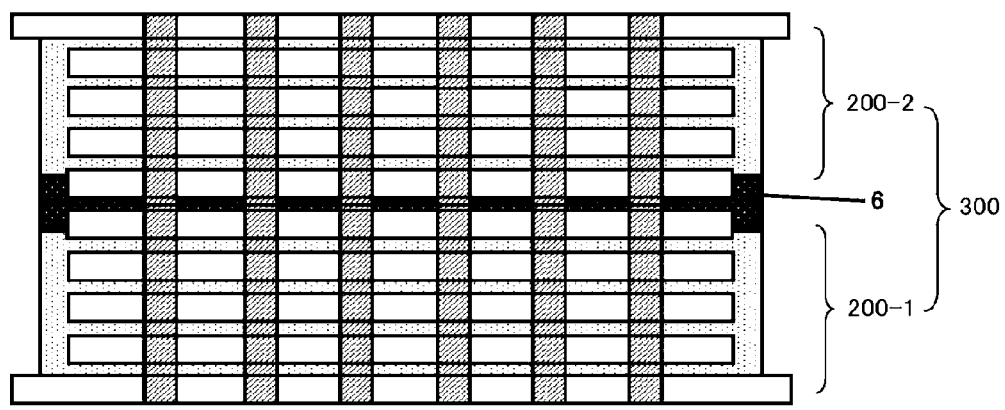
FIG. 36 is a vertical cross-section diagram showing a manufacturing step of a semiconductor device having a multilayer laminated structure of chips in accordance with the eighth embodiment of the present invention.

As shown in FIG. 36, a laminated structure comprised of a ten-chip block 300 is formed by laminating the first five-chip sub-block 200-1 and the second five-chip sub-block 200-2 through a second type underfill 6. Here, the first five-chip sub-bock 200-1 and the second five-chip sub-block 200-2 are laminated so that the second type chip 8-4 included in the first five-chip sub-block 200-1 and the second type chip 8-4 included in the second five-chip sub-block 200-2 face with each other. The second type underfill 6 is comprised of a rein whose viscosity and adhesion are higher than those of the first type underfill 4.

The hardened first type underfill 4 exists in the space between the first type chip 1 and the second type chips 8, which comprise the first five-chip sub-block 200-1 and the spaces between the plurality of the second type chips 8 in the first five-chip sub-block 200-1. In the same way, the hardened first type underfill 4 exists in the space between the first type chip 1 and the second type chips 8, which comprise the second five-chip sub-block 200-2 and the spaces between the second type chips 8 in the second five-chip sub-block 200-2. In the step of laminating the first five-chip sub-block 200-1 and the second five-chip sub-block 200-2, stress which is applied to the bumps 3 located between the first type chip 1 and the second type chips 8, which comprise the first five-chip sub-block 200-1 and the bumps 3 located between the plurality of the second type chips 8 in the first five-chip sub-block 200-1, is reduced by the hardened first type underfill 4 of the first five-chip sub-block 200-1. In the same way, stress which is applied to the bumps 3 located between the first type chip 1 and the second type chips 8, which comprise the second five-chip sub-block 200-2 and the bumps 8 located between the plurality of the second type chips 8 in the second five-chip sub-block 200-2, is reduced by the hardened first type underfill 4 of the second five-chip sub-block 200-2. As a result, it is possible to inhibit generation of defects (e.g., a crack) in the bumps 3 located between the first type chip 1 and the second type chips 8, which comprise the first five-chip sub-block 200-1 and the bumps 3 located between the plurality of the second type chips 8 in the first five-chip sub-block 200-1. In the same way, it is possible to inhibit generation of defects (e.g., a crack) in the bumps located between the first type chip 1 and the second type chips 8, which comprise the second five-chip block 200-2 and the bumps located between the plurality of the second type chips 8 in the second five-chip block 200-2.

Then, the second type underfill 6 is hardened. The second type underfill 6 can be hardened by conducting a thermal hardening step.

Figure 37:
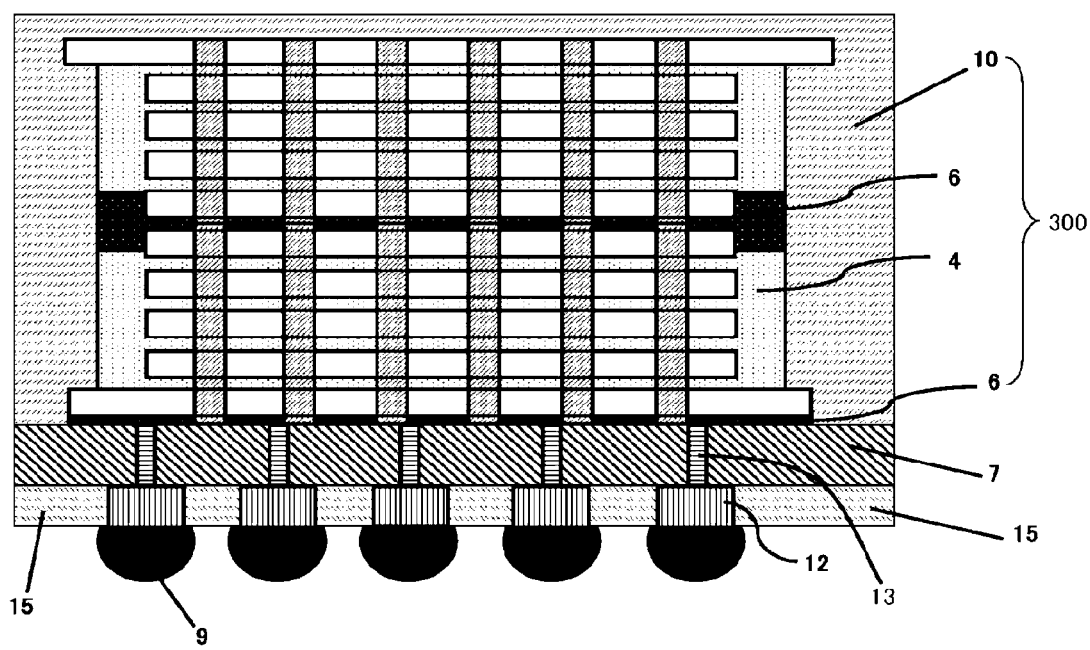
FIG. 37 is a vertical cross-section diagram showing a manufacturing step of a semiconductor device having a multilayer laminated structure of chips in accordance with the eighth embodiment of the present invention.

As shown in FIG. 37, the laminated structure comprised of the ten-chip block 300 is laminated on an interposer 7. The interposer 7 has a plurality of through-electrodes 13. The spacing in which the plurality of the through-electrodes 13 of the interposer 7 are allocated is wider than the spacing in which the through-electrodes 5 of the laminated structure are allocated.

The hardened first type underfill 4 and the hardened second type underfill 6 exist in the spaces between the first type chips 1 and the second type chips 8, which comprise the ten-chip block 300 and the spaces between the plurality of the second type chips 8 in the ten-chip block 300. In the step of laminating the laminated structure comprised of the ten-chip block 300, stress which is applied to the bumps 3 located between the first type chips 1 and the second type chips 8, which comprise the ten-chip block 300 and the bumps 3 located between the plurality of the second type chips 8 in the ten-chip block 300, is reduced by the hardened first type underfill 4 and the hardened second type underfill 6. As a result, it is possible to inhibit generation of defects (e.g., a crack) in the bumps 3 located between the first type chips 1 and the second type chips 8, which comprise the ten-chip block 300 and the bumps 3 located between the plurality of the second type chips 8 in the ten-chip block 300.

Then, the laminated structure, which is comprised of the ten-chip block 300 laminated on the interposer 7, is sealed by a seal resin 10. Here, the amount of filler in the seal resin 10 is higher than that of filler of the first type underfill 4 and that of filler of the second type underfill 6 in order to keep high reliability of seal. It is possible to use a thermoplastic epoxy resin having a filler content that is higher than that of the filler in the above described first type underfill 4 and the second type underfill 6 as the seal resin 10. In addition, a rewiring treatment is conducted for the lower plane of the interposer 7 with a heretofore known method. Furthermore, a plurality of posts 12 are formed, which are electrically connected to the through-electrodes 13. The plurality of the posts 12 may be comprised of a plurality of metal posts. As a typical example, they may be comprised of a plurality of copper posts. Furthermore, the lower plane of the interposer 7 and the lateral side of the above described plurality of the posts 12 are sealed by the seal resin 15. More specifically, the lower plane of the interposer 7 is sealed by the seal resin 15 with a transfer method so that the plurality of the posts 12 are implanted. Then, the seal resin 15 is grinded until the plurality of posts 12 are exposed. Finally, a semiconductor device is manufactured by connecting external terminals 9 to the exposed upper side of the plurality of the posts 12.

According to the eight embodiment of the present invention, posts 12 and the seal resin 15 are provided. Therefore, in addition to the effects of the above described sixth embodiment, an effect is produced, which the connection reliability of the semiconductor device is improved after it is mounted on the substrate.

Alternative Embodiment

In the above described embodiments, the step of pouring the first type underfill 4 is conducted by using the spontaneous capillary flow phenomenon. However, the step may be conducted by using suction in addition to the spontaneous capillary flow phenomenon.

Also, in the above described embodiments, chips to be laminated have a plurality of through-electrodes. However, the structure of the chips is not necessarily limited to this. The present invention can be effectively applied to the case in which chips having another structure without through-electrodes are laminated.

Also, in the above described embodiments, chips to be laminated can be semiconductor chips such as IC chips as a typical example. However, they are not necessarily limited to the semiconductor chips. They may be chip forms that can be laminated. For example, a variety of chips, such as a ceramic capacitor chip, a sensor chip, a light-emitting element chip, and a light-receiving element chip are included in the chip forms Also, as described above, the present invention can be also applied to the case in which a plurality of chips comprised of the same type of material are laminated. However, application of the present invention is not necessarily limited to this case. The present invention can be also applied to the case in which chips comprised of a different type of material are laminated.

Also, in the above described embodiments, examples are explained, which bumps are allocated on one side of each chip and the chips are mounted on the interposer so that the side on which the bumps are allocated is located upward. However, as an alternative example, the present invention can be applied to the case in which bumps are allocated on one side of each chip and the chips are mounted so that the side on which the bumps are allocated is located downward. Also, as the other alternative example, the present invention can be applied to the case in which bumps are allocated on the both sides of each chip and the chips are mounted so that the sides on which the bumps are allocated face with each other.

Also, in the above described embodiment, chips can be connected with each other with a variety of heretofore known methods. For example, chips may be connected with each other by applying both weight and heat. Also, chips may be connected with each other only by applying weight. On the other hand, chips may be connected with each other only by applying heat. Also, chips can be connected with each other by applying ultrasonic. Furthermore, chips may be connected with each other by the combination of applying weight, heat, and ultrasonic.

Also, in the above described embodiments, examples are explained, which the laminated structure of chips is mounted on the upper surface of the support substrate and then the external joining terminals are formed on the lower surface of the support substrate. However, as an alternative example, a laminated structure of chips may be mounted on the upper surface of the support substrate after the external joining terminals are formed on the lower surface of the support substrate.

Also, in the above described embodiments, examples are explained, which the present invention is applied to a manufacturing process of a semiconductor device comprised of a laminated structure mounted on the support substrate. However, application of the present invention is not necessarily limited to this case. The present invention can be applied to any cases in which a step of forming a multilayer laminated structure of a variety of chips is included. Also, in the above described embodiments, examples are described, which a laminated structure is mounted on the support substrate having external joining terminals. However, the chip, which has the external connection function by using the wafer-level chip size package technology (W-CSP), can be used as a substrate. In other words, the present invention can be also applied to a method of forming a laminated structure without a support substrate.

This application claims priority to Japanese Patent Application No. 2005-096988. The entire disclosure of Japanese Patent Application No. 2005-096988 is hereby incorporated herein by reference.

The terms of degree such as "substantially" and "nearly" used herein mean a reasonable amount of deviation of the modified term such that the end result is not significantly changed. For example, the terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims.

Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A method for manufacturing a semiconductor device, comprising the steps of:

preparing a wafer including a first circuit formation region and a first surrounding region formed to surround said first circuit formation region, the first circuit formation region having a plurality of first through-electrodes and a plurality of first bumps formed respectively on a surface of each first through-electrode of the plurality of first through-electrodes;

laminating a first chip on said first circuit formation region in contact with the plurality of first bumps, said first chip having a plane dimension that is substantially the same as a plane dimension of said first circuit formation region;

pouring a first underfill comprised of a first resin into a first space between said first circuit formation region and said first chip from said first surrounding region, the first underfill having a first viscosity;

hardening said first underfill;

forming a laminated structure comprised of a first chip block that includes a second chip including said first circuit formation region, said first chip, and said first underfill by conducting dicing with respect to said wafer, the second chip having a plurality of second through-electrodes and a plurality of second bumps formed respectively on a surface of each second through-electrode of the plurality of second through-electrodes that is opposite that of the plurality of first bumps;

laminating said laminated structure on a substrate;

pouring a second underfill comprised of a second resin into a second space between said laminated structure and said substrate, the second underfill having a second viscosity that is higher than that of said first underfill; and hardening said second underfill.

2. The method according to claim 1, wherein said step of pouring said first underfill is comprised of a step of pouring said first underfill into said first space by means of a spontaneous capillary flow phenomenon, said spontaneous capillary flow phenomenon caused by providing said first underfill on said first surrounding region.

3. A method of manufacturing a semiconductor device, comprising the steps of:

forming a first chip block by laminating a first chip that has a first plane dimension and includes a first surrounding region and a second chip having a second plane dimension that is smaller than the first plane dimension, the first chip having a plurality of first through-electrodes and a plurality of first bumps formed respectively on a surface of each first through-electrode of the plurality of first through-electrodes, and the second chip having a plurality of second through-electrodes and a plurality of second bumps formed respectively on a surface of each second through-electrode of the plurality of second through-electrodes that is opposite that of the plurality of first bumps of the first chip;

pouring a first underfill comprised of a first resin into a first space between the first chip and the second chip from the surrounding region, the first underfill having a first viscosity;

forming a laminated structure comprised of the first chip block by hardening the first underfill; and laminating the laminated structure on a substrate in contact with respective ones of the plurality of second bumps;

pouring a second underfill comprised of a second resin into a second space between the laminated structure including the plurality of second bumps and the substrate, the second underfill having a second viscosity that is higher than that of the first underfill; and hardening the second underfill.

4. The method according to claim 1, wherein said first resin is an insulating resin having a viscosity effective to provide workability as a liquid, and wherein said second resin has an adhesion that is higher than that of said first underfill.

5. The method according to claim 4, wherein said first underfill is further comprised of a first filler, and wherein said second underfill is further comprised of a second filler.

6. The method according to claim 1, wherein said first resin and said second resin are thermosetting resins so that hardening is accomplished with heat.

7. The method according to claim 6, wherein said first resin is a thermosetting epoxy resin.

8. A method for manufacturing a semiconductor device, comprising the steps of:

preparing a wafer including a plurality of first circuit formation regions and a first surrounding region formed to surround the plurality of the first circuit formation regions, each first circuit formation region of the plurality of first circuit formation regions having a plurality of first through-electrodes and a plurality of first bumps formed respectively on a surface of each first through-electrode of the plurality of first through-electrodes;

laminating a plurality of first chips on respective ones of the plurality of said first circuit formation regions in contact with respective ones of the plurality of first bumps, the plurality of first chips having plane dimensions that are substantially the same as plane dimensions of the plurality of first circuit formation regions, respectively;

pouring a first underfill comprised of a first resin into first spaces between the plurality of first circuit formation regions and the plurality of said first chips from the first surrounding region, the first underfill having a first viscosity;

hardening the first underfill;

forming a plurality of first chip sub-blocks that include (a) each of a plurality of second chips including each of the plurality of first circuit formation regions, (b) each of the plurality of first chips, and (c) the first underfill by conducting dicing with respect to the wafer, each second chip of the plurality of second chips having a plurality of second through-electrodes and a plurality of second bumps formed respectively on a surface of each second through-electrode of the plurality of second through-electrodes that is opposite that of the plurality of first bumps;

laminating one of the first chip sub-blocks on a substrate of another of the first chip sub-blocks in contact with respective ones of the plurality of second bumps;

pouring a second underfill comprised of a second resin into a second space between said one of the first chip sub-blocks and the another of the first chip sub-blocks, the second underfill having a second viscosity that is higher than that of said first underfill; and hardening said second underfill.

9. The method according to claim 8, wherein said step of pouring said first underfill is comprised of a step of pouring said first underfill into said first space by means of a spontaneous capillary flow phenomenon, said spontaneous capillary flow phenomenon caused by providing said first underfill on said first surrounding region.

10. The method according to claim 8, wherein said first resin is an insulating resin having a viscosity effective to provide workability as a liquid, and wherein said second resin has an adhesion that is higher than that of said first underfill.

11. The method according to claim 10, wherein said first underfill is further comprised of a first filler, and wherein said second underfill is further comprised of a second filler.

12. The method according to claim 8, wherein said first resin and said second resin are thermosetting resins so that hardening is accomplished with heat.

13. The method according to claim 12, wherein said first resin is a thermosetting epoxy resin.

14. The method according to claim 3, wherein said step of pouring said first underfill is comprised of a step of pouring said first underfill into said first space by means of a spontaneous capillary flow phenomenon, said spontaneous capillary flow phenomenon caused by providing said first underfill on said surrounding region.

15. The method according to claim 14, wherein said first resin is an insulating resin having a viscosity effective to provide workability as a liquid, and wherein said second resin has an adhesion that is higher than that of said first underfill.

16. The method according to claim 15, wherein said first underfill is further comprised of a first filler, and wherein said second underfill is further comprised of a second filler.

17. The method according to claim 14, wherein said first resin and said second resin are thermosetting resins so that hardening is accomplished with heat.

18. The method according to claim 17, wherein said first resin is a thermosetting epoxy resin.

\* \* \* \* \*